(12) United States Patent
Koyanagi

(10) Patent No.: US 8,928,399 B2
(45) Date of Patent: Jan. 6, 2015

(54) SEMICONDUCTOR DEVICE HAVING STACKED CHIPS

(71) Applicant: Kabushiki Kaisha Toshiba, Tokyo (JP)

(72) Inventor: Masaru Koyanagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/843,165

(22) Filed: Mar. 15, 2013

(65) Prior Publication Data

US 2014/0062587 A1    Mar. 6, 2014

(30) Foreign Application Priority Data

Sep. 6, 2012  (JP) ................................. 2012-196392

(51) Int. Cl.
*H01L 25/00*    (2006.01)
*H03K 99/00*    (2013.01)
*G06F 3/06*    (2006.01)

(52) U.S. Cl.
CPC ...... *H03K 99/00* (2013.01); *H01L 2224/73204* (2013.01); *H01L 2224/73257* (2013.01); *H01L 2224/32145* (2013.01); *H01L 2224/48091* (2013.01); *G06F 3/0688* (2013.01); *H01L 2224/48227* (2013.01); *H01L 2224/16145* (2013.01)

USPC .......................................................... 327/565

(58) Field of Classification Search
USPC ......................................... 327/564, 565, 566
See application file for complete search history.

(56) References Cited

U.S. PATENT DOCUMENTS

| | | | |
|---|---|---|---|
| 7,633,785 B2 * | 12/2009 | Kim et al. ........................ | 365/51 |
| 8,148,814 B2 * | 4/2012 | Furuta et al. .................. | 257/723 |
| 8,625,381 B2 * | 1/2014 | Lee ........................... | 365/230.03 |
| 8,698,321 B2 * | 4/2014 | Suh .............................. | 257/777 |
| 2011/0057819 A1 | 3/2011 | Ide et al. | |
| 2011/0103121 A1 | 5/2011 | Osakabe | |

FOREIGN PATENT DOCUMENTS

JP    2009-277334    11/2009

* cited by examiner

*Primary Examiner* — Jeffrey Zweizig
(74) *Attorney, Agent, or Firm* — Holtz, Holtz, Goodman & Chick PC

(57) ABSTRACT

According to one embodiment, a semiconductor device includes chips and a first selection circuit. Each of the chips has at least first and second vias for transmitting at least first and second address signals, these chips are stacked to be electrically connected via the first and second vias. The first selection circuit is provided in each chip, includes a logic circuit that selects a chip based on at least the first and second address signals, and supplies a result of operating the first and second address signals to the subsequent chip.

4 Claims, 51 Drawing Sheets

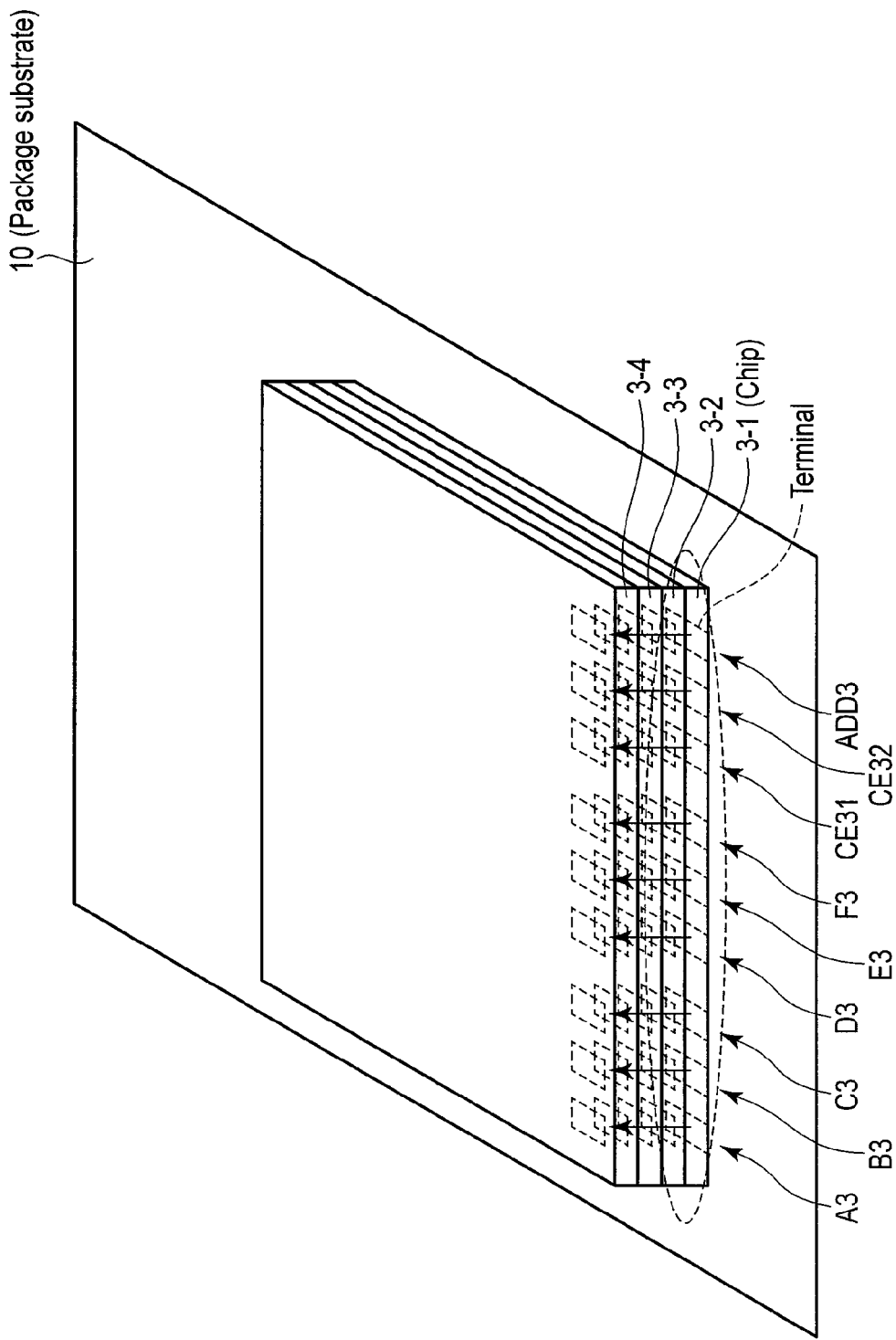
F I G. 1

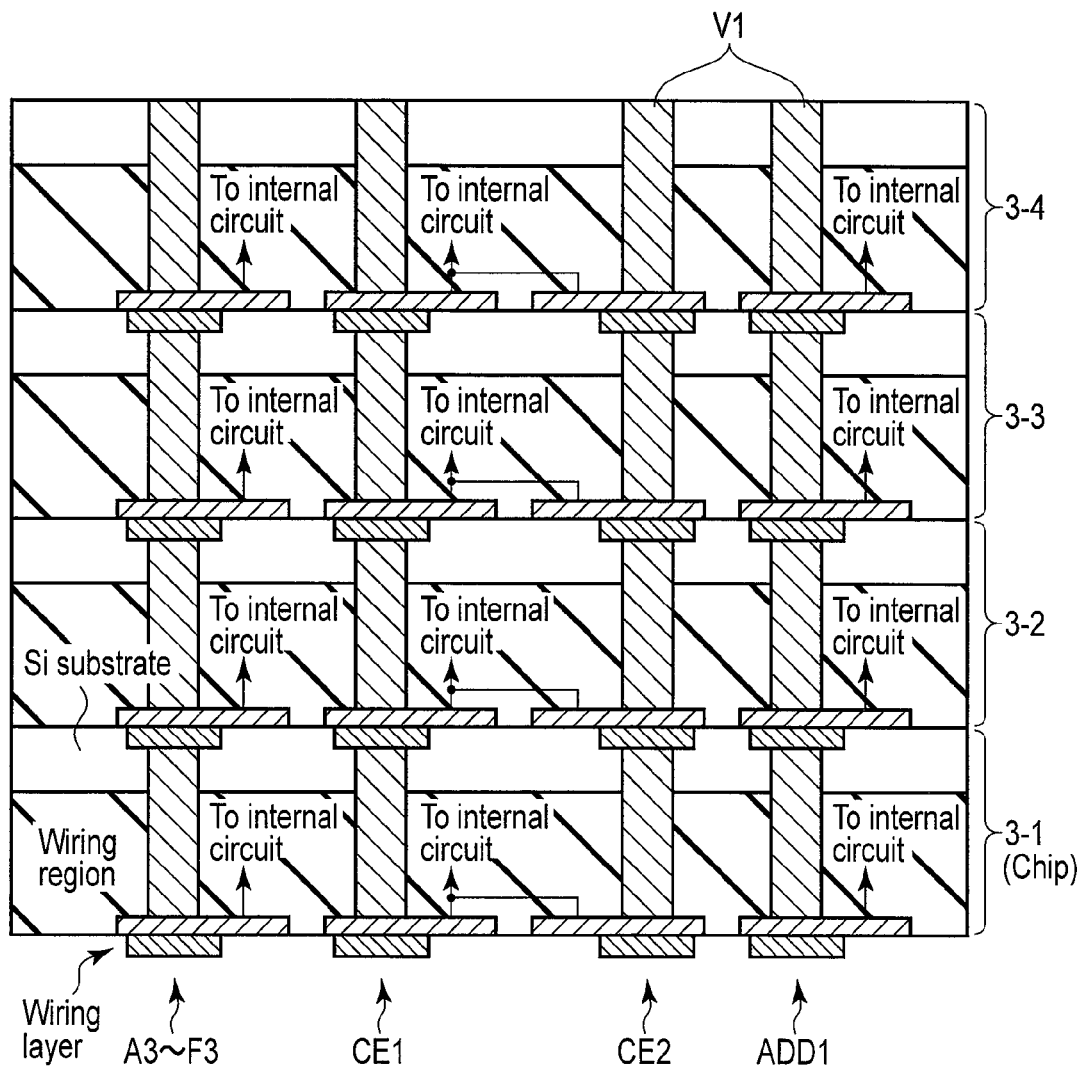
F I G. 2

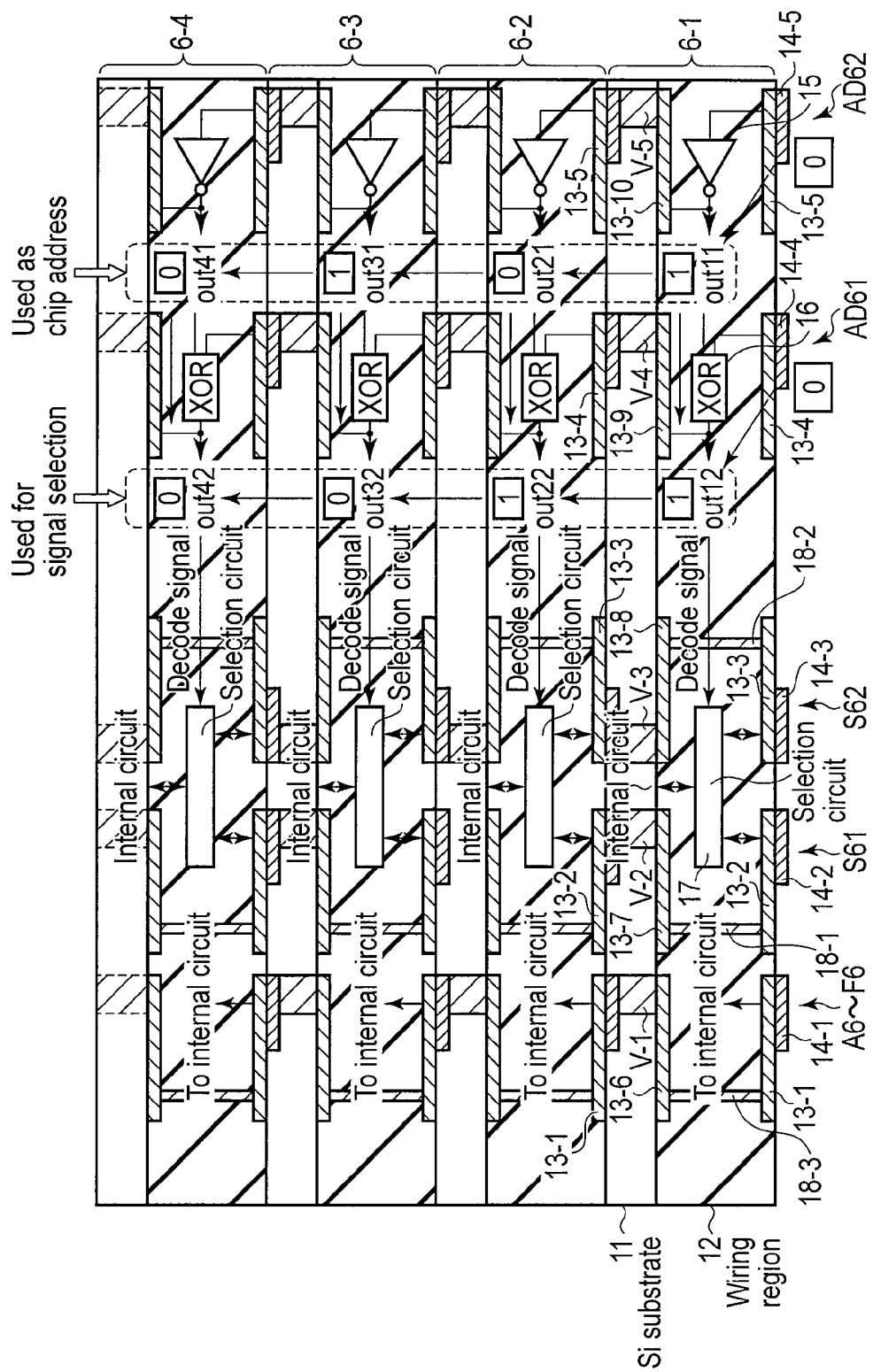
F I G. 3

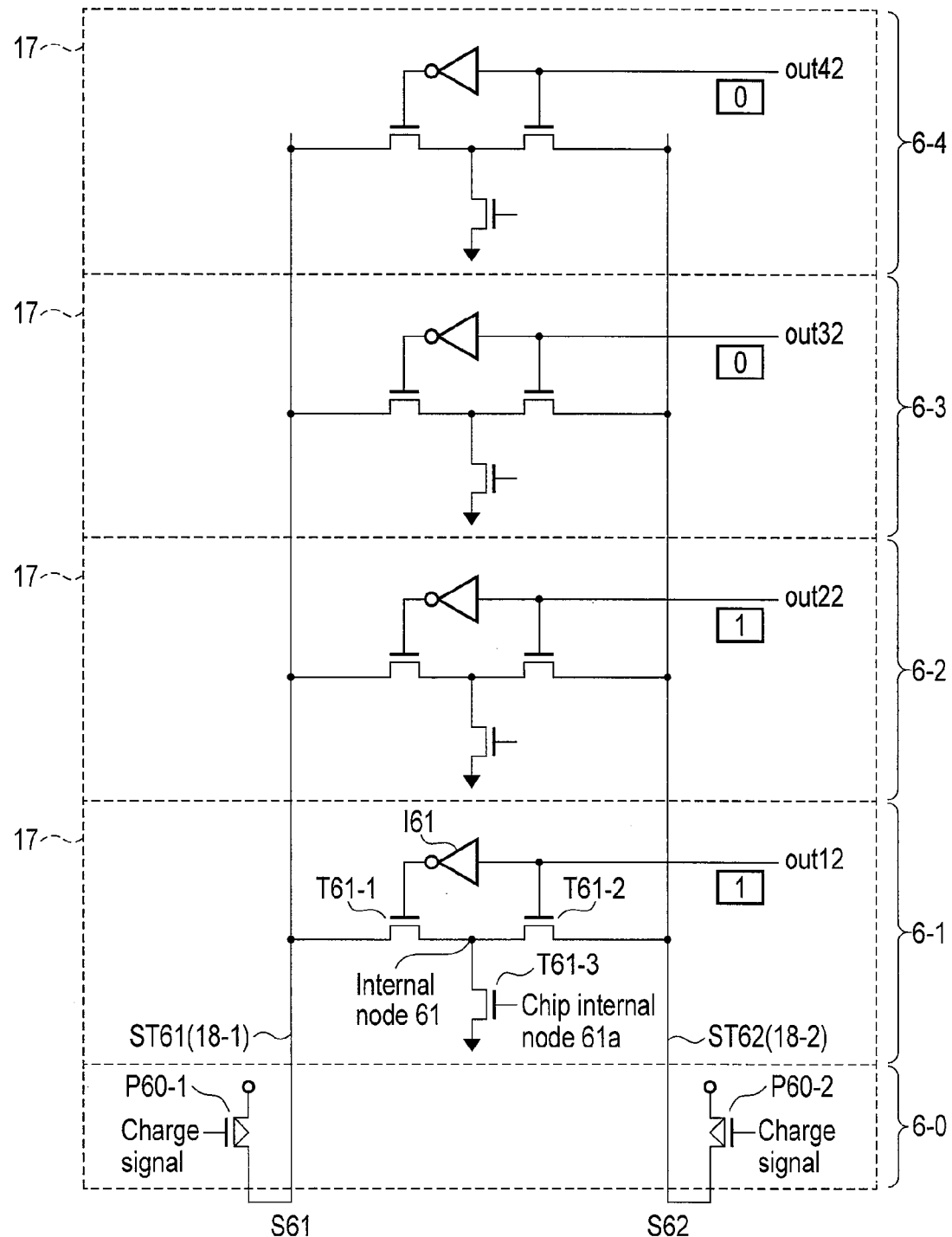
F I G. 6

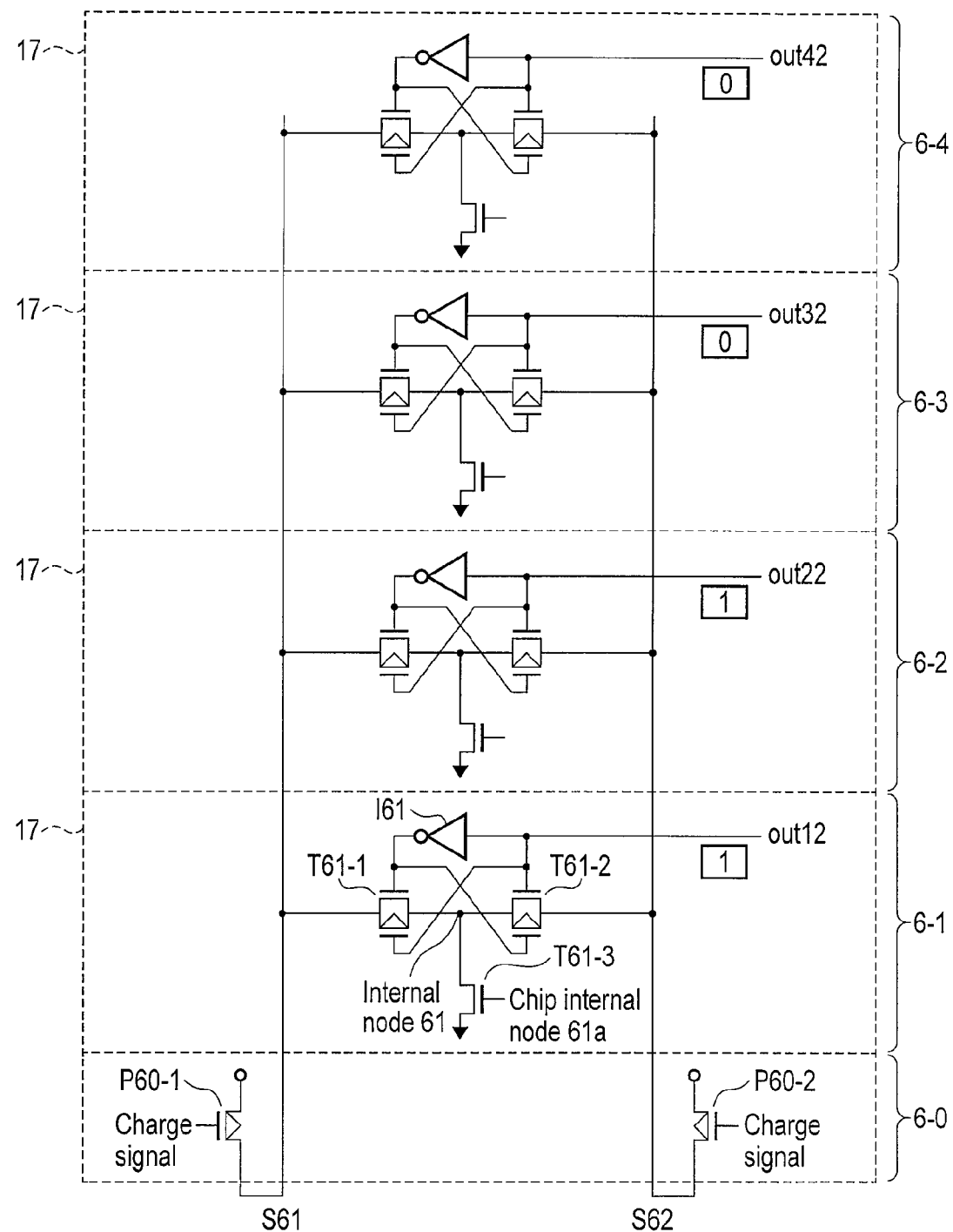
F I G. 7

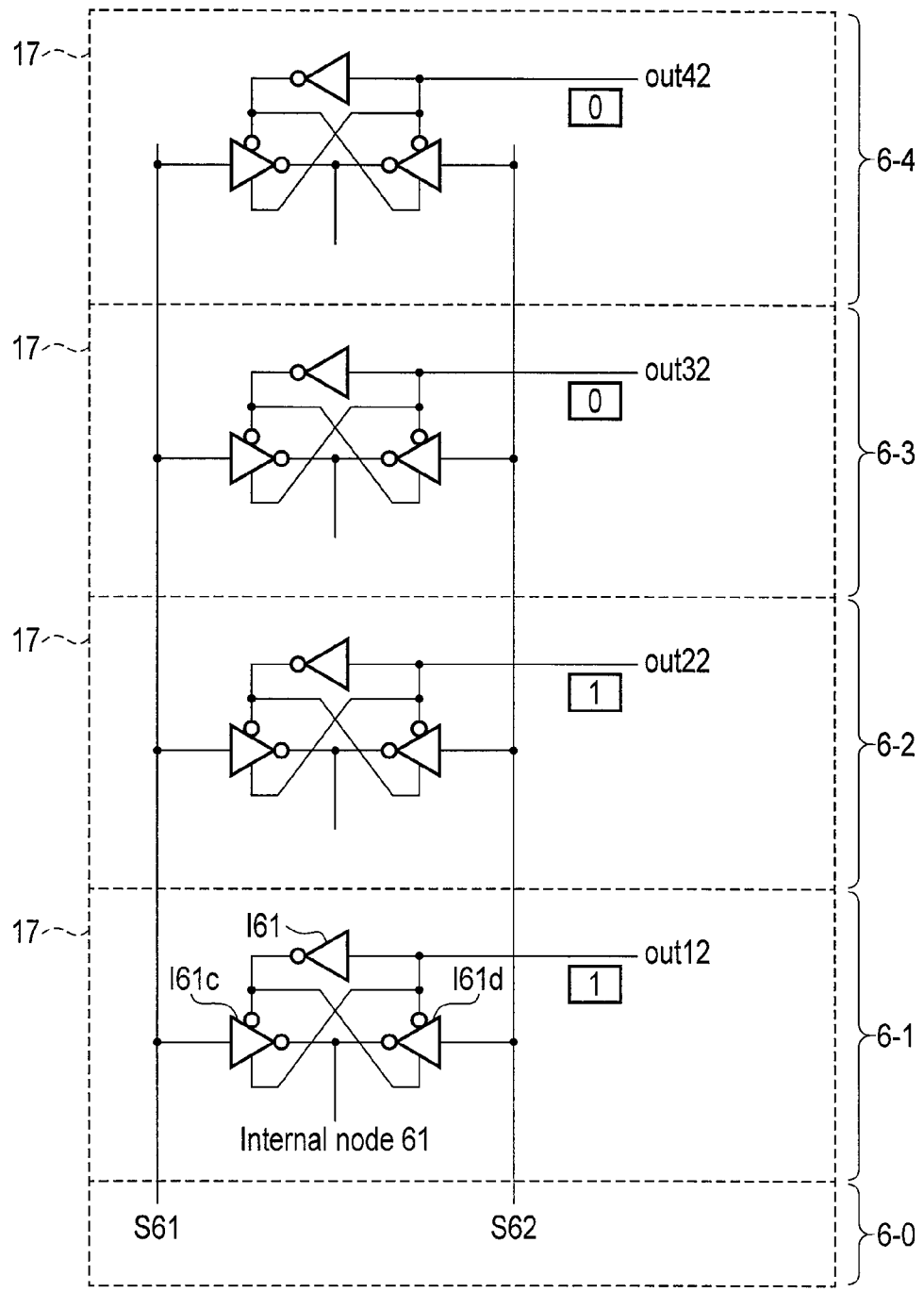
F I G. 9

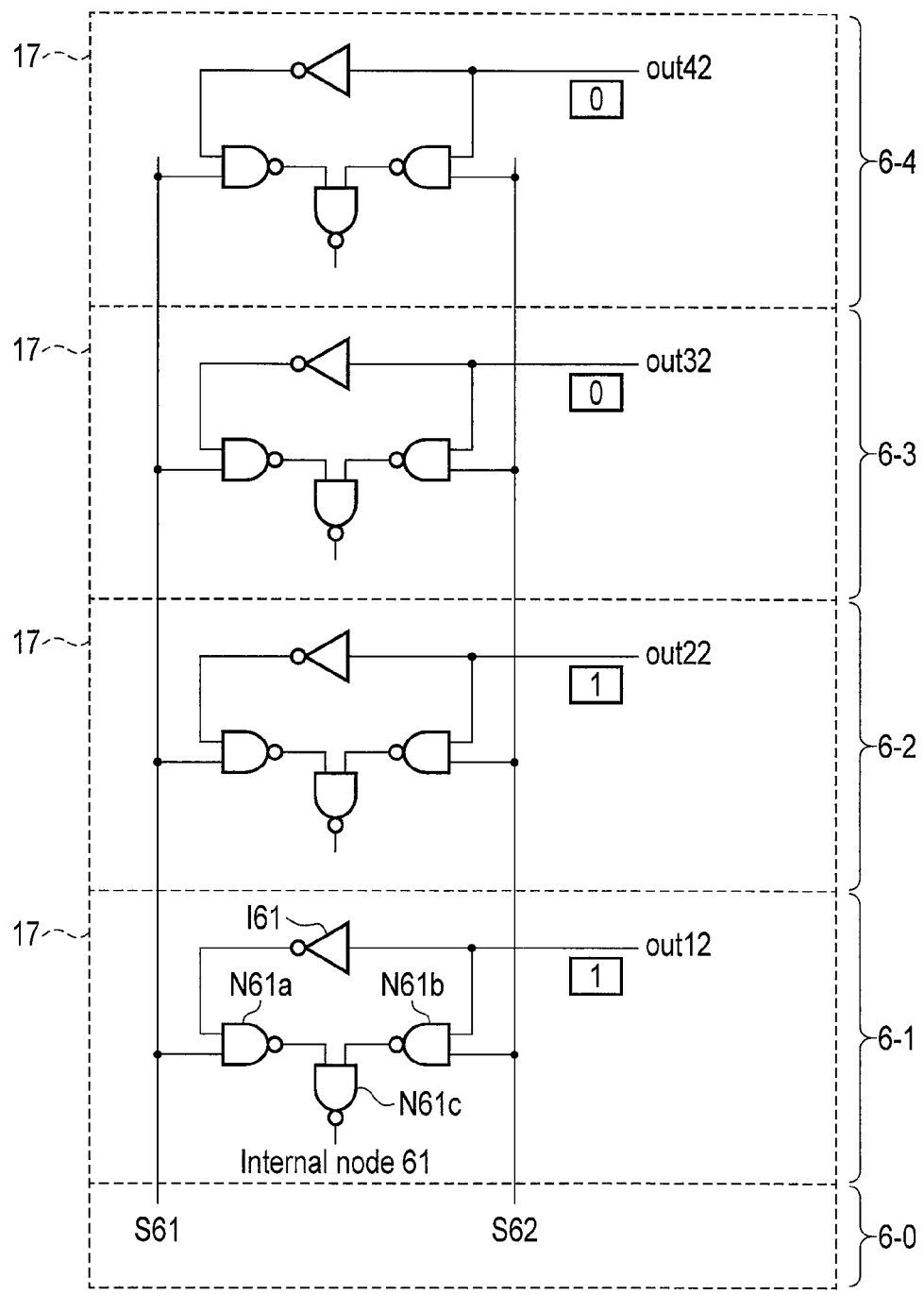
F I G. 10

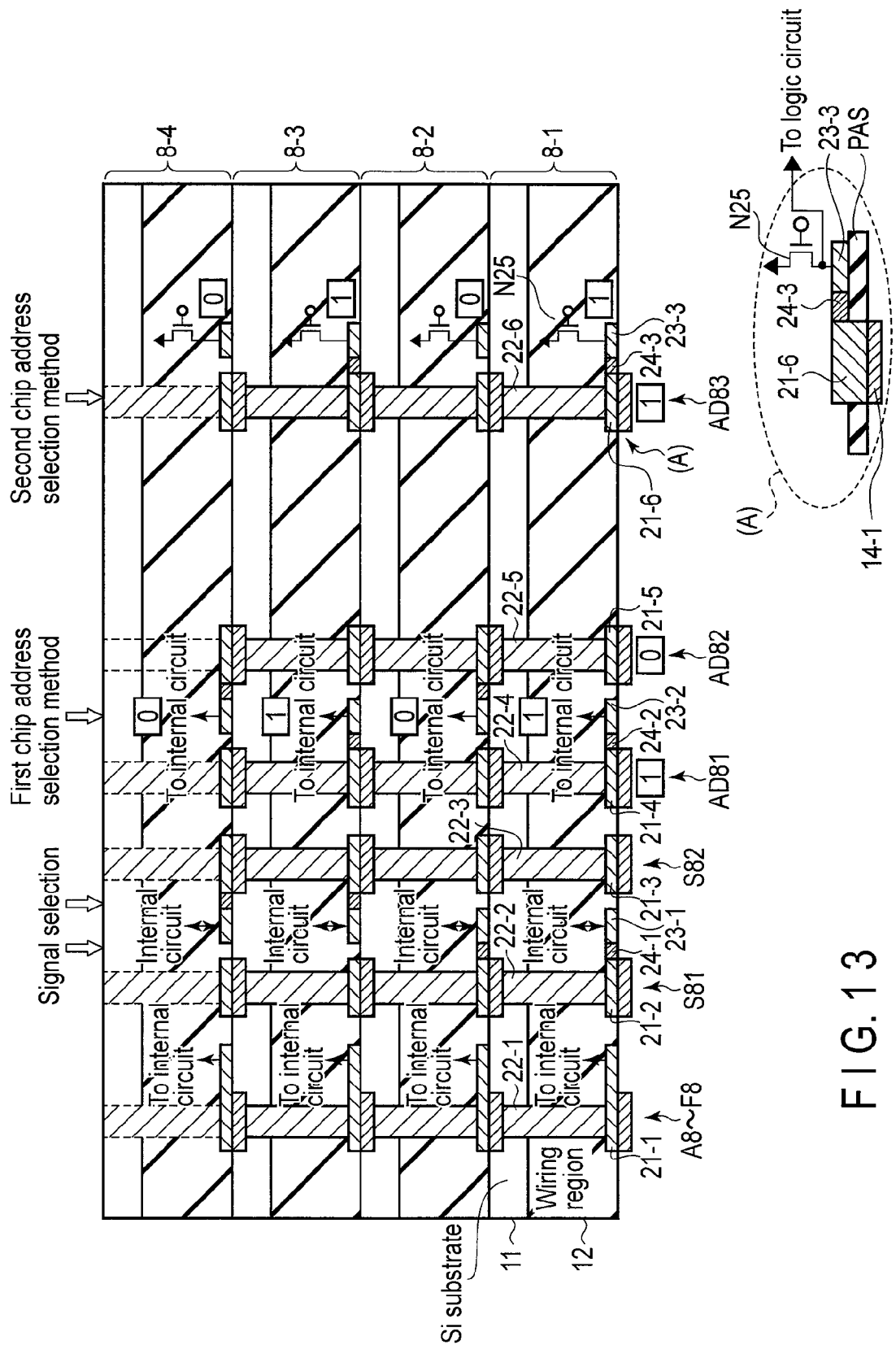
F I G. 13

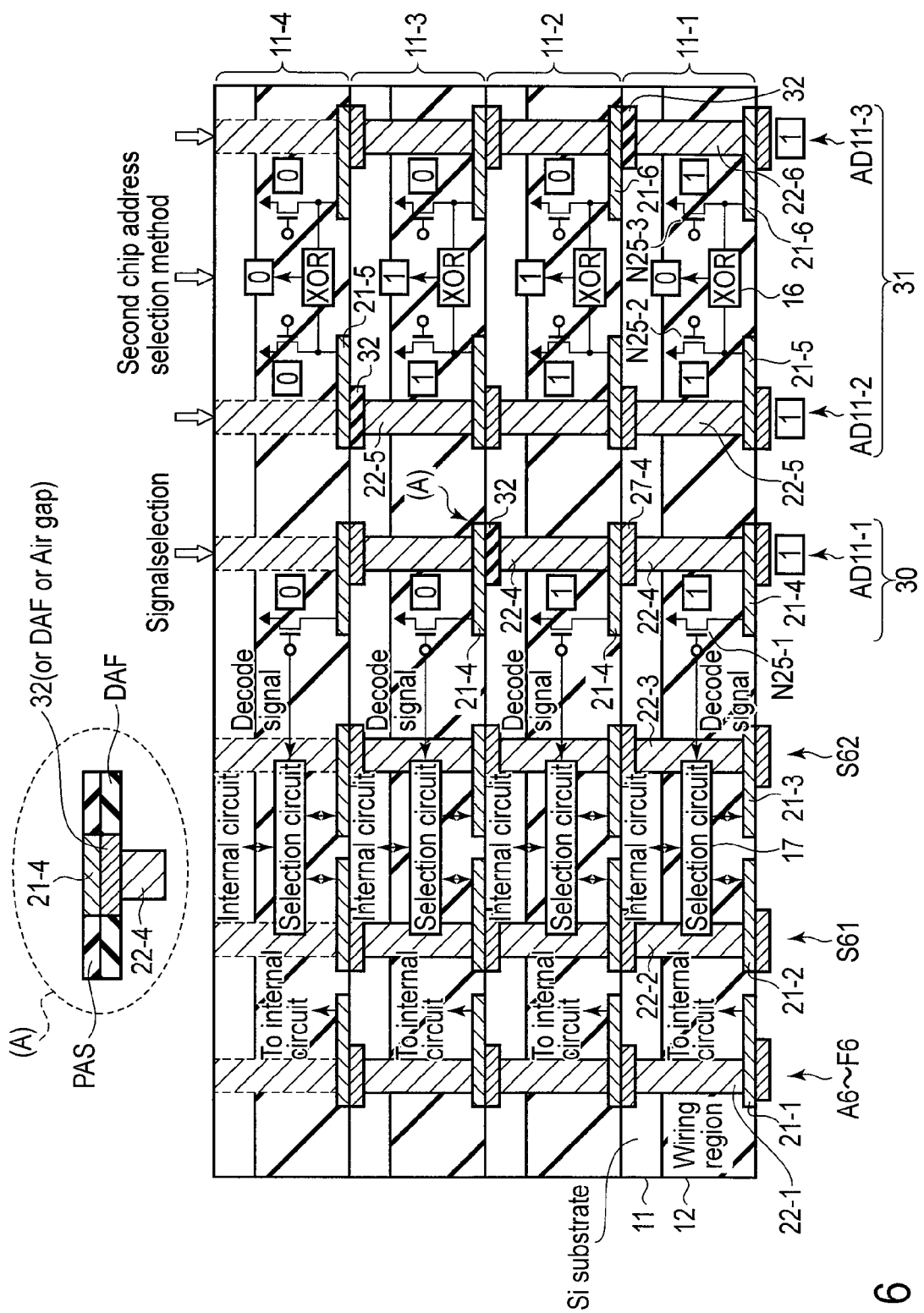
F I G. 16

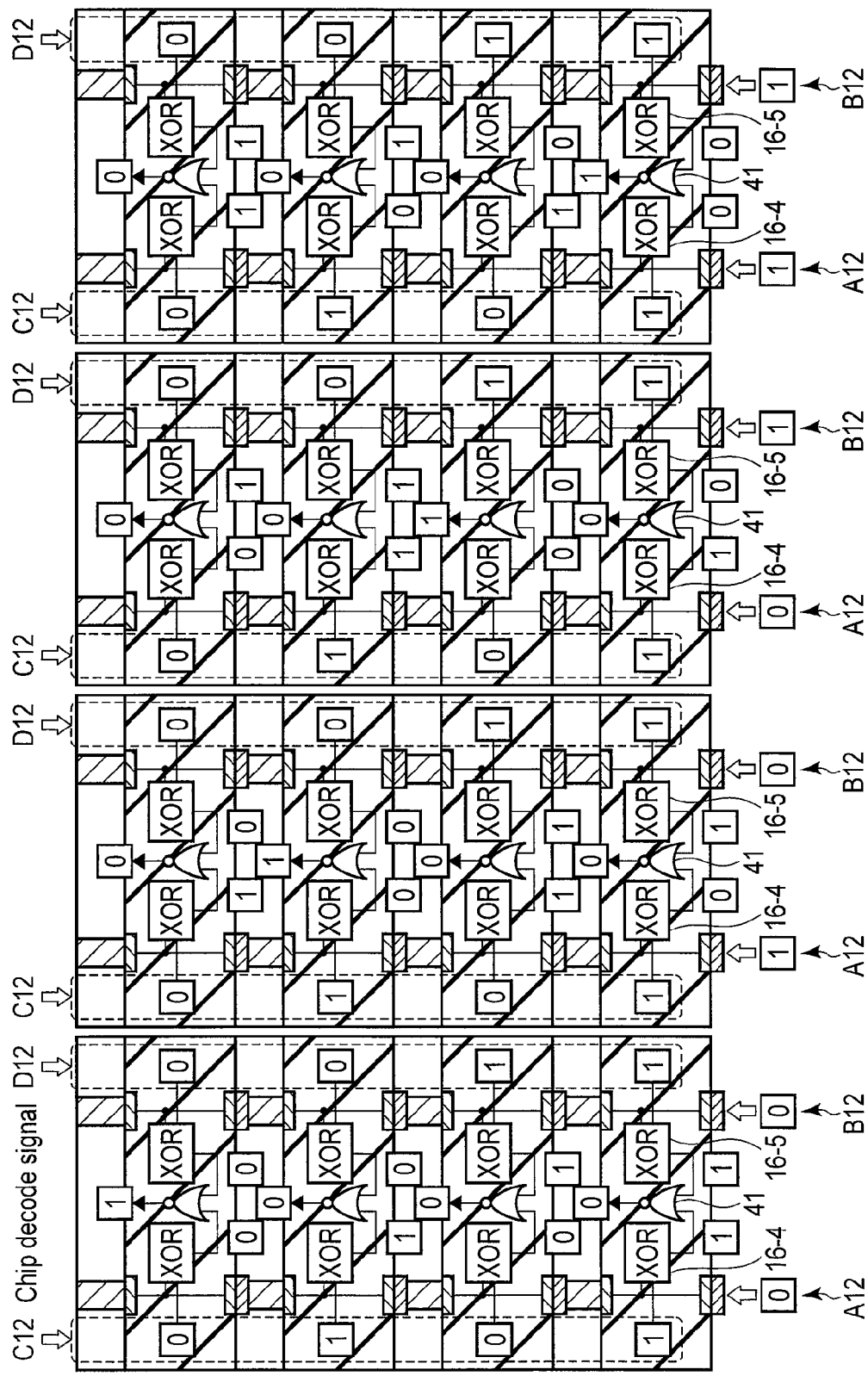

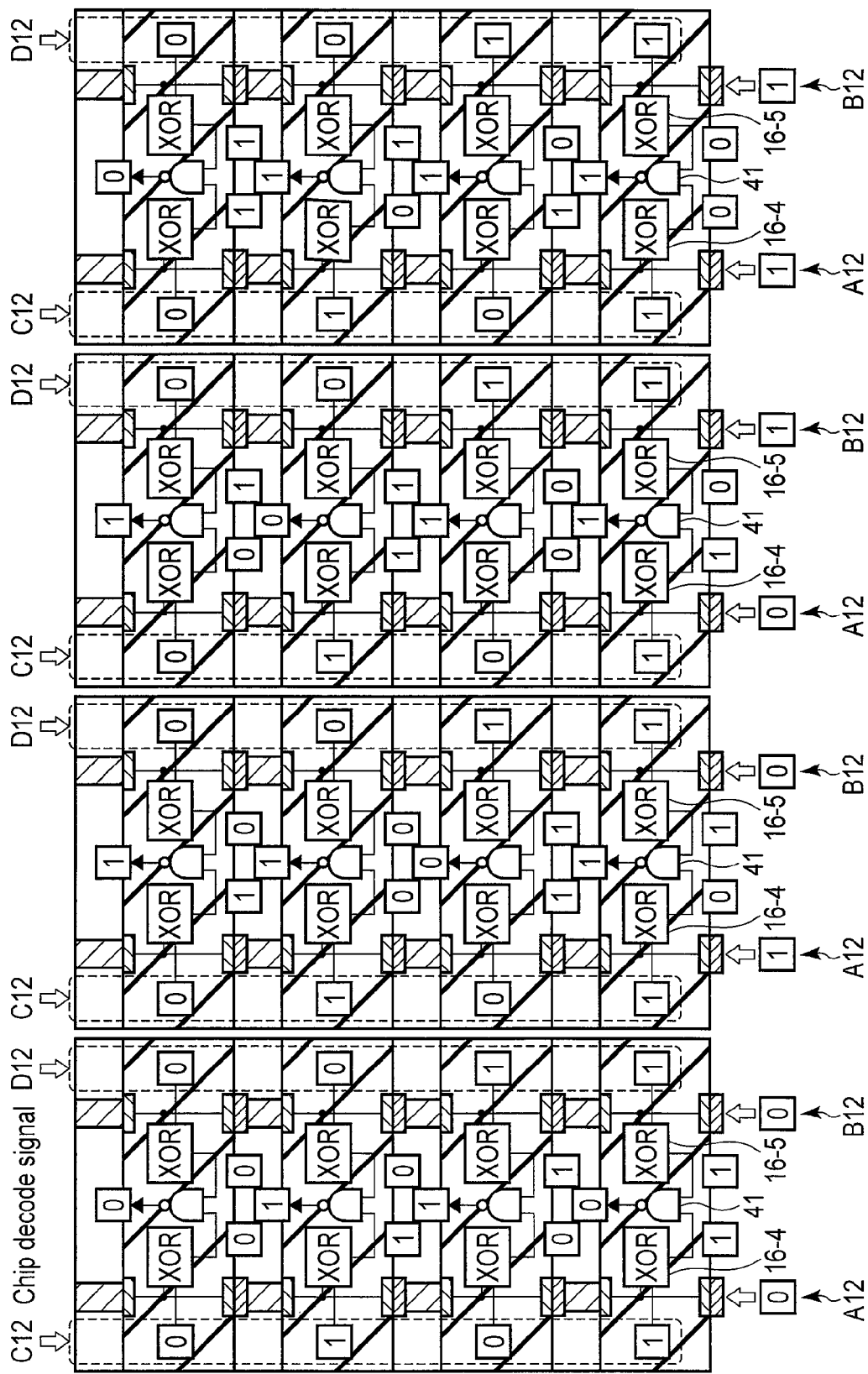

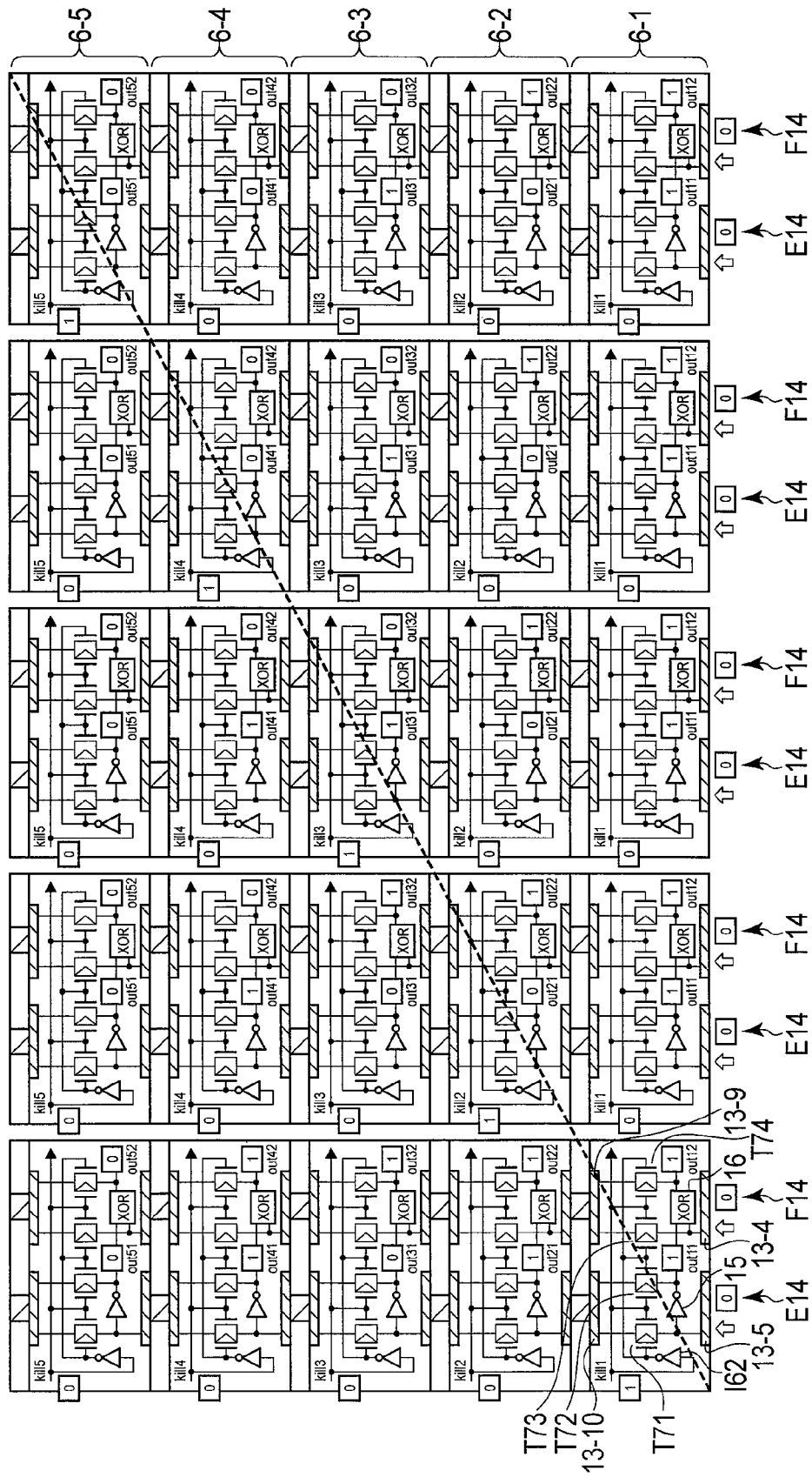

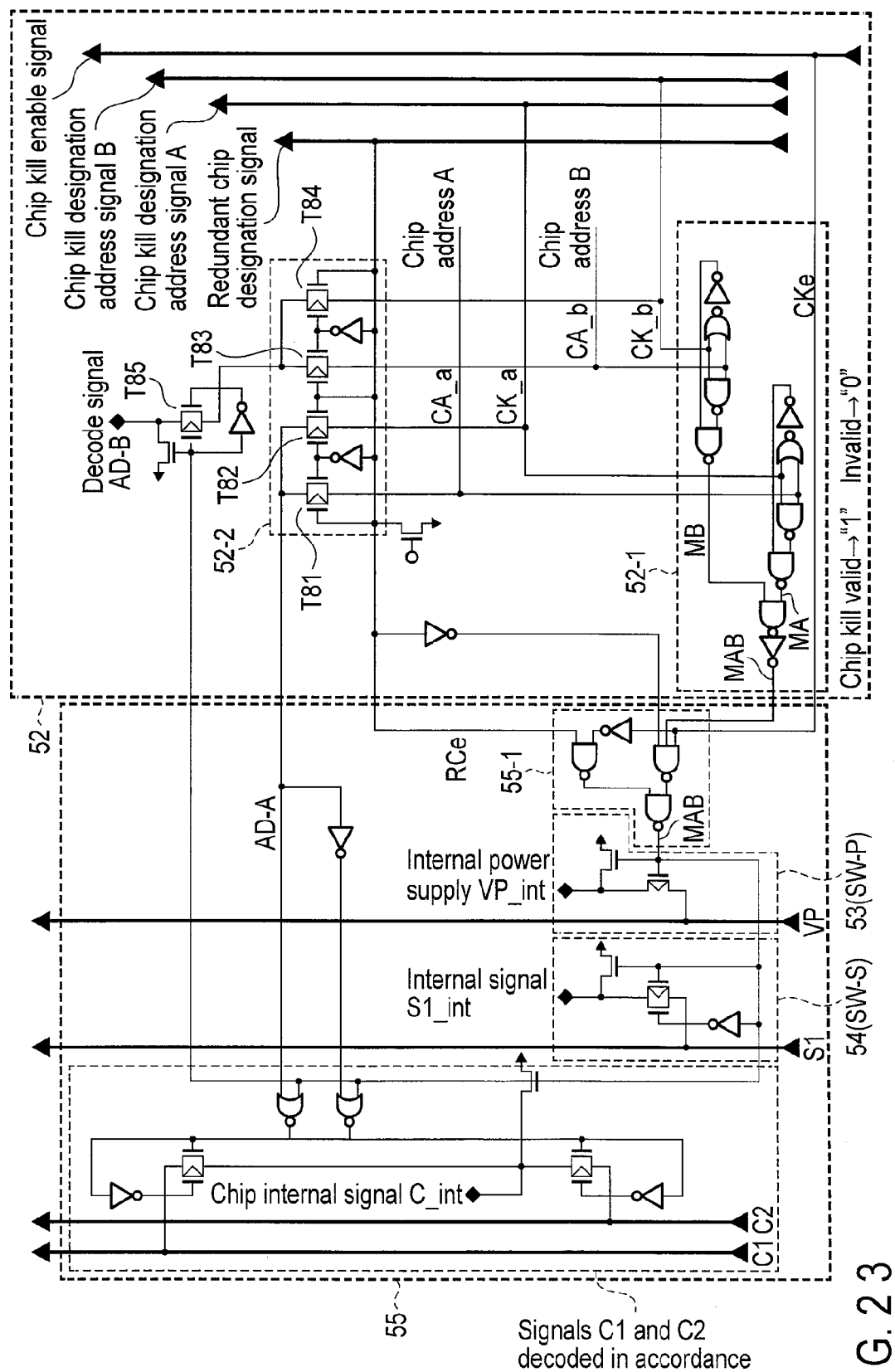
F I G. 23

FIG. 24

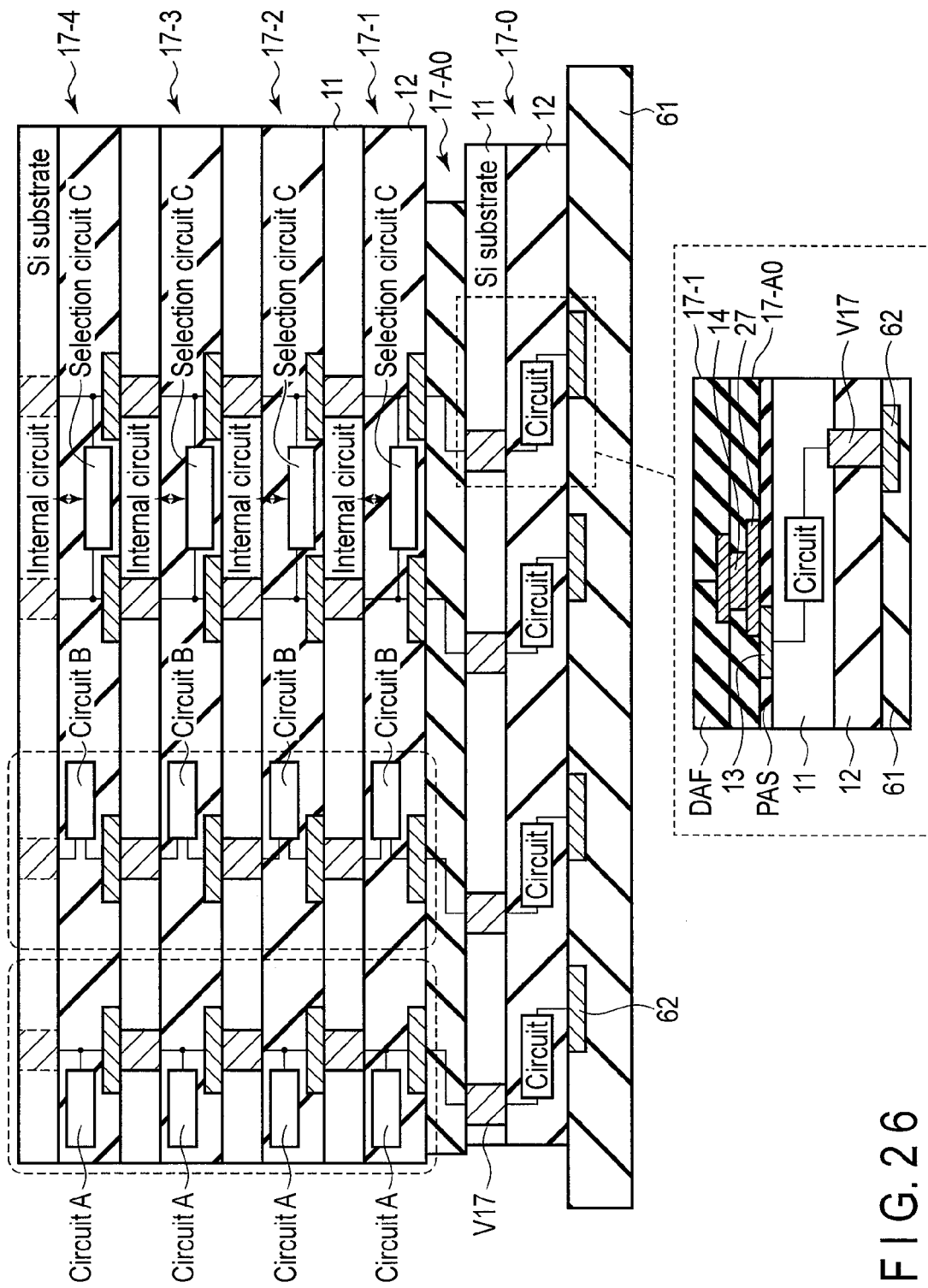
F I G. 26

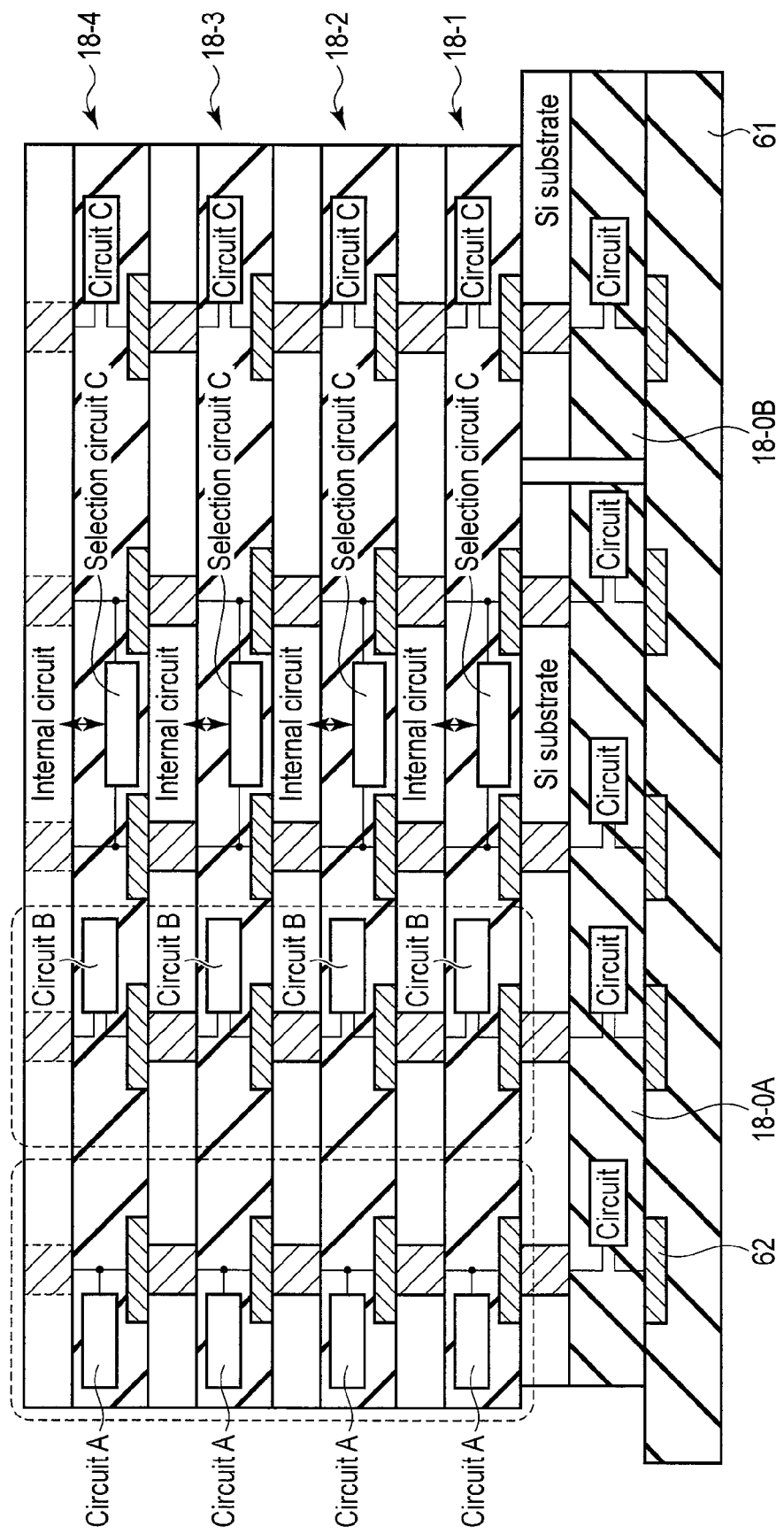
F I G. 29

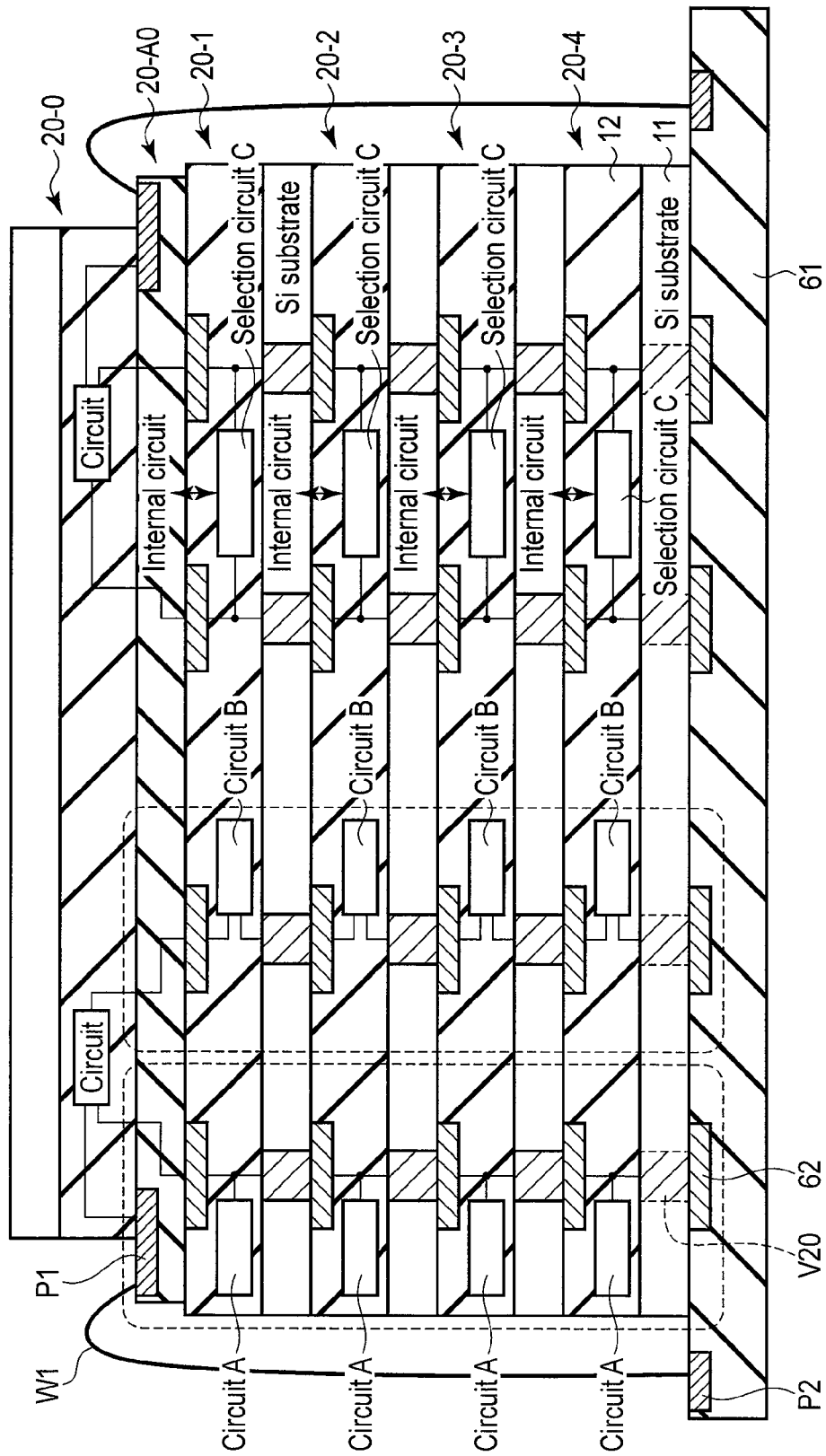
F I G. 32

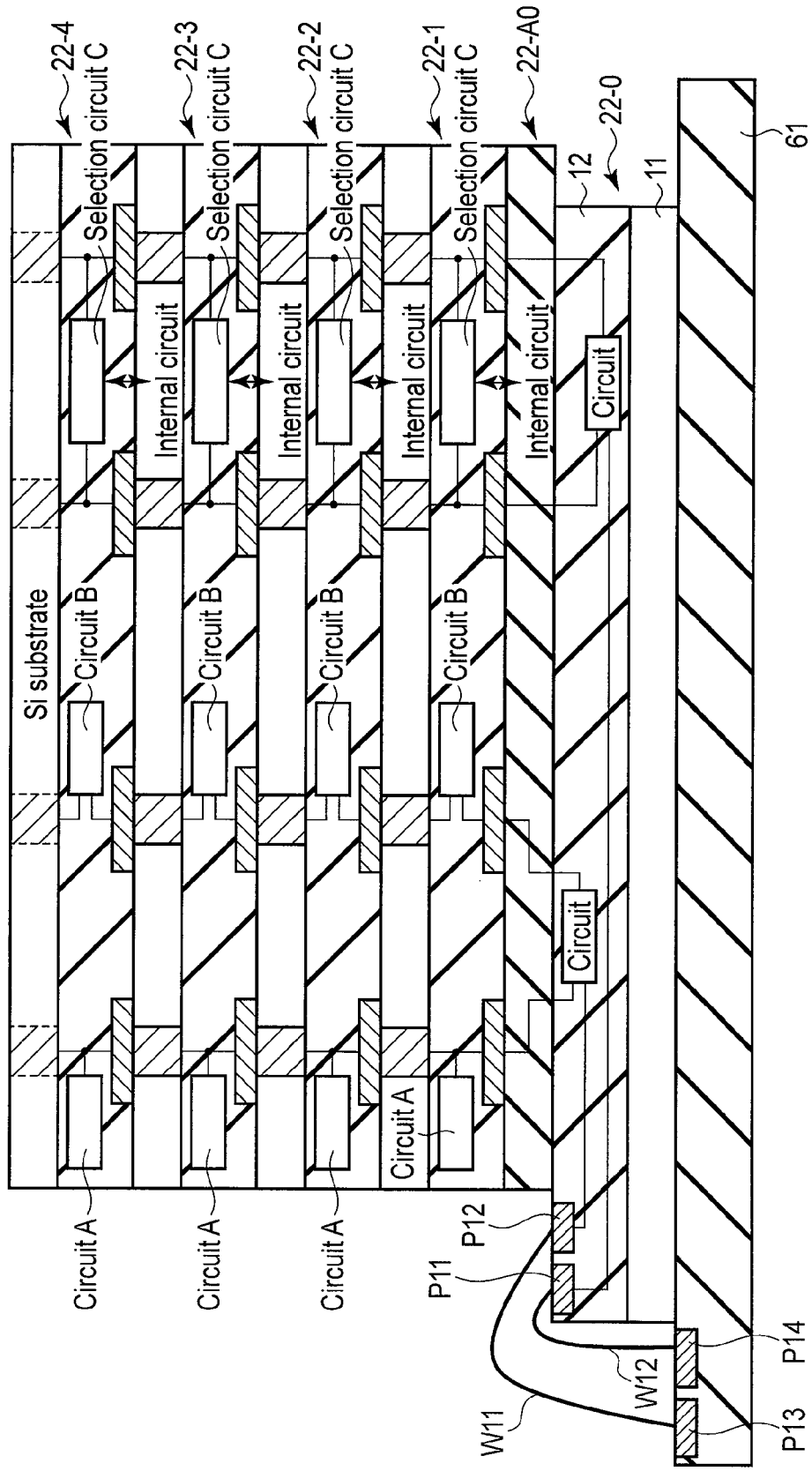
F I G. 34

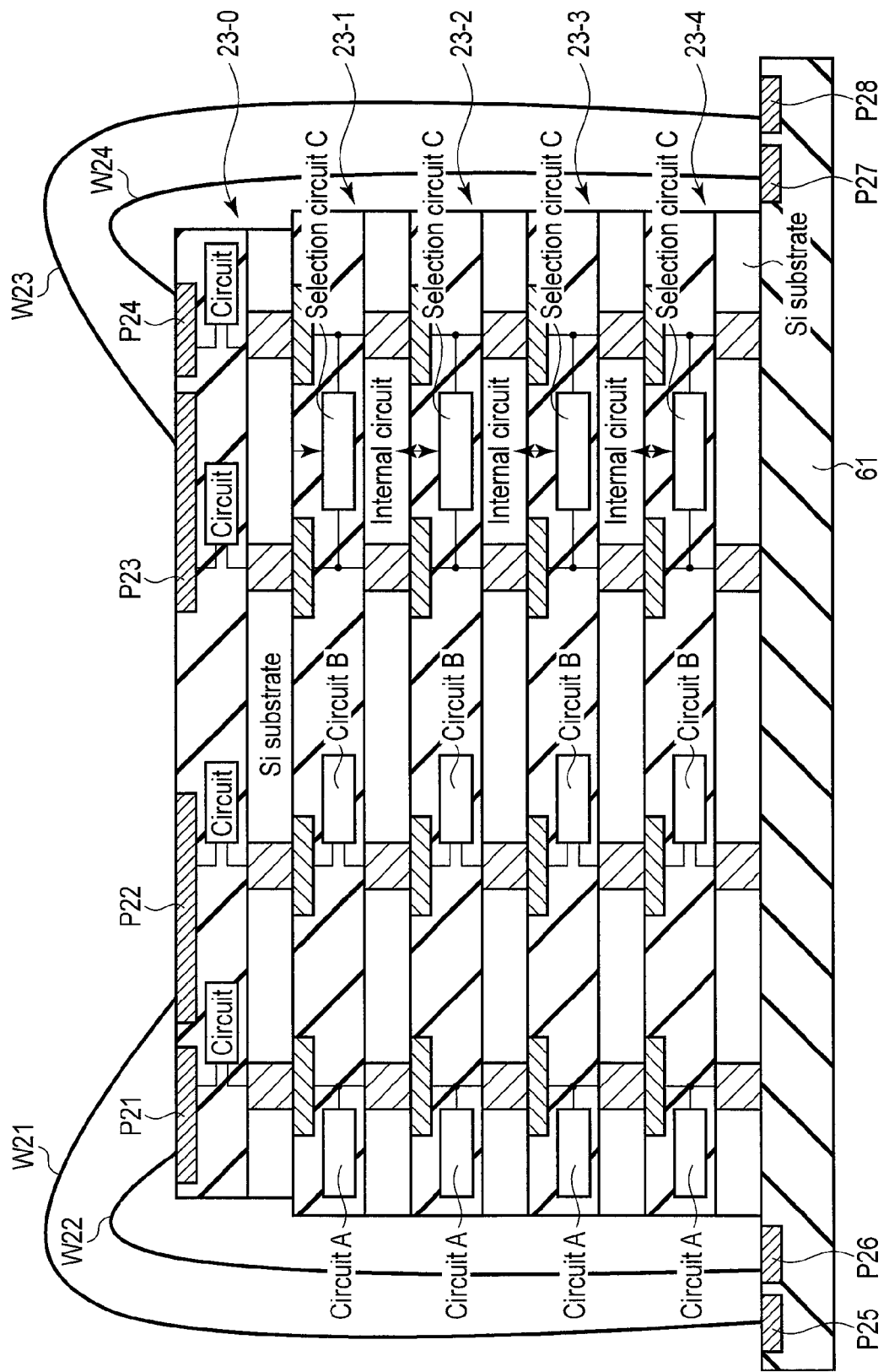
F I G. 35

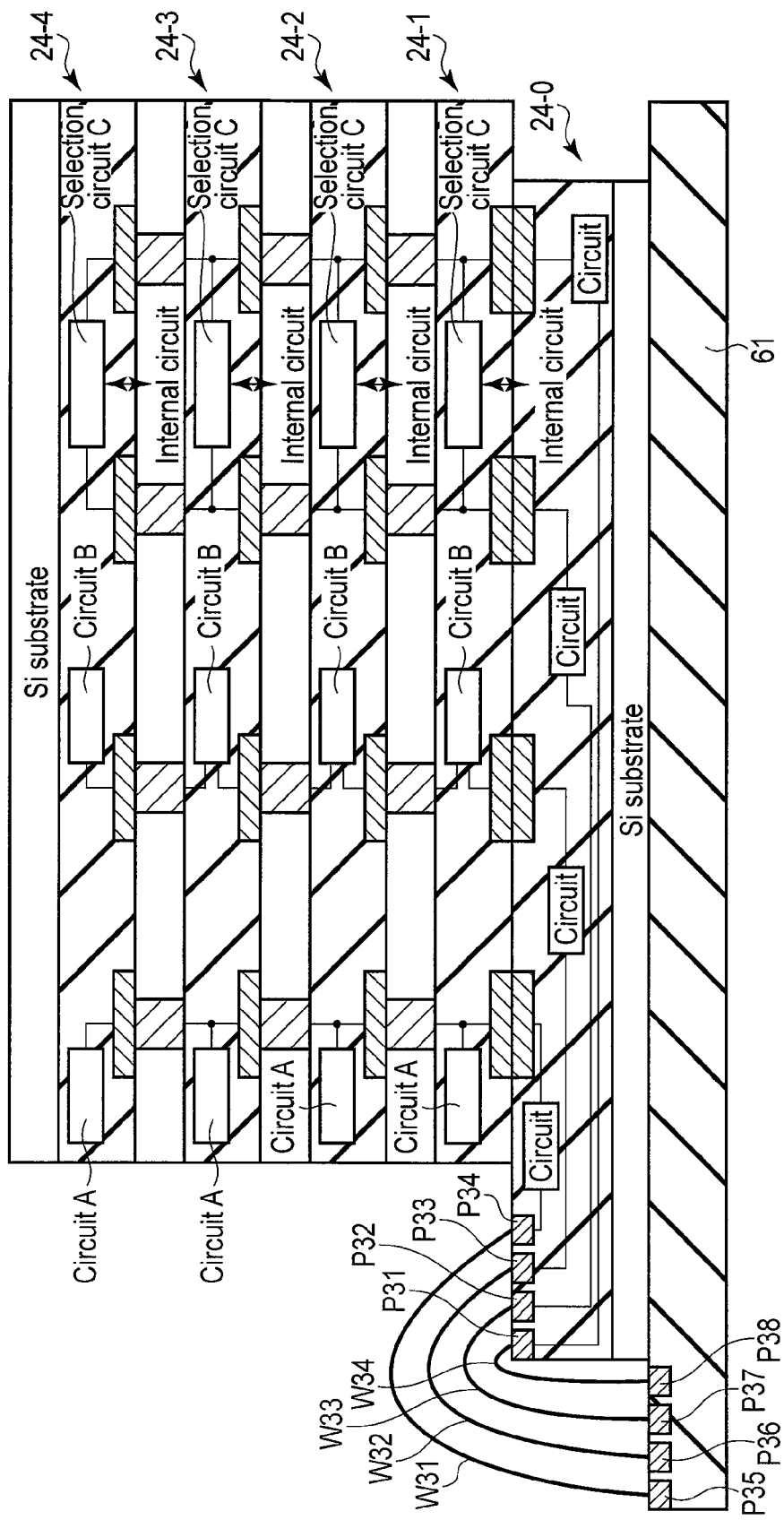
F I G. 36

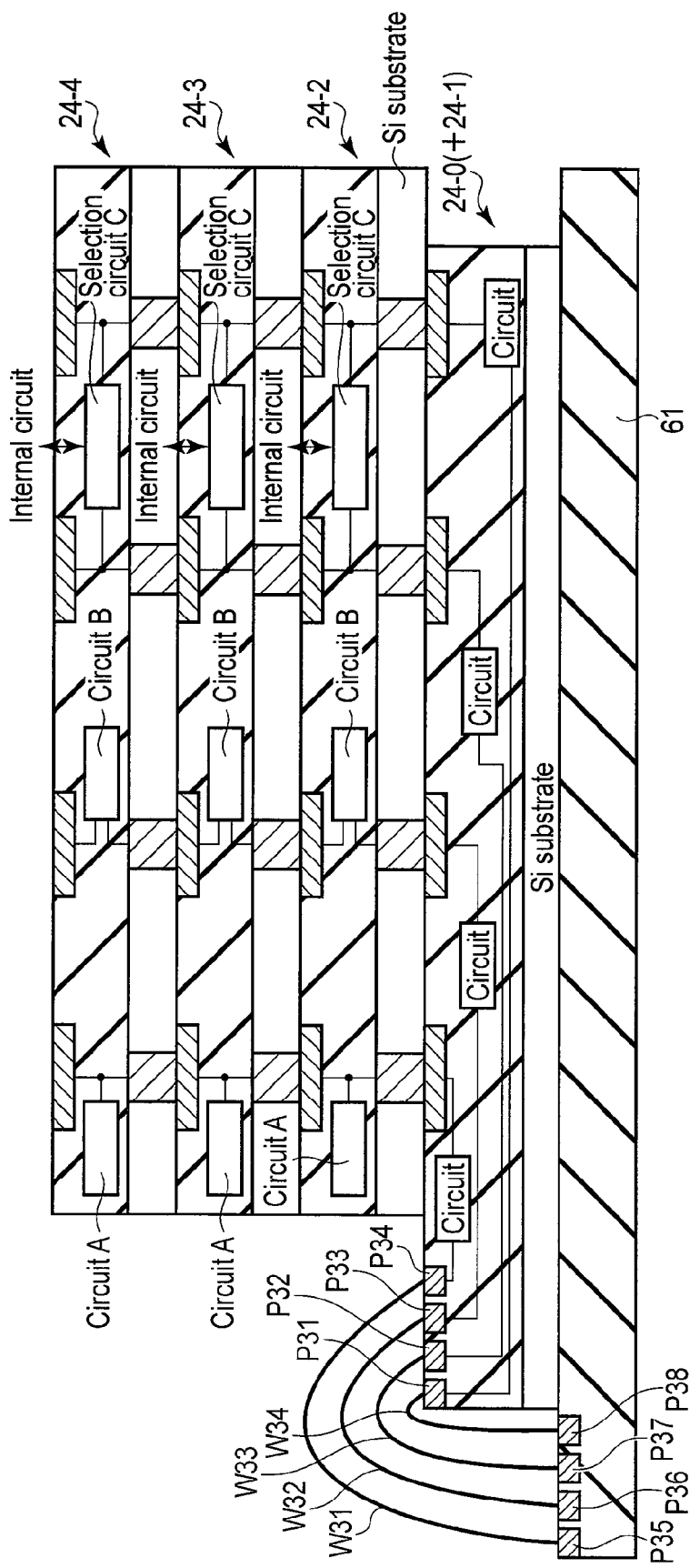
F I G. 38

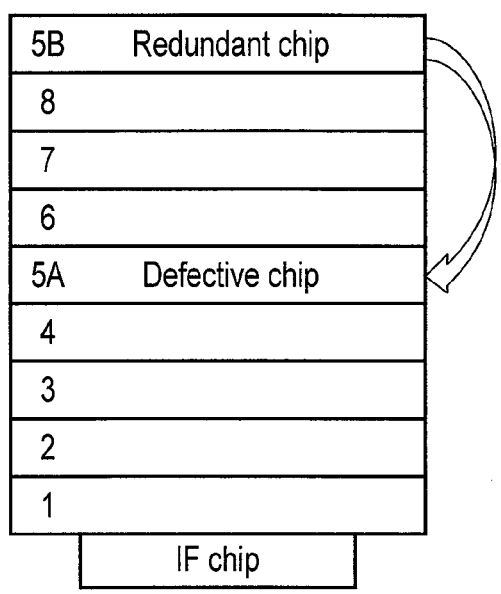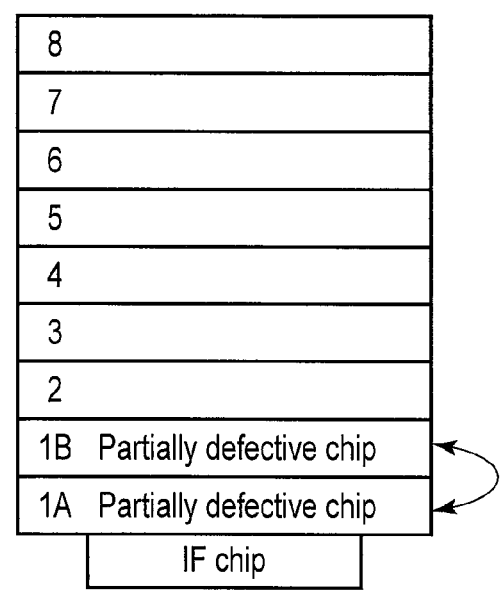
F I G. 3 9 A                F I G. 3 9 B

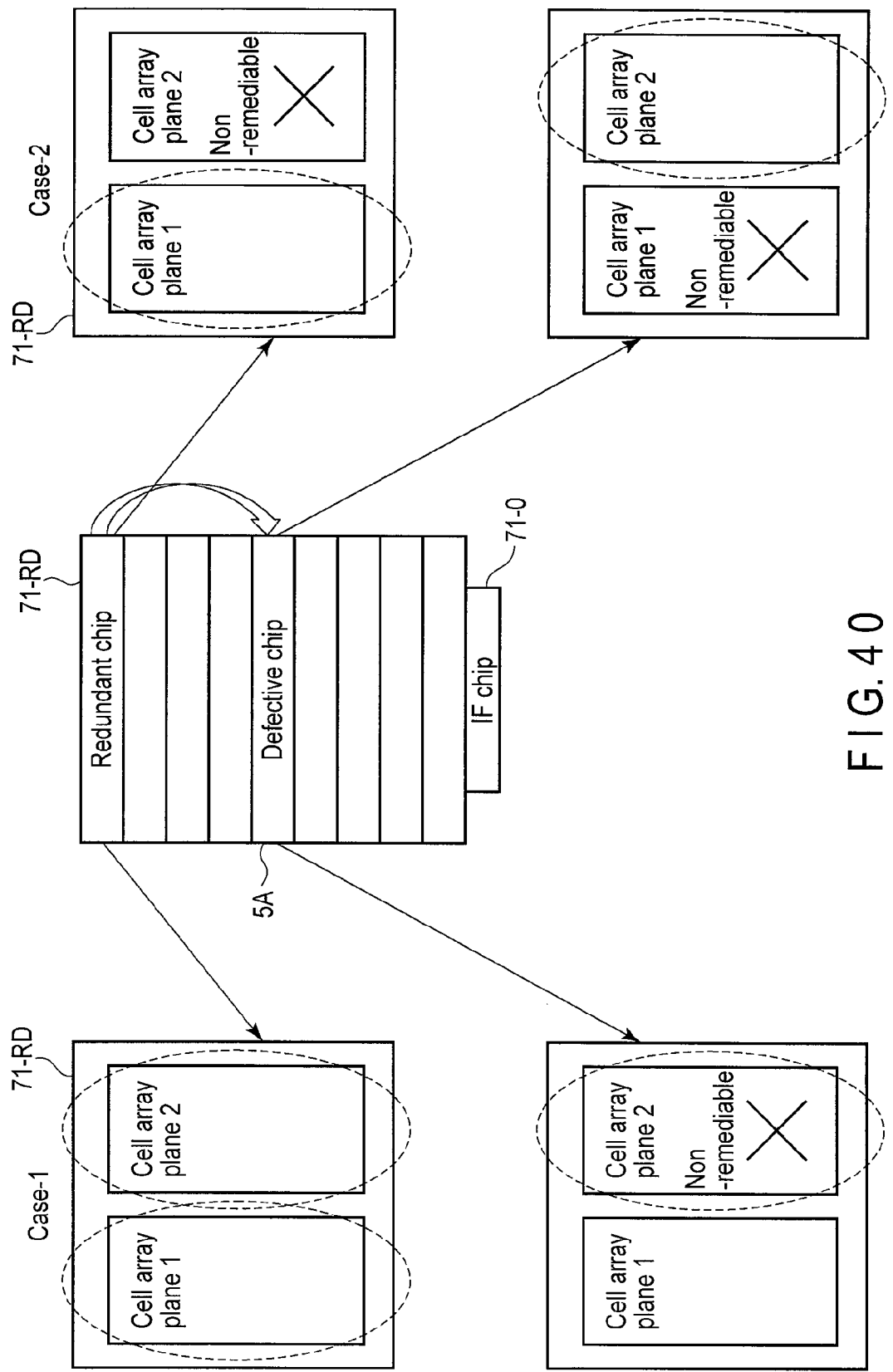
F I G. 40

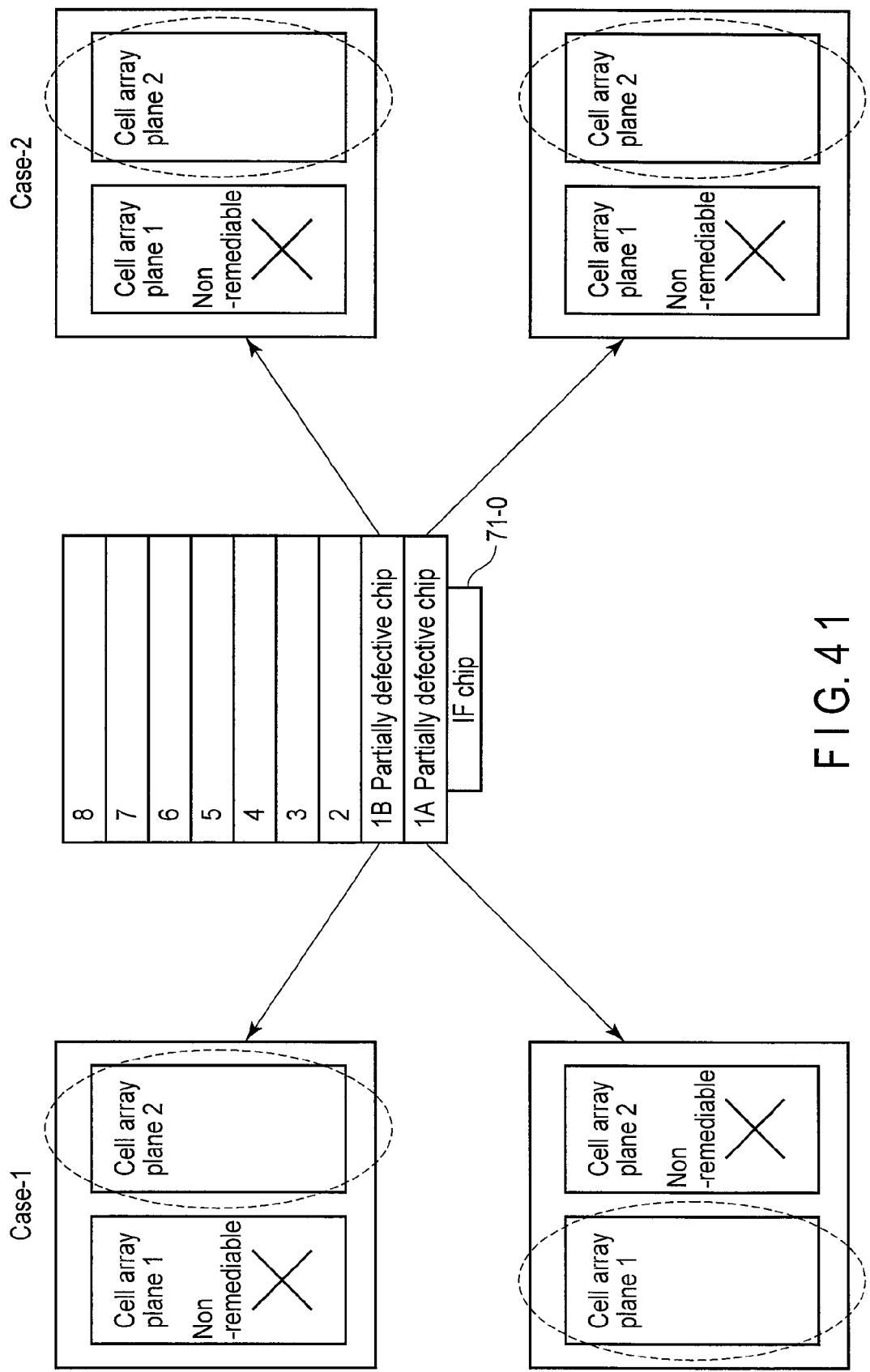
F I G. 41

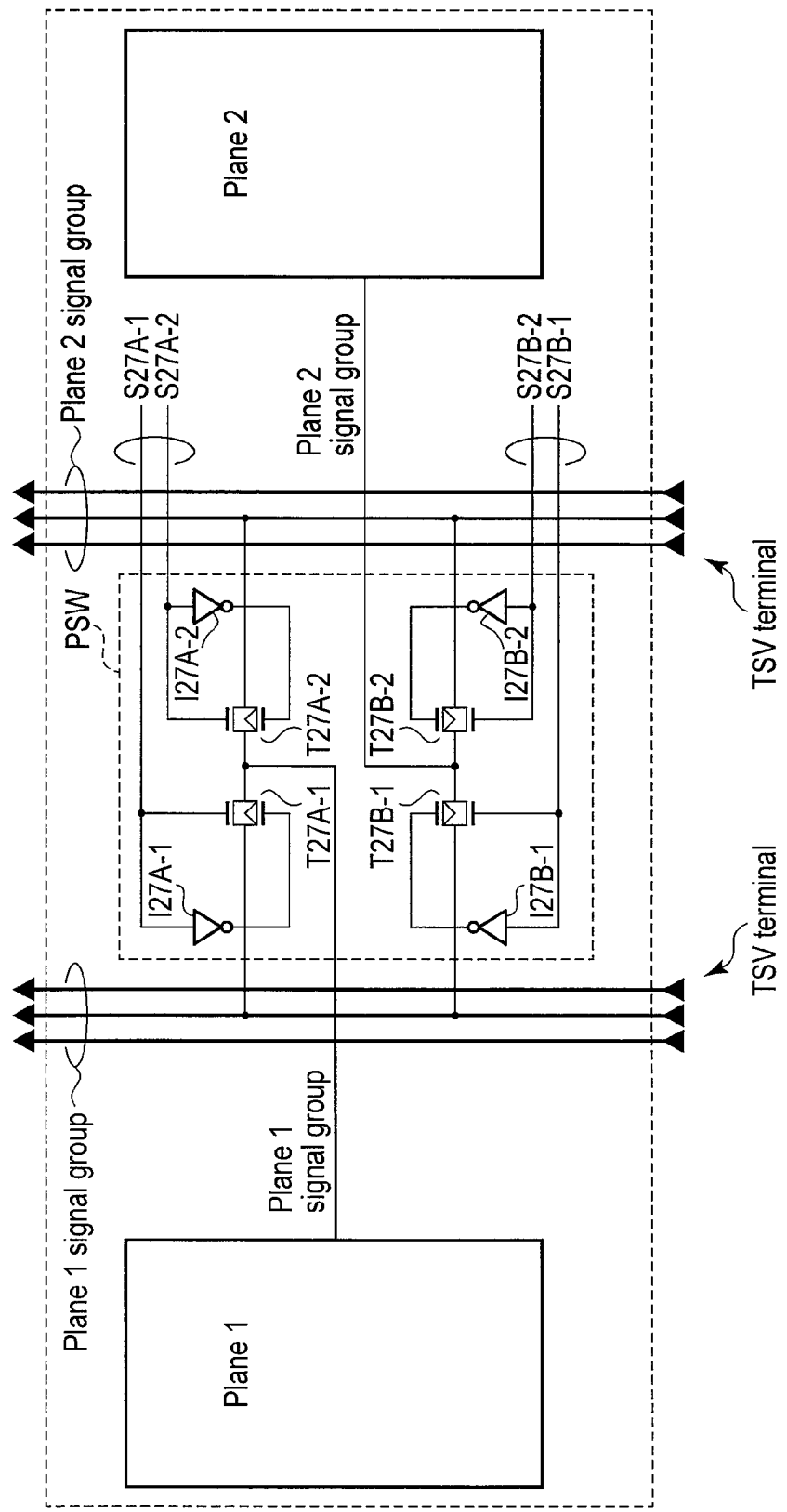
F I G. 42

| Chip | Chip address | | | | Chip external remedial information | | | Chip internal information | | | | | | | Remedy contents |
|---|---|---|---|---|---|---|---|---|---|---|---|---|---|---|---|
| | | | | | | | | Chip address | | | | Remedial information | | | |
| | CA 0c | CA 1c | CA 2c | CA 3c | Remedy chip | Plane 1 remedy | Plane 2 remedy | CA 0int | CA 1int | CA 2int | CA 3int | Remedy chip | Plane 1 remedy | Plane 2 remedy | |
| 9 | 0 | 0 | 0 | 1 | 0 | 0 | 1 | 1 | 1 | 1 | 0 | 0 | Ignore | Ignore | Not remedied |
| 8 | 1 | 1 | 1 | 0 | 0 | 0 | 1 | 0 | 1 | 1 | 0 | 0 | Ignore | Ignore | Not remedied |
| 7 | 0 | 1 | 1 | 0 | 0 | 0 | 1 | 1 | 0 | 1 | 0 | 0 | Ignore | Ignore | Not remedied |
| 6 | 1 | 0 | 1 | 0 | 0 | 0 | 1 | 0 | 0 | 1 | 0 | 0 | Ignore | Ignore | Not remedied |
| 5 | 0 | 0 | 1 | 0 | 0 | 0 | 1 | 1 | 1 | 0 | 0 | 0 | Ignore | Ignore | Not remedied |
| 4 | 1 | 1 | 0 | 0 | 0 | 0 | 1 | 0 | 1 | 0 | 0 | 0 | Ignore | Ignore | Not remedied |
| 3 | 0 | 0 | 0 | 0 | 0 | 0 | 1 | 1 | 0 | 0 | 0 | 0 | Ignore | Ignore | Not remedied |
| 2 | 1 | 0 | 0 | 0 | 1 | 0 | 1 | 0 | 0 | 0 | 0 | 1 | 0 | 1 | Activate plane 1 as plane 2 |
| 1 | 0 | 0 | 0 | 0 | 1 | 0 | 1 | 0 | 0 | 0 | 0 | 1 | 0 | 0 | Activate plane 1 as plane 1 |

F I G. 43

| Case | External information | | CA0 | Chip contents | | Remedy contents |
|---|---|---|---|---|---|---|
| | Plane 1 remedy | Plane 2 remedy | | Plane 1 remedy | Plane 2 remedy | |
| 1 | 0 | 0 | 0 | 0 | 0 | Activate plane 1 alone as plane 1 |
| | | | 1 | 1 | 0 | Activate plane 2 alone as plane 2 |
| 2 | 1 | 1 | 0 | 1 | 1 | Activate plane 2 alone as plane 2 |
| | | | 1 | 0 | 1 | Activate plane 1 alone as plane 1 |
| 3 | 0 | 1 | 0 | 0 | 0 | Activate plane 1 alone as plane 1 |
| | | | 1 | 0 | 1 | Activate plane 1 alone as plane 2 |
| 4 | 1 | 0 | 0 | 1 | 1 | Activate plane 2 alone as plane 2 |
| | | | 1 | 1 | 0 | Activate plane 2 alone as plane 1 |

F I G. 44

| Case | Chip | CE | AD3A | AD3B | AD3C |
|---|---|---|---|---|---|
| 1CE | 1 | CE3A | 0 | 0 | 0 |
| | 2 | CE3A | 1 | 0 | 0 |
| | 3 | CE3A | 0 | 1 | 0 |
| | 4 | CE3A | 1 | 1 | 0 |
| | 5 | CE3A | 0 | 0 | 1 |
| | 6 | CE3A | 1 | 0 | 1 |
| | 7 | CE3A | 0 | 1 | 1 |
| | 8 | CE3A | 1 | 1 | 1 |
| 2CE | 1 | CE3A | 0 | 0 | 0 |
| | 2 | CE3B | 0 | 0 | 0 |
| | 3 | CE3A | 1 | 0 | 0 |
| | 4 | CE3B | 1 | 0 | 0 |
| | 5 | CE3A | 0 | 1 | 0 |
| | 6 | CE3B | 0 | 1 | 0 |
| | 7 | CE3A | 1 | 1 | 0 |
| | 8 | CE3B | 1 | 1 | 0 |
| 4CE | 1 | CE3A | 0 | 0 | 0 |
| | 2 | CE3B | 0 | 0 | 0 |
| | 3 | CE3C | 0 | 0 | 0 |
| | 4 | CE3D | 0 | 0 | 0 |
| | 5 | CE3A | 1 | 0 | 0 |
| | 6 | CE3B | 1 | 0 | 0 |
| | 7 | CE3C | 1 | 0 | 0 |
| | 8 | CE3D | 1 | 0 | 0 |

F I G. 45

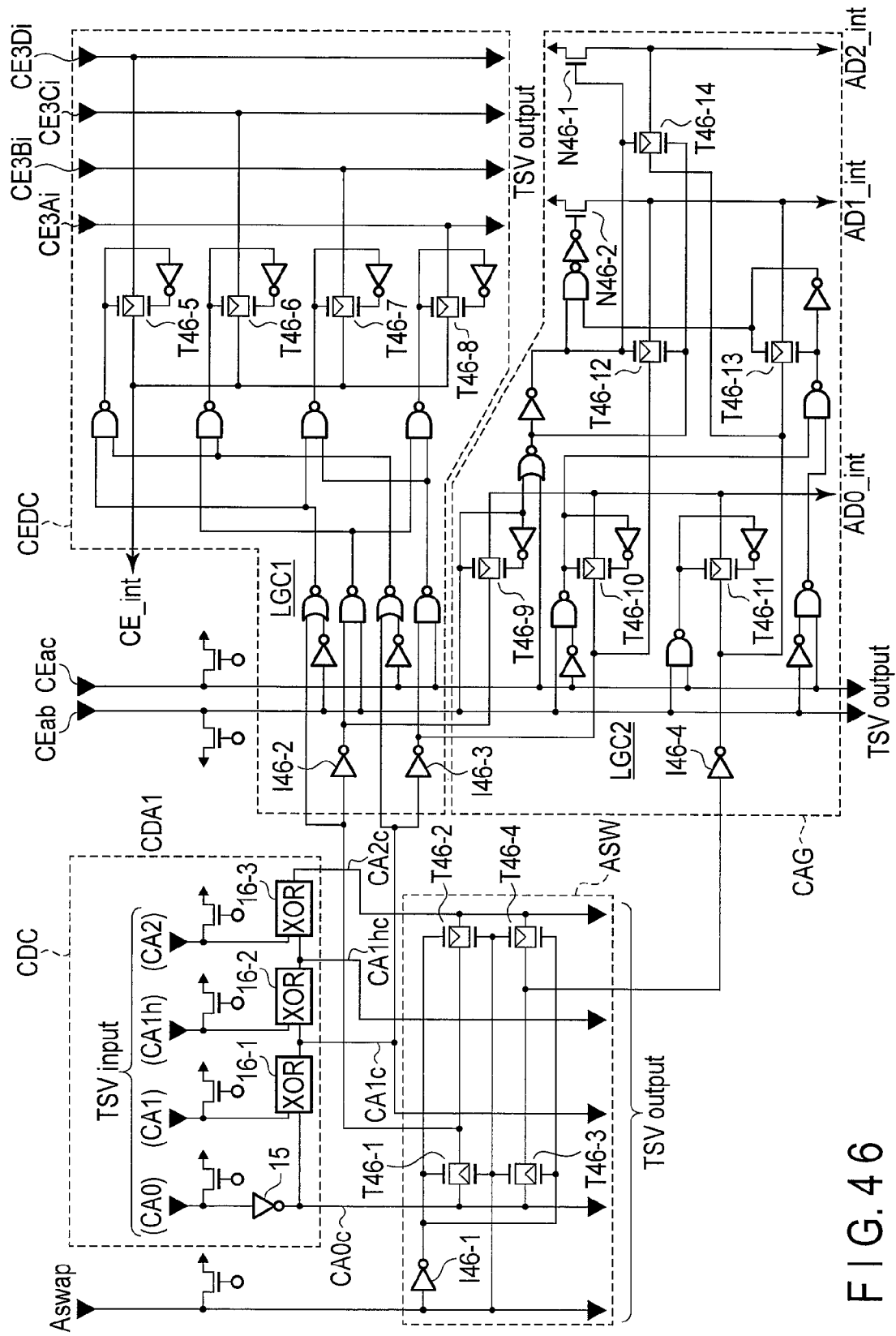
F I G. 46

| Case | Chip | Chip decode circuit output ||||| Chip internal signal |||| CE configuration control signal |||
|---|---|---|---|---|---|---|---|---|---|---|---|---|
| | | CA0c | CA1c | CA1hc | CA2c | CE_int | AD0_int | AD1_int | AD2_int | CEab | CEac | Aswap |
| 1CE | 1 | 1 | 1 | 1 | 1 | CE3Ai | 0 | 0 | 0 | 0 | 0 | 0 |
| | 2 | 0 | 1 | 0 | 1 | CE3Ai | 1 | 0 | 0 | 0 | 0 | 0 |
| | 3 | 1 | 0 | 0 | 1 | CE3Ai | 0 | 1 | 0 | 0 | 0 | 0 |
| | 4 | 0 | 0 | 0 | 1 | CE3Ai | 1 | 1 | 0 | 0 | 0 | 0 |
| | 5 | 1 | 1 | 1 | 0 | CE3Ai | 0 | 0 | 1 | 0 | 0 | 0 |
| | 6 | 0 | 1 | 0 | 0 | CE3Ai | 1 | 0 | 1 | 0 | 0 | 0 |
| | 7 | 1 | 0 | 0 | 0 | CE3Ai | 0 | 1 | 1 | 0 | 0 | 0 |
| | 8 | 0 | 0 | 0 | 0 | CE3Ai | 1 | 1 | 1 | 0 | 0 | 0 |
| 2CE | 1 | 1 | 1 | 1 | 1 | CE3Ai | 0 | 0 | 0 | 1 | 0 | 0 |
| | 2 | 0 | 1 | 0 | 1 | CE3Bi | 1 | 0 | 0 | 1 | 0 | 0 |
| | 3 | 1 | 0 | 0 | 1 | CE3Ai | 0 | 1 | 0 | 1 | 0 | 0 |
| | 4 | 0 | 0 | 0 | 1 | CE3Bi | 1 | 1 | 0 | 1 | 0 | 0 |
| | 5 | 1 | 1 | 1 | 0 | CE3Ai | 0 | 0 | 0 | 1 | 0 | 0 |
| | 6 | 0 | 1 | 0 | 0 | CE3Bi | 1 | 0 | 0 | 1 | 0 | 0 |
| | 7 | 1 | 0 | 0 | 0 | CE3Ai | 0 | 1 | 0 | 1 | 0 | 0 |
| | 8 | 0 | 0 | 0 | 0 | CE3Bi | 1 | 1 | 0 | 1 | 0 | 0 |
| 4CE | 1 | 1 | 1 | 1 | 1 | CE3Ai | 0 | 0 | 0 | 1 | 1 | 0 |
| | 2 | 0 | 1 | 0 | 1 | CE3Bi | 1 | 0 | 0 | 1 | 1 | 0 |
| | 3 | 1 | 0 | 0 | 1 | CE3Ci | 0 | 0 | 0 | 1 | 1 | 0 |
| | 4 | 0 | 0 | 0 | 1 | CE3Di | 1 | 0 | 0 | 1 | 1 | 0 |
| | 5 | 1 | 1 | 1 | 0 | CE3Ai | 0 | 0 | 0 | 1 | 1 | 0 |
| | 6 | 0 | 1 | 0 | 0 | CE3Bi | 1 | 0 | 0 | 1 | 1 | 0 |
| | 7 | 1 | 0 | 0 | 0 | CE3Ci | 0 | 0 | 0 | 1 | 1 | 0 |
| | 8 | 0 | 0 | 0 | 0 | CE3Di | 1 | 0 | 0 | 1 | 1 | 0 |

F I G. 47

| Case | Chip | Chip decode circuit output | | | | Chip internal signal | | | | CE configuration control signal | | |
|---|---|---|---|---|---|---|---|---|---|---|---|---|
| | | CA0c | CA1c | CA1hc | CA2c | CE_int | AD0_int | AD1_int | AD2_int | CEab | CEac | Aswap input reversal |
| 1CE | 1 | 1 | 1 | 1 | 1 | CE3Ai | 0 | 0 | 0 | 0 | 0 | 1 |
| | 2 | 0 | 1 | 0 | 1 | CE3Ai | 0 | 0 | 1 | 0 | 0 | 1 |
| | 3 | 1 | 0 | 0 | 1 | CE3Ai | 0 | 1 | 0 | 0 | 0 | 1 |
| | 4 | 0 | 0 | 0 | 1 | CE3Ai | 0 | 1 | 1 | 0 | 0 | 1 |
| | 5 | 1 | 1 | 1 | 0 | CE3Ai | 1 | 0 | 0 | 0 | 0 | 1 |
| | 6 | 0 | 1 | 0 | 0 | CE3Ai | 1 | 0 | 1 | 0 | 0 | 1 |
| | 7 | 1 | 0 | 0 | 0 | CE3Ai | 1 | 1 | 0 | 0 | 0 | 1 |
| | 8 | 0 | 0 | 0 | 0 | CE3Ai | 1 | 1 | 1 | 0 | 0 | 1 |
| 2CE | 1 | 1 | 1 | 1 | 1 | CE3Ai | 0 | 0 | 0 | 1 | 0 | 1 |
| | 2 | 0 | 1 | 0 | 1 | CE3Ai | 0 | 1 | 0 | 1 | 0 | 1 |
| | 3 | 1 | 0 | 0 | 1 | CE3Ai | 1 | 0 | 0 | 1 | 0 | 1 |
| | 4 | 0 | 0 | 0 | 1 | CE3Ai | 1 | 1 | 0 | 1 | 0 | 1 |
| | 5 | 1 | 1 | 1 | 0 | CE3Bi | 0 | 0 | 0 | 1 | 0 | 1 |
| | 6 | 0 | 1 | 0 | 0 | CE3Bi | 0 | 1 | 0 | 1 | 0 | 1 |
| | 7 | 1 | 0 | 0 | 0 | CE3Bi | 1 | 0 | 0 | 1 | 0 | 1 |
| | 8 | 0 | 0 | 0 | 0 | CE3Bi | 1 | 1 | 0 | 1 | 0 | 1 |
| 4CE | 1 | 1 | 1 | 1 | 1 | CE3Ai | 0 | 0 | 0 | 1 | 1 | 1 |
| | 2 | 0 | 1 | 0 | 1 | CE3Ai | 1 | 0 | 0 | 1 | 1 | 1 |
| | 3 | 1 | 0 | 0 | 1 | CE3Ci | 0 | 0 | 0 | 1 | 1 | 1 |
| | 4 | 0 | 0 | 0 | 1 | CE3Ci | 1 | 0 | 0 | 1 | 1 | 1 |
| | 5 | 1 | 1 | 1 | 0 | CE3Bi | 0 | 0 | 0 | 1 | 1 | 1 |
| | 6 | 0 | 1 | 0 | 0 | CE3Bi | 1 | 0 | 0 | 1 | 1 | 1 |
| | 7 | 1 | 0 | 0 | 0 | CE3Di | 0 | 0 | 0 | 1 | 1 | 1 |
| | 8 | 0 | 0 | 0 | 0 | CE3Di | 1 | 0 | 0 | 1 | 1 | 1 |

FIG. 48

| Case | Chip | Chip decode circuit output | | | | Chip internal signal | | | | CE configuration control signal | | |
|---|---|---|---|---|---|---|---|---|---|---|---|---|
| | | CA0c | CA1c | CA1hc | CA2c input reversal | CE_int | AD0_int | AD1_int | AD2_int | CEab | CEac | Aswap input reversal |
| 1CE | 1 | 1 | 1 | 1 | 0 | CE3Ai | 1 | 0 | 0 | 0 | 0 | 1 |
| | 2 | 0 | 1 | 0 | 0 | CE3Ai | 1 | 0 | 1 | 0 | 0 | 1 |
| | 3 | 1 | 0 | 0 | 0 | CE3Ai | 1 | 1 | 0 | 0 | 0 | 1 |
| | 4 | 0 | 0 | 0 | 0 | CE3Ai | 1 | 1 | 1 | 0 | 0 | 1 |
| | 5 | 1 | 1 | 1 | 1 | CE3Ai | 0 | 0 | 0 | 0 | 0 | 1 |
| | 6 | 0 | 1 | 0 | 1 | CE3Ai | 0 | 0 | 1 | 0 | 0 | 1 |
| | 7 | 1 | 0 | 0 | 1 | CE3Ai | 0 | 1 | 0 | 0 | 0 | 1 |
| | 8 | 0 | 0 | 0 | 1 | CE3Ai | 0 | 1 | 1 | 0 | 0 | 1 |
| 2CE | 1 | 1 | 1 | 1 | 0 | CE3Bi | 0 | 0 | 0 | 1 | 0 | 1 |
| | 2 | 0 | 1 | 0 | 0 | CE3Bi | 0 | 0 | 0 | 1 | 0 | 1 |
| | 3 | 1 | 0 | 0 | 0 | CE3Bi | 1 | 1 | 0 | 1 | 0 | 1 |
| | 4 | 0 | 0 | 0 | 0 | CE3Bi | 1 | 1 | 0 | 1 | 0 | 1 |
| | 5 | 1 | 1 | 1 | 1 | CE3Ai | 0 | 0 | 0 | 1 | 0 | 1 |
| | 6 | 0 | 1 | 0 | 1 | CE3Ai | 0 | 0 | 0 | 1 | 0 | 1 |
| | 7 | 1 | 0 | 0 | 1 | CE3Ai | 1 | 1 | 0 | 1 | 0 | 1 |
| | 8 | 0 | 0 | 0 | 1 | CE3Ai | 1 | 1 | 0 | 1 | 0 | 1 |
| 4CE | 1 | 1 | 1 | 1 | 0 | CE3Ci | 0 | 0 | 0 | 1 | 1 | 1 |
| | 2 | 0 | 1 | 0 | 0 | CE3Ci | 0 | 0 | 0 | 1 | 1 | 1 |
| | 3 | 1 | 0 | 0 | 0 | CE3Di | 1 | 0 | 0 | 1 | 1 | 1 |
| | 4 | 0 | 0 | 0 | 0 | CE3Di | 1 | 0 | 0 | 1 | 1 | 1 |
| | 5 | 1 | 1 | 1 | 1 | CE3Ai | 0 | 0 | 0 | 1 | 1 | 1 |
| | 6 | 0 | 1 | 0 | 1 | CE3Ai | 0 | 0 | 0 | 1 | 1 | 1 |
| | 7 | 1 | 0 | 0 | 1 | CE3Bi | 1 | 0 | 0 | 1 | 1 | 1 |
| | 8 | 0 | 0 | 0 | 1 | CE3Bi | 1 | 0 | 0 | 1 | 1 | 1 |

F I G. 4 9

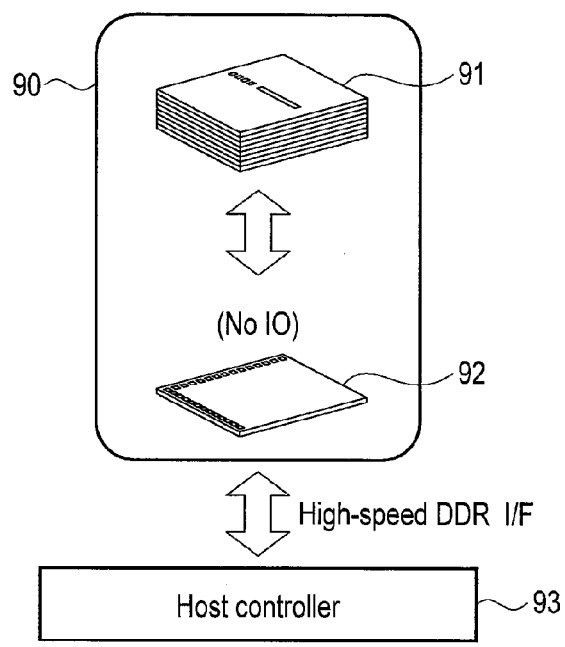
F I G. 5 0
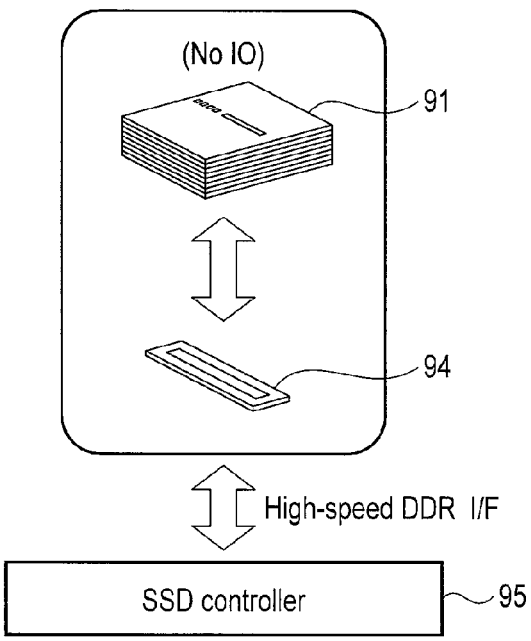
F I G. 5 1

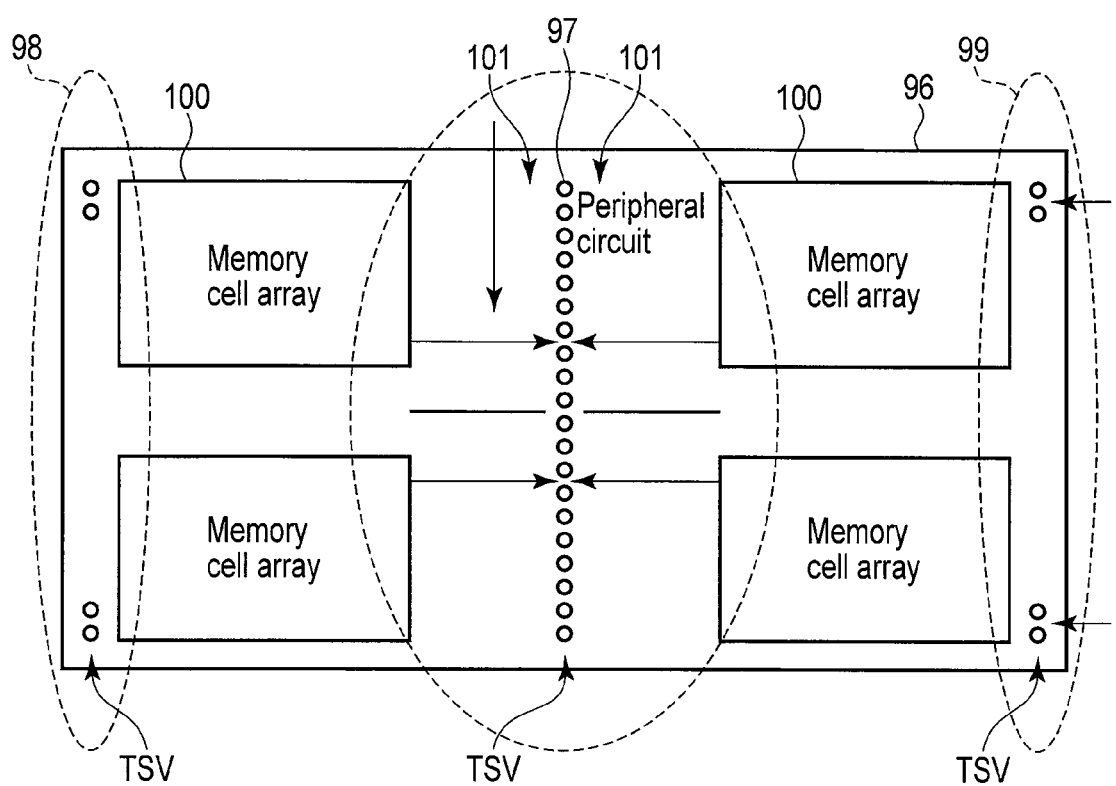
F I G. 52

SEMICONDUCTOR DEVICE HAVING STACKED CHIPS

CROSS-REFERENCE TO RELATED APPLICATIONS

This application is based upon and claims the benefit of priority from Japanese Patent Application No. 2012-196392, filed Sep. 6, 2012, the entire contents of which are incorporated herein by reference.

FIELD

Embodiments described herein relate generally to a semiconductor device that enables selecting stacked chips.

BACKGROUND

In NAND flash memories, a chip stack technology for stacking chips and accommodating them in one package has been conventionally adopted. In this technology, the chips are arranged in a staircase pattern, and these chips are connected to a package substrate or a lead frame by wire bonding.

In recent years, for the purpose of increasing a chip size that enables accommodation in a package or improving characteristics of a device, vertically stacking chips is examined. In this case, since a position of a terminal connected with each chip is the same in the stacked chips, how the stacked chips are decoded and selected is a subject. Therefore, a semiconductor device that enables selecting stacked chips is demanded.

BRIEF DESCRIPTION OF THE DRAWINGS

FIG. 1 is a perspective view showing a semiconductor device using through silicon vias (TSVs) to which this embodiment is applied;

FIG. 2 is a cross-sectional view showing the semiconductor device using the TSVs to which this embodiment is applied;

FIG. 3 is a cross-sectional view showing a first embodiment where four chips are stacked;

FIG. 6 is a circuit diagram showing a second example of the selection circuit depicted in FIG. 3;

FIG. 7 is a circuit diagram showing a third example of the selection circuit depicted in FIG. 3;

FIG. 9 is a circuit diagram showing a fifth example of the selection circuit depicted in FIG. 3;

FIG. 10 is a circuit diagram showing a sixth example of the selection circuit depicted in FIG. 3;

FIG. 13 is a cross-sectional view showing a second embodiment;

FIG. 16 is a cross-sectional view showing a third modification of the second embodiment;

FIGS. 17A, 17B, 17C, and 17D are cross-sectional views each showing a semiconductor device according to a third embodiment;

FIGS. 18A, 18B, 18C, and 18D are cross-sectional views each showing a first modification of the third embodiment;

FIGS. 19A, 19B, 19C, 19D, 19E, 19F, 19G, 19H, 19I, 19J, 19K, 19L, 19M, 19N, 19O, and 19P are views each showing a second modification of the third embodiment that depicts an arithmetic operation result of chip selection;

FIGS. 20A, 20B, 20C, 20D, and 20E are cross-sectional views each showing a third modification of the third embodiment;

FIG. 23 is a circuit diagram showing an example of a redundancy control circuit depicted in each of FIG. 21 and FIG. 22;

FIG. 24 is a view for explaining an operation in FIG. 23;

FIG. 26 is a cross-sectional view showing a first modification of the fourth embodiment;

FIG. 29 is a cross-sectional view showing a fourth modification of the fourth embodiment;

FIG. 32 is a cross-sectional view showing a seventh modification of the fourth embodiment;

FIG. 34 is a cross-sectional view showing a ninth modification of the fourth embodiment;

FIG. 35 is a cross-sectional view showing a tenth modification of the fourth embodiment;

FIG. 36 is a cross-sectional view showing an 11th modification of the fourth embodiment;

FIG. 38 is a cross-sectional view showing a 13th modification of the fourth embodiment;

FIGS. 39A and 39B are views for explaining a fifth embodiment;

FIG. 40 is a view specifically showing an operation in FIG. 39A;

FIG. 41 is a view specifically showing an operation in FIG. 39B;

FIG. 42 is a circuit diagram showing an example of a plane selection circuit;

FIG. 43 is a view for explaining an operation in FIG. 39B;

FIG. 44 is a view showing a variation of the operation in FIG. 39B;

FIG. 45 is a view showing a case where eight chips are decoded by wire bonding;

FIG. 46 is a circuit view showing a sixth embodiment;

FIG. 47 is a view for explaining an operation of the sixth embodiment;

FIG. 48 is a view for explaining an operation different from that in FIG. 47;

FIG. 49 is a view for explaining an operation different from those in FIGS. 47 and 48;

FIG. 50 is a view showing a system to which each of the first to sixth embodiments is applied;

FIG. 51 is a view showing a system to which each of the first to sixth embodiments is applied; and FIG. 52 is a view showing an arrangement example of TSVs.

DETAILED DESCRIPTION

Figure 4:
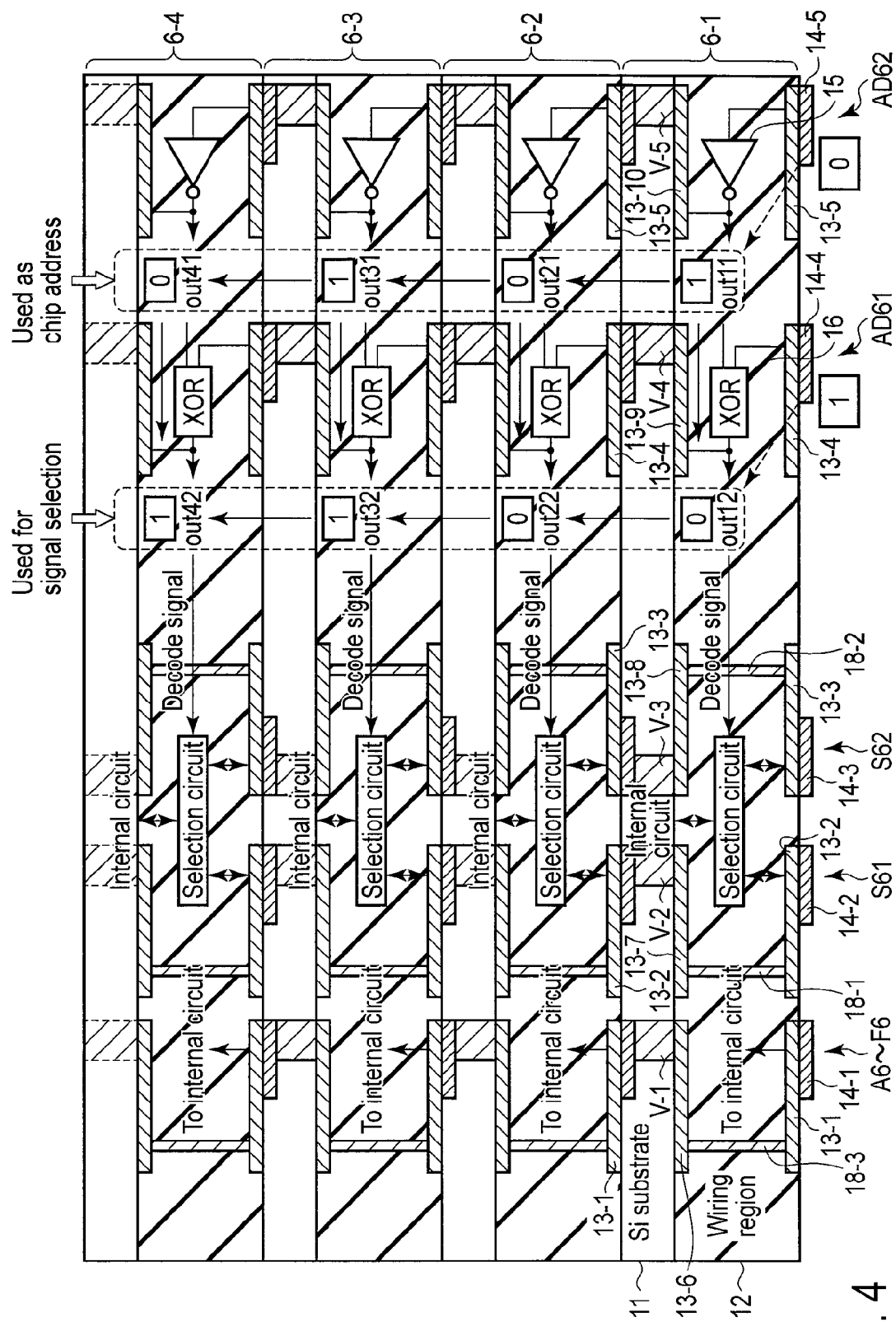
FIG. 4 is a cross-sectional view showing another operation state of FIG. 3.

In general, according to one embodiment, a semiconductor device includes chips and a first selection circuit. Each of the chips has at least first and second vias through each chip from a front surface of the chip to a back surface of the chip for transmitting at least first and second address signals, these chips are stacked to be electrically connected via the first and second vias. The first selection circuit is provided in each chip, includes a logic circuit that selects a chip based on at least the first and second address signals, and supplies a result of operating the first and second address signals to the subsequent chip.

The embodiment will now be described hereinafter with reference to the drawings. Throughout the drawings, like reference numerals denote like parts.

According to the conventional technology, in case of stacking and assembling chips, the stacked chips having the same configuration are arranged in a staircase pattern to enable exposing bonding pads. The bonding pads of the respective chips are connected by wire bonding. For example, when four chips are stacked, the four chips are selectively activated by two chip enable signals CE11 and CE12 and an address signals ADD1. Here, each chip has a bonding pad to which the two chip enable signals CE11 and CE12 and the address signal ADD1 are input. For example, the chip enable signal CE11 is connected to two upper chips in the four chips in common by a bonding wire, and the chip enable signal CE12 is connected to two lower chips in the four chips in common by a bonding wire. Furthermore, the address signal ADD1 is connected to one of the two chips selected by the chip enable signal CE11 or CE12 in common by a bonding wire. In this manner, to enable appropriately supplying the chip enable signals CE11 and CE12 and the address signal ADD1 to the respective chips, connecting positions of the wire bonding are changed.

A through silicon via (TSV) has been recently developed, and signals can be transmitted between chips stacked by using the TSVs.

FIGS. 1 and 2 show a semiconductor device in which chips having the same configuration are stacked by using TSVs to which this embodiment is applied. In this case, for example, four chips 3-1 to 3-4 are not shifted in the staircase pattern as different from the conventional example, and the respective chips 3-1 to 3-4 are stacked on a package substrate 10 in a vertical direction and connected by using TSVs V1 arranged in the vertical direction. In case of the wire bonding, the same chips are shifted and stacked in the staircase pattern, then the wire bonding for supplying the chip enable signals CE11 and CE12 and the address signal ADD1 is selectively changed over, and chips to be operated can be selected. However, when the chips are vertically stacked, since all the chips are connected via the TSVs that allow transmission of the same signal, selecting arbitrary chips is difficult.

First Embodiment

FIG. 3 is a view of a semiconductor device according to a first embodiment showing a decode circuit (a chip selection circuit) which decodes an input address signal and selects each arbitrary chip.

The first embodiment presents an example where four chips 6-1 to 6-4 are stacked. Each of the chips 6-1 to 6-4 has a semiconductor substrate 11 and a wiring region 12 provided on the semiconductor substrate 11. For example, the wiring region 12 is a region where metal wiring lines such as a bit line are arranged, and terminals 13-1 to 13-5 that can be electrically connected to the outside (including other chips) are formed on the uppermost wiring layer provided on the opposite side of the semiconductor substrate 11. For example, transistors are arranged on an upper surface of the semiconductor substrate 11, and each arithmetic operation circuit such as an inverter circuit or an XOR circuit is formed. Here, the upper surface of the semiconductor substrate 11 is a side where the wiring region 12 is formed. In FIG. 3, in each of the chips 6-1 to 6-4, the semiconductor substrate 11 is provided on the upper side, the wiring region 12 is provided on the lower side, and these members are stacked in this state, but a direction of each chip may be inverted. Signals may be input to or output from each chip through a front surface or a back surface (a semiconductor substrate side) of each chip. The wiring line 12 has wiring lines or non-illustrated vias arranged thereon, and these members are insulated through insulating films.

In this embodiment, the lower side of the wiring line 12 in the drawing will be referred to as one surface, and the upper side of the same will be referred to as the other surface. The lower side of the semiconductor substrate 11 in the drawing will be likewise referred to as one surface, and the upper side of the same will be referred to as the other surface. Since the chips 6-1 to 6-4 have the same configuration, the configuration of the chip 6-1 will be described.

Wiring layers (not shown) are arranged on the wiring region 12, the terminals 13-1 to 13-5 are arranged on the uppermost wiring layer on the one surface side of the wiring region 12. Further, on the other surface side of the wiring region 12, wiring layers 13-6 to 13-10 are arranged on the lowermost layer. For example, the wiring layers 13-6 to 13-10 are wiring layers that serve as gate electrodes of transistors. Furthermore, bonding layers (e.g., bumps) 14-1 to 14-5 for electrically connecting, e.g., the chip 6-1 to the outside (including the other chips 6-2 to 6-4) are arranged on the terminals 13-1 to 13-5, respectively. In the semiconductor substrate 11, TSVs V-1 to V-5 are formed. One end of each of the TSVs V-1 to V-5 is exposed on the other surface of the semiconductor substrates 11 and can be electrically connected to the outside (including the other chips 6-2 to 6-4). Moreover, the other end of each of the TSVs V-1 to V-5 is connected to each of the wiring layers 13-6 to 13-10. The wiring layers of the stacked chips are connected through these TSVs V1 to V-5. That is, the wiring layers 13-6 to 13-10 of the chip 6-1 are connected to the terminals 13-1 to 13-5 (the bonding layers 14-1 to 14-5) of the chip 6-2 through the TSVs V-1 to V-5 of the chip 6-1.

It is to be noted that the TSVs are also formed in the uppermost chip 6-4, but these TSVs are not used, and hence they can be omitted. Although TSVs may be shown in a chip that is not connected to anything, e.g., in the uppermost wiring layer in subsequent drawings, these TSVs may be likewise omitted. As a result, a process of forming the TSVs can be omitted, and a semiconductor device can be manufactured at a low price.

The wiring layers 13-6 to 13-10 are used on one surface of the semiconductor substrate 11, and a logic circuit, including an inverter circuit 15, an exclusive OR circuit (which will be referred to as an XOR circuit hereinafter) 16, and a selection circuit 17, are formed. It is to be noted that these circuits are shown in the wiring region 12 in FIG. 3 and others for the convenience's sake.

The inverter circuit 15 has an input end electrically connected to the wiring layer 13-5 and an output end electrically connected to the wiring layer 13-10. The wiring layer 13-10 is connected to the wiring layer 13-5 of the chip 6-2 through the via V-5. Therefore, the inverter circuits in the respective chips are connected in series through the TSVs.

Additionally, an output end of the inverter circuit 15 is connected to one input end of the XOR circuit 16. The other input end of this XOR circuit 16 is electrically connected to the wiring layer 13-4, an output end of the same is electrically connected to the wiring layer 13-9. The wiring layer 13-9 is electrically connected to the wiring layer 13-4 of the chip 6-2 through the via V-4. Therefore, one input end of the XOR circuit 16 in each chip receives an output signal from the inverter circuit 15 in this chip, and the other input end of the same receives a signal supplied to the wiring layer 13-4.

Further, the output end of the XOR circuit 16 is electrically connected to a control signal input end of the selection circuit 17. First and second input/output ends of the selection circuit 17 are electrically connected to the wiring layers 13-2 and 13-3, and an output end of the same is electrically connected to a non-illustrated internal circuit formed in the semiconductor substrate 11. The internal circuit has, e.g., an NAND flash memory and a control circuit of the NAND flash memory (which may be referred to as a "peripheral circuit" in some cases).

The terminals 13-2 and 13-3 of the chip 6-1 and the wiring layers 13-7 and 13-8 are electrically connected to each other TSVs 18-1 and 18-2 formed in the wiring region 12. Therefore, the wiring layers 13-2 and 13-3 of a chip different from the wiring layers 13-2 and 13-3 of a given chip are electrically connected to each other through the vias 18-1 and 18-2, the wiring layers 13-7 and 13-8, and the TSVs V-2 and V-3.

Further, the terminal 13-1 and the wiring layer 13-6 of the chip 6-1 are connected through a via 18-3 formed in the wiring region 12. Therefore, the terminal 13-1 and the wiring layer 13-6 of each chip are electrically connected through the via 18-3 and the TSV V-1.

Furthermore, the TSVs V1 to V3 of the chip 6-1 and the terminals 13-1 to 13-3 of the chip 6-2 are electrically connected through bumps 14-1 to 14-3. That is, signals supplied to the terminals 13-1 to 13-3 of the chip 6-1 are directly input to the terminals 13-1 to 13-3 of the chip 6-2 without being subjected to a logical operation. Since the chip 6-3 and the subsequent chips have the same configuration as that of each of the chips 6-1 and 6-2, signals input to the terminals 13-1 to 13-3 of the chip 6-1 are directly input to the terminals 13-1 to 13-3 of the chip 6-4 without being subjected to a logical operation.

In the above-described configuration, signals A6 to F6 (FIG. 3 shows one signal only) are common to the four chips. The signals A6 to F6 are supplied to the terminal 13-1. Therefore, the terminals 13-1, the wiring layers 13-6, the vias 18-3, and the TSVs V-1 are provided in a plural manner in accordance with the signals A6 to F6.

Each of signals S61 and S62 is a signal input from the outside of the chip, a signal output from the same, or an input/output common signal (e.g., a chip enable CE signal). The signals S61 and S62 are input or output through the terminals 13-2 and 13-3.

Address signals AD61 and AD62 are signals used for selecting one of the chips 6-1 to 6-4, and they are supplied to the terminals 13-4 to 13-5 from the outside of the chip, respectively.

A description will now be given as to an operation when the address signals AD61="0" and AD62="0" are applied to the terminals 13-4 and 13-5 of the chip 6-1.

The address signal AD62="0" applied to the terminal 13-5 is inverted by an inverter circuit 15, and an output signal out11 from the inverter circuit 15 becomes "1". Since the inverter circuits 15 of the respective chips are connected in series, output signals out21 to out41 from the inverter circuits 15 of the chips 6-2 to 6-4 become "0", "1", and "0", respectively.

On the other hand, the address signal AD61="0" applied to the terminal 13-4 is supplied to the XOR circuit 16 together with the output signal "1" from the inverter circuit 15. Therefore, an output signal out12 from the XOR circuit 16 becomes "1". The output signal out12 from the XOR circuit 16 is also supplied to the chip 6-2. Therefore, in the XOR circuit 16 of the chip 6-2, the same arithmetic operation is carried out. Then, since the same arithmetic operation is repeated in the chips 6-3 and 6-4, output signals out22, out32, and out42 from the XOR circuits 16 of the chips 6-2 to 6-4 become "1", "0", and "0". It is possible to select chips to which the signals S61 and S62 are applied can be selected from the chips 6-1 to 6-4 by utilizing this logical state.

In this example, although the address signals AD61 and AD62 are "0" and "0", when these values are changed, the logical state in the chip can be changed to vary a decode state of the chip.

FIG. 4 shows another operating state of FIG. 3 which is an example where the address signal AD61 is changed from "0" to "1". Based on this change, output signals out12 and out22 from the XOR circuits 16 in the chips 6-1 and 6-2 become "0", output signals out32 and out42 from the XOR circuits 16 in the chips 6-3 and 6-4 become "1", and the chips to which the signals S61 and S62 are applied can be changed.

That is, an address signal ADD1 that is input to a conventional bonding pad is generated as out11, out21, out31, and out41 from the input of the address signal AD62 by the inverter circuits 15. Likewise, the chip enable signals CE11 and CE12 input to the conventional bonding pads are input to S61 and 62 from the outside. The chip enables signals CE11 and CE12 can be selectively supplied to the respective chips by using signals generated as the output signals out12, out22, out32, and out42 of the respective XOR circuits 16 from the address signal AD61 and out11, out21, out31, and out41, and 13-2, 13-3, 18-1, 18-2, 13-7, and 13-8 and the selection circuit 17 prepared in each chip.

Furthermore, when a result obtained by performing an arithmetic operation to the address signals AD61 and AD62 is supplied to the subsequent chip, and signals for decoding the conventional address signal ADD1 and the chip enable signals CE11 and CE12 can be generated in each chip. That is, the conventional address signal ADD1 and the chip enable signals CE11 and CE12 can be arbitrarily generated by using the same arithmetic operation circuits (the inverter circuit 15 and the XOR circuit 16) in each chip. As a result, the circuits do not have to be changed in accordance with each chip, and a design efficiency can be improved. Here, although decoding when there are two chip enable signals CE has been described, if there is only one chip enable signal CE supplied from the outside, an address where the other chip enable signal CE is decoded can be used as a chip selection address.

Specific Example of Selection Circuit

First Example

Each of FIG. 5 to FIG. 11 shows a specific example of the selection circuit 17. The selection circuits 17 of the respective chips have the same configuration, and hence the selection circuit 17 of the chip 6-1 will now be described.

Figure 5:
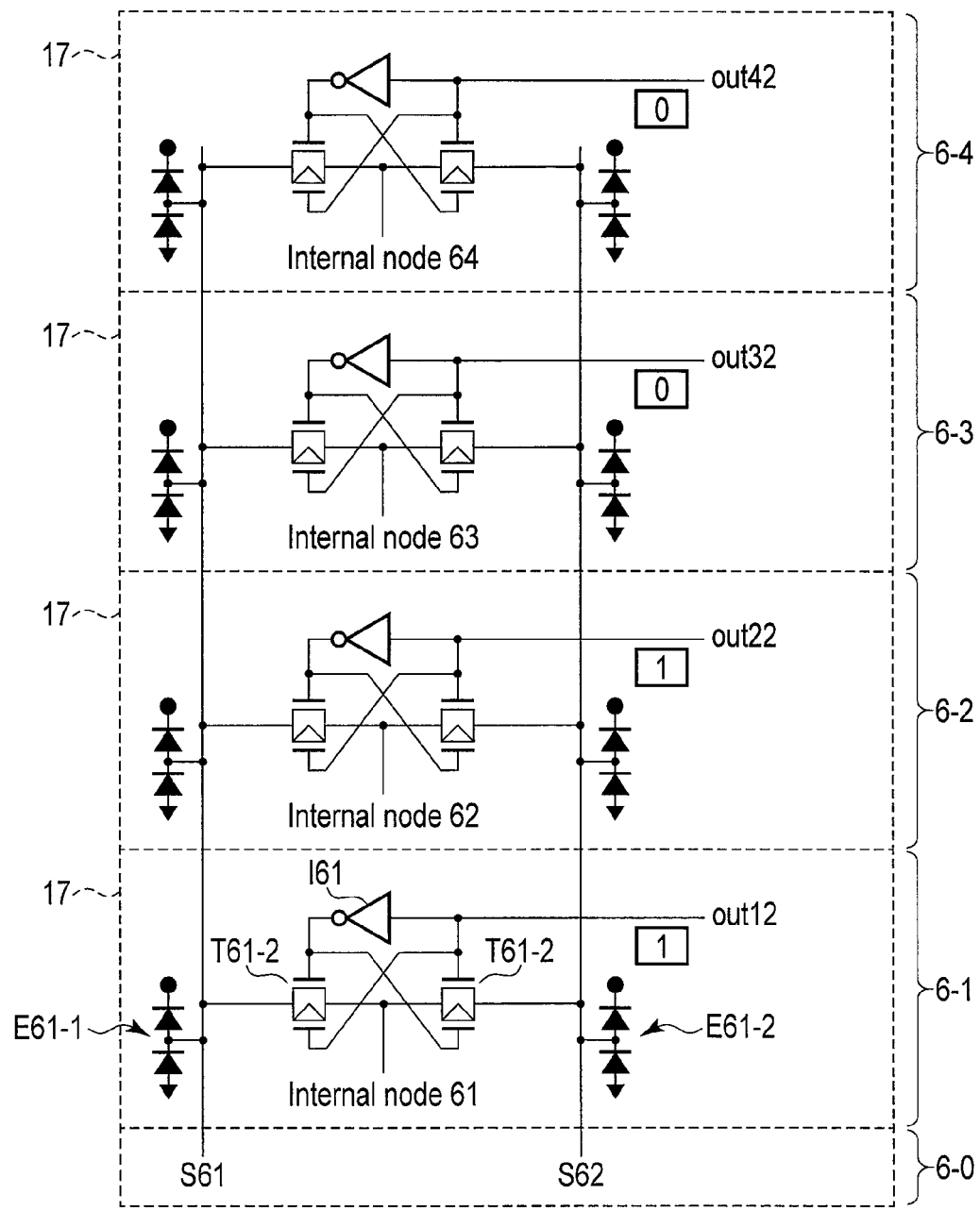
FIG. 5 is a circuit diagram showing a first example of a selection circuit depicted in FIG. 3.

FIG. 5 shows a first example of the selection circuit 17. In the first example, the selection circuit 17 is constituted of transfer gates T61-1 and T61-2 and an inverter circuit I61. The transfer gate T61-1 is connected between a node to which a signal S61 is supplied and an internal node 61, and the transfer gate T61-2 is connected between a node to which a signal S62 is supplied and the internal node 61. These transfer gates T61-1 and T61-2 are selected by an output signal out12 from the XOR circuit 16 as a chip selection signal. That is, the output signal out12 is supplied to a gate electrode of a P-channel MOS transistor (which will be referred to as a PMOS hereinafter) of the transfer gate T61-1 and a gate electrode of an N-channel MOS transistor (which will be referred to as an NMOS hereinafter) of the transfer gate T61-2, and an output signal out12 inverted by the inverter circuit I61 is supplied to a gate electrode of an NMOS constituting the transfer gate T61-1 and a gate electrode of a PMOS constituting the transfer gate T61-2.

When the signals out12 to out42 as chip selection signals are "1", "1", "0", and "0" from the lower chip 6-1 in the mentioned order as shown in FIG. 5, the transfer gates T61-2 are in an ON state and the transfer gates T61-1 are in an OFF state in the selection circuits 17 of the chips 6-1 and 6-2, and the transfer gates T61-1 are in the ON state and the transfer gates T6-2 are in the OFF state in the selection circuits 17 of the chips 6-3 and 6-4. Therefore, for example, when the signals S61 and S62 are "0" and "1", the signal "1" can be transferred to the internal node 61 of each of the chips 6-1 and 6-2, and the signal "0" can be transferred to the internal node 61 of each of the chips 6-3 and 6-4.

It is to be noted that, in each chip, protective elements E61-1 and E61-2 for a surge are connected to the node to which the signal S61 is supplied and the node to which the signal S62 is supplied. These protective elements E61-1 and E61-2 are arranged between, e.g., the selection circuit 17 and the TSV and protect the selection circuit 17 from a surge. Each of the protective elements E61-1 and E61-2 is constituted of, e.g., an N-type junction element or an npn bipolar element in the P-type semiconductor substrate 11 or a p-type junction element or a pnp bipolar element in an N-type well.

It is to be noted that, although each of FIG. 6, FIG. 7, FIG. 8, FIG. 9, FIG. 10, and FIG. 11 does not show the protective elements for the surge, the selection circuit 17 can be protected by adding the protective elements as required. It is needless to say that the protective elements can be omitted when they are not required, and a wiring capacity corresponding to each protective element connected to the TSV can be reduced.

Second Example

FIG. 6 shows a second example of the selection circuit 17. In the second example, the selection circuit 17 is constituted of NMOSN61-1, N61-2, and N61-3, and an inverter circuit I61. The NMOSN61-1 is connected between a node to which a signal S61 is supplied and an internal node 61, and the NMOSN61-2 is connected between a node to which a signal S62 is supplied and the internal node 61. A signal out12 as a chip selection signal is supplied to a gate electrode of the NMOSN61-2, and a signal obtained by inverting out12 by the inverter circuit I61 is supplied to a gate electrode of the NMOSN61-1. Therefore, one of the NMOSN61-1 and 61-2 are turned on by the signal out12.

Further, the NMOSN61-3 is connected between the internal node 61 and the ground. A gate electrode of the NMOSN61-3 is connected to an internal node 61a of the chip. This NMOSN61-3 is provided as required, and it can output information from each chip as signals S61 and S62 through the selected NMOSN61-1 or N61-2 by turning on the NMOSN61-3 in an arbitrary chip.

Furthermore, for example, an interface (IF) chip 6-0 may be provided to the chip 6-1. PMOSP60-1 and P60-2 can be provided to the IF chip 6-0. The PMOSP60-1 is connected between a node ST61 through which the signal S61 is transmitted and a node to which electric power Vdd is supplied, and the PMOSP60-2 is connected between a node ST62 through which the signal S62 is transmitted and a node to which the electric power Vdd is supplied. A charge signal is supplied to a gate electrode of each of the PMOSP60-1 and P60-2.

These PMOSP60-1 and P60-2 charge the nodes ST61 and ST62 (terminals 18-1 and 18-2) through which the signals S61 and S62 are transmitted based on the charge signals. That is, the PMOSP60-1 and P60-2 are activated (ON) before the NMOSN61-3 is turned on and charge the nodes ST61 and ST62 through which S61 and S62 are transmitted, and then the PMOSP60-1 and P60-2 are turned off. Thereafter, when the NMOSN61-3 of an arbitrary chip is turned on, information (whether "0" or "1") of the internal node 61 from the arbitrary chip can be taken to the nodes ST61 and ST62. For example, in a case where the information of the internal node 61 is "0", when the NMOSN61-3 of the chip 6-1 is turned on in a state shown in FIG. 6, an electric charge in the node ST62 is discharged through the NMOSM61-2 which is in the ON state, and the signal S62 as "0" and the signal S61 as "1" are taken out.

It is to be noted that the PMOSP60-1 and P60-2 can be activated while the NMOSN61-3 is in the ON state, and the information of the internal node 61 can be taken out as the signals S61 and S62. In this case, when the NMOSN61-3 is turned off, the nodes ST61 and ST62 are pulled up by the PMOSP60-1 and P60-2.

Third Example

FIG. 7 is an example where the selection circuit shown in FIG. 5 is combined with the NMOSN61-3 depicted in FIG. 6. When the CMOS is formed, a level of an internal node 61 of each chip can be raised to an internal power supply level. As a result, signals S61 and S62 can be accurately transmitted to a node 61a.

Fourth Example

Figure 8:
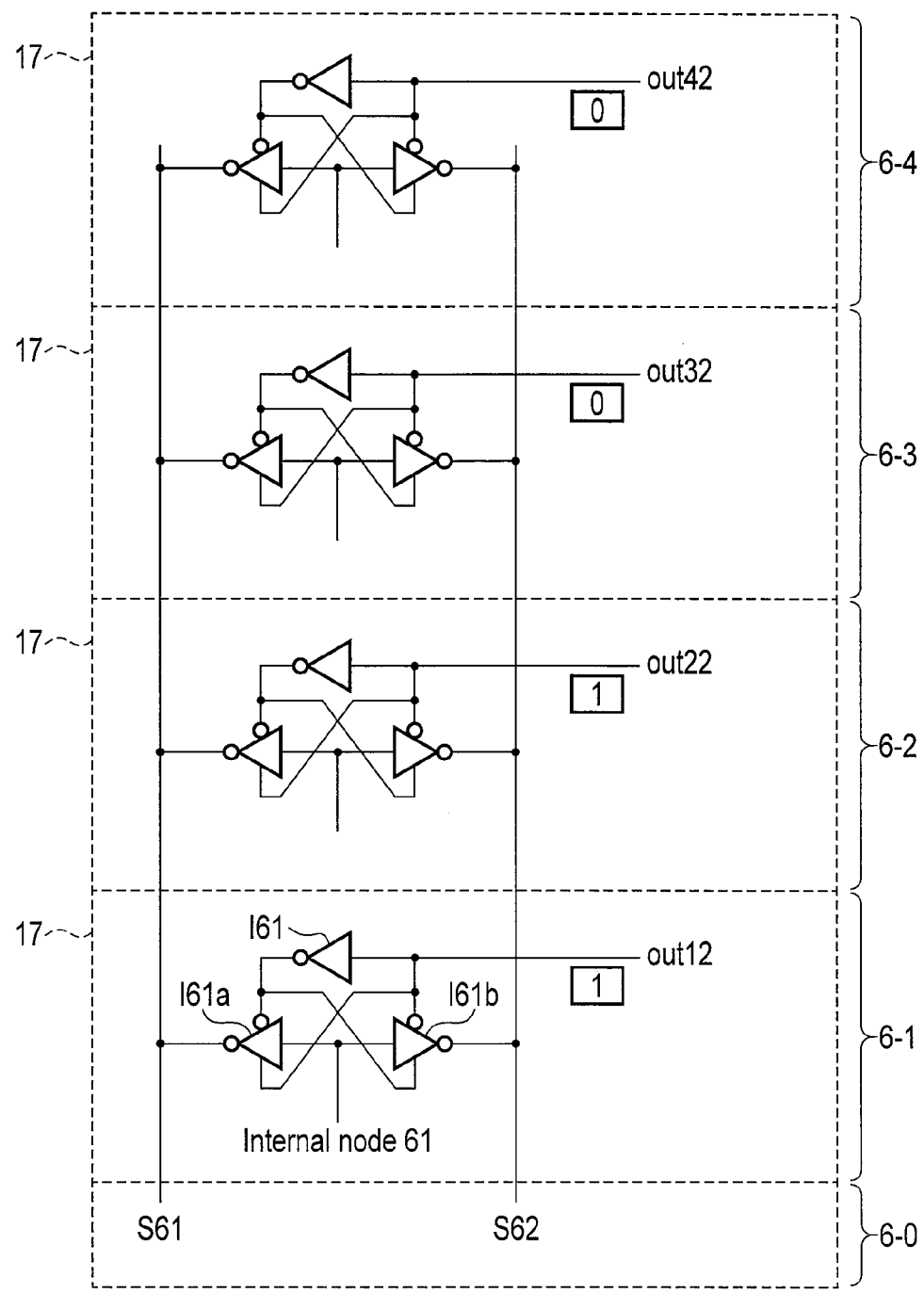
FIG. 8 is a circuit diagram showing a fourth example of the selection circuit depicted in FIG. 3.

FIG. 8 shows an example where the transfer gates T61-1 and T61-2 in FIG. 5 are substituted by clocked inverter circuits I61a and I61b. Input ends of the clocked inverter circuits I61a and I61b are connected to an internal node 61, and output ends of the clocked inverter circuits I61a and I61b are connected to nodes through which S61 and S62 are transmitted. A configuration shown in FIG. 8 is a circuit example when data in a chip is output as the signals S61 and S62. Buffering of the clocked inverter circuits I61a and I61b enables improving a drive capability. As a result, an operation of a semiconductor device can be accelerated.

Fifth Example

FIG. 9 shows a modification of FIG. 8 in which directions of clocked inverter circuits I61a and I61b are opposite to those of the circuits depicted in FIG. 8. In the fifth example, signals S61 and S62 are connected toward an internal node 61 of each chip. A configuration shown in FIG. 9 is a circuit example where the signals S61 and S62 are selectively supplied to the inside of the chip.

Sixth Example

FIG. 10 is a modification of FIG. 9 where the clocked inverter circuits I61a and I61b as the circuits depicted in FIG. 8 are substituted by NAND circuits N61a and N61b and output signals from the NAND circuits N61a and N61b are connected to an internal node N61c. A configuration depicted in FIG. 10 is also a circuit example when the signals S61 and S62 are selectively supplied to the inside of the chip. Buffering of the NAND circuits N61a and N61b can improve a drive capability. As a result, an operation of a semiconductor device can be accelerated. Furthermore, when the NAND circuits N61a and N61b are used, a selection circuit can be constituted with a fewer number of circuit elements.

Seventh Example

Figure 11:
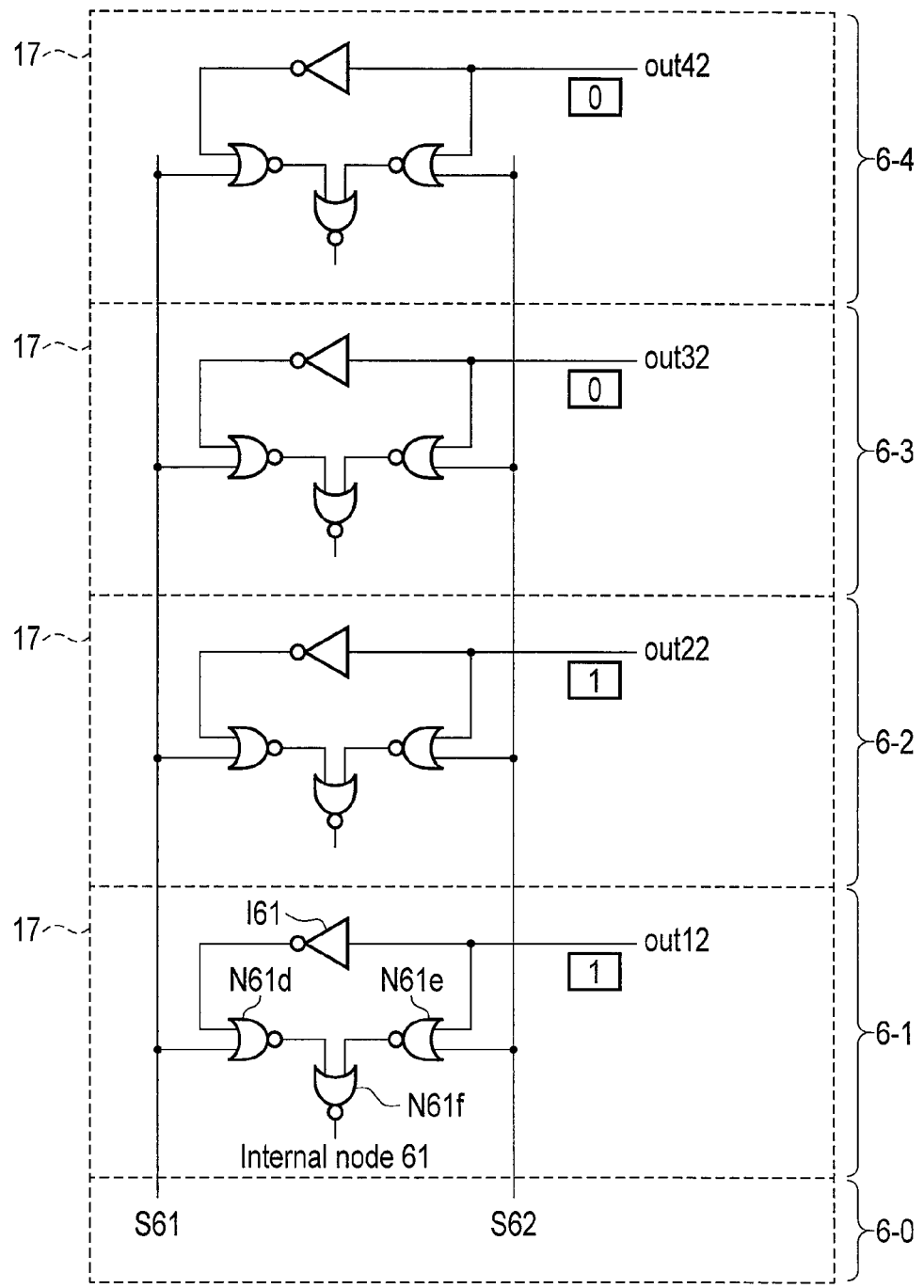
FIG. 11 is a circuit diagram showing a seventh example of the selection circuit depicted in FIG. 3.

FIG. 11 is a modification of FIG. 10 where the NAND circuits N61a, N61b, and N61c in FIG. 10 are substituted by NOR circuits N61d, N61e, and N61f and output signals from the respective NOR circuits N61d and N61e are connected to an internal node N61f. A configuration shown in FIG. 11 is also a circuit example when signals S61 and S62 are selectively supplied to the inside of a chip. Buffering of the NOR circuits N61d and N61e can improve a drive capability. As a result, an operation of a semiconductor device can be accelerated. Moreover, when the NOR circuits N61d and N61e are used, a selection circuit can be configured with a fewer number of circuit elements.

According to the first embodiment, the inverter circuit 15 that inverts the address signal AD62 and the XOR circuit 16 that performs a logical calculation of an output signal from the inverter circuit 15 and the address signal AD61 are provided in each chip, and the output signal from the inverter circuit 15 and an output signal from the XOR circuit 16 are transmitted to a subsequent chip through the TSVs V-4 and V-5. Therefore, a chip that should be activated can be assuredly decoded from the chips vertically stacked using the TSVs V-4 and V-5.

Additionally, since selection information used for selecting a chip does not have to be held, the circuit configuration can be simplified, and an increase in manufacturing cost can be suppressed.

Further, since the selection circuits 17 in the respective chips have the same configuration, an increase in manufacturing cost can be suppressed. Furthermore, design efficiency can be improved.

(Modification)

Figure 12:
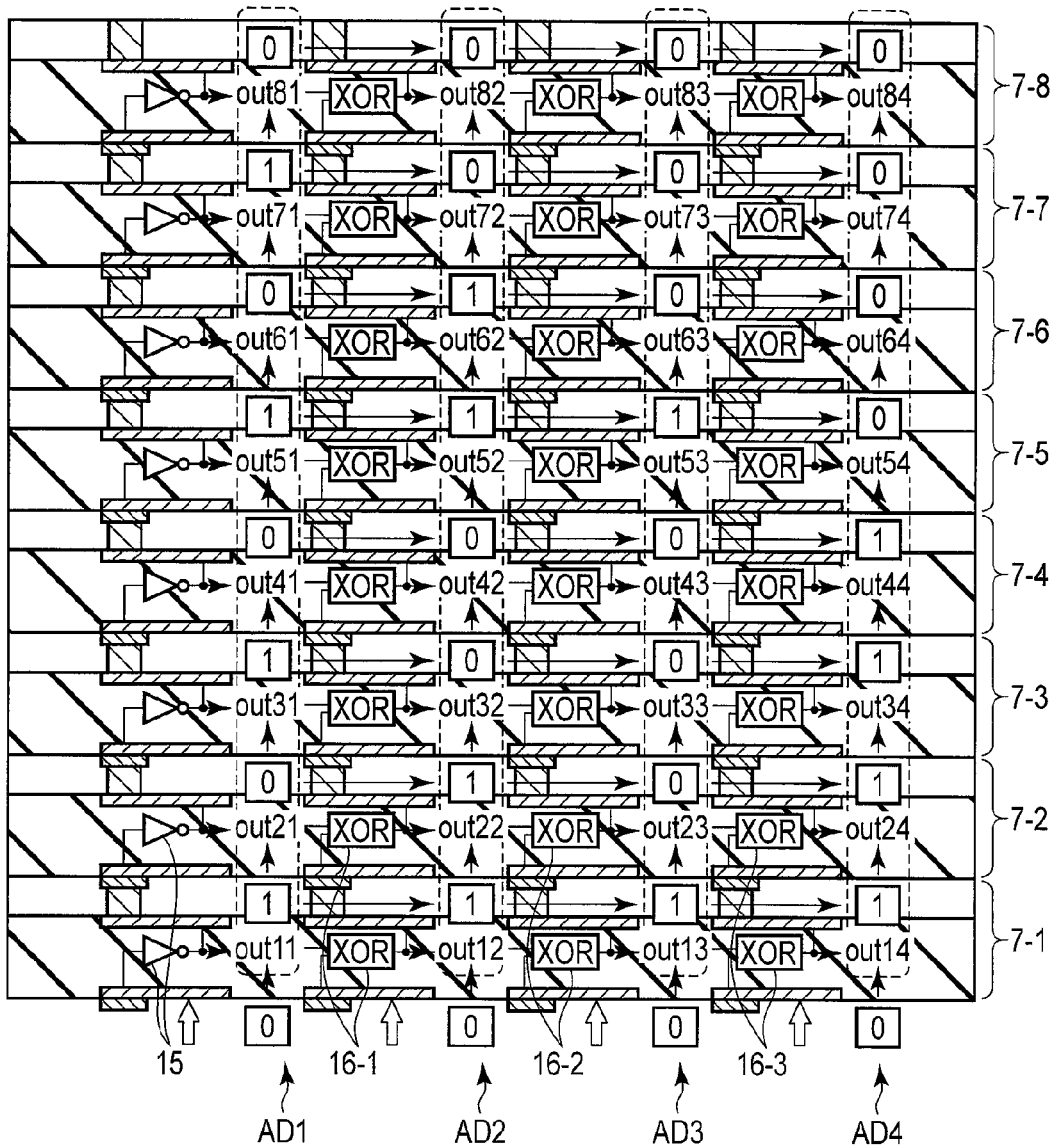
FIG. 12 is a cross-sectional view showing a modification of the first embodiment where eight chips are stacked.

FIG. 12 shows a modification of the first embodiment where eight chips are stacked.

In this case, four address signals AD1, AD2, AD3, and AD4 are used so that eight or more chips can be decoded. Since respective chips 7-1 to 7-8 have the same configuration, the chip 7-1 will be taken as an example and explained.

Essentially, the configuration is similar to the circuit configuration depicted in FIG. 3, and the number of the XOR circuits configured to perform the logical operation with respect to address signals increased in accordance with the number of stacked chips. That is, in the chip 7-1, an inverter circuit 15 and XOR circuits 16-1, 16-2, and 16-3 are arranged.

An address signal AD1 is supplied to the inverter circuit 15, and an output signal out11 from the inverter circuit 15 is supplied to the inverter circuit 15 of the subsequent chip 7-2 and also supplied to the XOR circuit 16-1 together with an address signal AD2. The XOR circuit 16-1 carries out the logical operation with respect to the address signal AD2 and the output signal out11.

An output signal out12 from the XOR circuit 16-1 is supplied to the XOR circuit 16-1 of the subsequent chip 7-2 and also supplied to the XOR circuit 16-2 together with an address signal AD3. The XOR circuit 16-2 performs the logical operation with respect to the address signal AD3 and the output signal out12.

An output signal out13 from the XOR circuit 16-2 is supplied to the XOR circuit 16-2 of the subsequent chip 7-2 and also supplied to the XOR circuit 16-3 together with an address signal AD4. The XOR circuit 16-3 carries out the logical operation with respect to the address signal AD4 and the output signal out13.

An output signal out14 from the XOR circuit 16-3 is supplied to the XOR circuit 16-3 of the subsequent chip 7-2 and also supplied to a non-illustrated selection circuit as a chip selection signal.

FIG. 12 shows a decoding result when the address signals AD1, AD2, AD3, and AD4 are all "0".

According to the modification, even when the number of stacked chips is increased, the chips can be decoded by increasing the number of the XOR circuits configured to perform the logical operation.

Second Embodiment

FIG. 13 shows a semiconductor device according to the second embodiment configured to decode an arbitrary chip.

According to the second embodiment, when a pattern of a terminal of each chip or a pattern of a connection layer such as a bump is changed, signals S81 and S82 and address signals AD81, AD82, and AD83 are selectively supplied into each chip, thereby decoding an arbitrary chip. That is, like the first embodiment, the wiring configuration is changed without using the logic circuit configured to select a chip, whereby a chip can be selected.

First, a common configuration of chips 8-1 to 8-4 will be explained by using the chip 8-1. Terminals 21-1 to 21-6 are arranged on one surface of the chip 8-1. One end of each of TSVs 22-1 to 22-6 is connected to each of these terminals 21-1 to 21-6. The TSVs 22-1 to 22-6 pierce through a wiring layer 12 and a semiconductor substrate 11, and the other end of each of the TSVs 22-1 to 22-6 is exposed from the other surface of the semiconductor substrate 11. It is to be noted that the TSVs 22-1 to 22-6 may be connected by forming through holes from the terminals 21-1 to 21-6 to the other surface of the semiconductor substrate 11 and filling the through holes with a conductor.

Further, on one surface of the chip 8-1, a wiring layer 23-1 is arranged between the terminals 21-2 and 21-3, a wiring layer 23-2 is arranged between wiring layers 21-4 and 21-5, and a wiring layer 23-3 is arranged near the wiring layer 21-6.

An NMOS N25 is arranged on one surface side of the semiconductor substrate 11 and, for example, the lowermost wiring layer is used as a gate electrode. One end of the NMOS N25 is electrically connected to the wiring layer 23-3, and the other end of the same is grounded. A signal having a logical level "1" is supplied to the gate electrode of this NMOS N25, and the NMOS N25 is ON when the chip 8-1 operates. This NMOS N25 is a high-resistance transistor, i.e., a transistor having a weak drive capability, and an operation of the chip is hardly affected even if a leak current is generated through this transistor.

It is to be noted that signals A8 to F8 are signals that are supplied to four chips in common, and these signals are supplied to the wiring layer 21-1. In FIG. 13, only one wiring layer 21-1 is shown for convenience's sake, but the plurality of wiring layers 21-1 are actually present.

The signals S81 and S82 are signals input from the outside of the chip, signals to be output, or input/output common signals. The signals S81 and S82 are input or output to or from the respective chips 8-1 to 8-4 via the wiring layers 21-2 and 21-3 and the TSVs 22-4 and 22-5. The address signals AD81, AD82, and AD83 are signals used for decoding the chips 8-1 to 8-4, and they are supplied to the wiring layers 21-4, 21-5, and 21-6.

To generate signals for decoding the chip, as each of the signals AD81 and AD82, one of logic levels "1" and "0" is supplied from the outside. Further, as the signal AD83, a logic level "1" is supplied from the outside.

Furthermore, since a further chip is not stacked on the chip 8-4, the TSV can be omitted. In the chip 8-4, when the TSV is indicated by a broken line, this means that the TSV can be omitted. In the subsequent drawings, the meaning of the TSV indicated by the broken line is the same. As a result, a process of forming the TSV can be omitted, and a semiconductor device can be rapidly manufactured.

The second embodiment includes two different chip address selection methods. The first chip address selection method is a system using the address signals AD81 and AD82, and the second chip address selection method is a system using the address signal AD83. It is to be noted that the two different chip address selection methods are shown for the convenience's sake, each chip having one of the chip address selection methods can suffice. Moreover, according to both the first and second chip address selection methods, each chip is decoded by changing connection states between the wiring layers 21-2 to 21-6 and the wiring layers 23-1 to 23-3. The connection states can be changed by varying, e.g., a mask pattern of a wafer at a time of forming the wiring layers. It is to be noted that the wiring layers 23-2 and 23-3 are connected to the logic circuits (the inverter circuit 15, the XOR circuit 16, and others) according to the first embodiment.

(First Chip Address Selection Method)

According to the first chip address selection method, in case of the chip 8-1, the wiring layer 21-2 is, connected to the wiring layer 23-1 through a wiring layer 24-1, and the wiring layer 21-4 is connected to the wiring layer 23-2 through a wiring layer 24-2. Therefore, the signal S81 can be input or output with respect to the logic circuit, and the address signal AD81 ("1") is supplied to the logic circuit.

In case of the chip 8-2, the wiring layer 21-2 is connected to the wiring layer 23-1 through the wiring layer 24-1, and the wiring layer 21-5 is connected to the wiring layer 23-2 through a wiring layer 24-2. Therefore, the signal S81 can be input or output with respect to an internal circuit, and the address signal AD82 ("0") is supplied to the internal circuit.

In case of the chip 8-3, the wiring layer 21-3 is connected to the wiring layer 23-1 through the wiring layer 24-1, and the wiring layer 21-5 is connected to the wiring layer 23-2 through the wiring layer 24-2. Therefore, the signal S82 can be input or output with respect to an internal circuit, and the address signal AD81 ("1") is supplied to the internal circuit.

In case of the chip 8-4, the wiring layer 21-3 is connected to the wiring layer 23-1 through the wiring layer 24-1, and the wiring layer 21-5 is connected to the wiring layer 23-2 through the wiring layer 34-2. Therefore, the signal S82 can be input or output with respect to an internal circuit, and the address signal AD82 ("0") is supplied to the internal circuit.

(Second Chip Address Selection Method)

On the other hand, according to the second chip address selection method, the NMOS N25 having a weak drive capability is connected to the wiring layer 23-3 of each chip in a conductive state at a time of an operation of the chip 8-1. The wiring layers 21-6 and the wiring layer 23-3 of the chips 8-1 and 8-3 are connected through the wiring layer 24-3, and the wiring layer 21-6 and the wiring layer 23-3 of the chips 8-2 and 8-4 are not connected to each other. Further, a logic "1" is supplied from the outside as the address signal AD83 that is supplied to the wiring layer 21-6.

In this state, in case of each of the chips 8-1 and 8-3 having the wiring layers 21-6 and 23-3 connected to each other through the wiring layer 24-3, "1" is supplied to the logic circuit of the chips through the wiring layers 24-3 and 23-3. At this time, although the NMOS N25 is ON, since the NMOS N25 is a transistor having a weak drive capability, "1" is supplied to the logic circuit of each chip. Additionally, in case of each of the chips 8-2 and 8-4 in which the wiring layers 21-6 and 23-3 are not connected to each other, a potential in the wiring layer 23-3 is subtracted by the NMOS N25 and becomes substantially equal to the ground voltage. As a result, the signal supplied to the wiring layer 23-3 becomes "0", and "0" is supplied to internal circuits of the chips 8-2 and 8-4 through the wiring layer 23-3.

In case of the first chip address selection method for switching wiring lines of the wiring layers 21-4 and 21-5 and the wiring layer 23-2, the two address signals AD81 and AD82 are used, and "1" and "0" are generated in each chip.

However, in case of the second chip address selection method for connecting the wiring layer 21-6 to the wiring layer 23-3 connected to the NMOS N25 through the wiring layer 24-3, "1" and "0" can be generated in each chip by using one address signal AD83.

It is to be noted that, at a time of decoding each chip address in a semiconductor device in which five or more chips are stacked, the first chip address selection method may be used more than once, or the second chip address selection method may be used more than once.

Moreover, the selection circuit 17 shown in each of FIG. 3 to FIG. 11 can be applied to the second chip address selection method, and the signals S81 and S82 can be selectively switched by using a signal of the wiring line 23-3.

According to the first chip address selection method of the second embodiment, a signal, e.g., an address signal is selected by switching connection established between one of the two wiring layers to which a signal, e.g., an address signal is transmitted and the wiring layer connected to an internal circuit. Therefore, the logic circuit does not have to be provided, and hence a circuit configuration can be simplified.

Additionally, according to the second chip address selection method, the wiring layer to which an address signal is supplied and the wiring layer that is constantly in the ON state and connected to a transistor with a low drive capability are selectively connected. Therefore, chips can be selected by using one address signal.

(First Modification)

Figure 14:
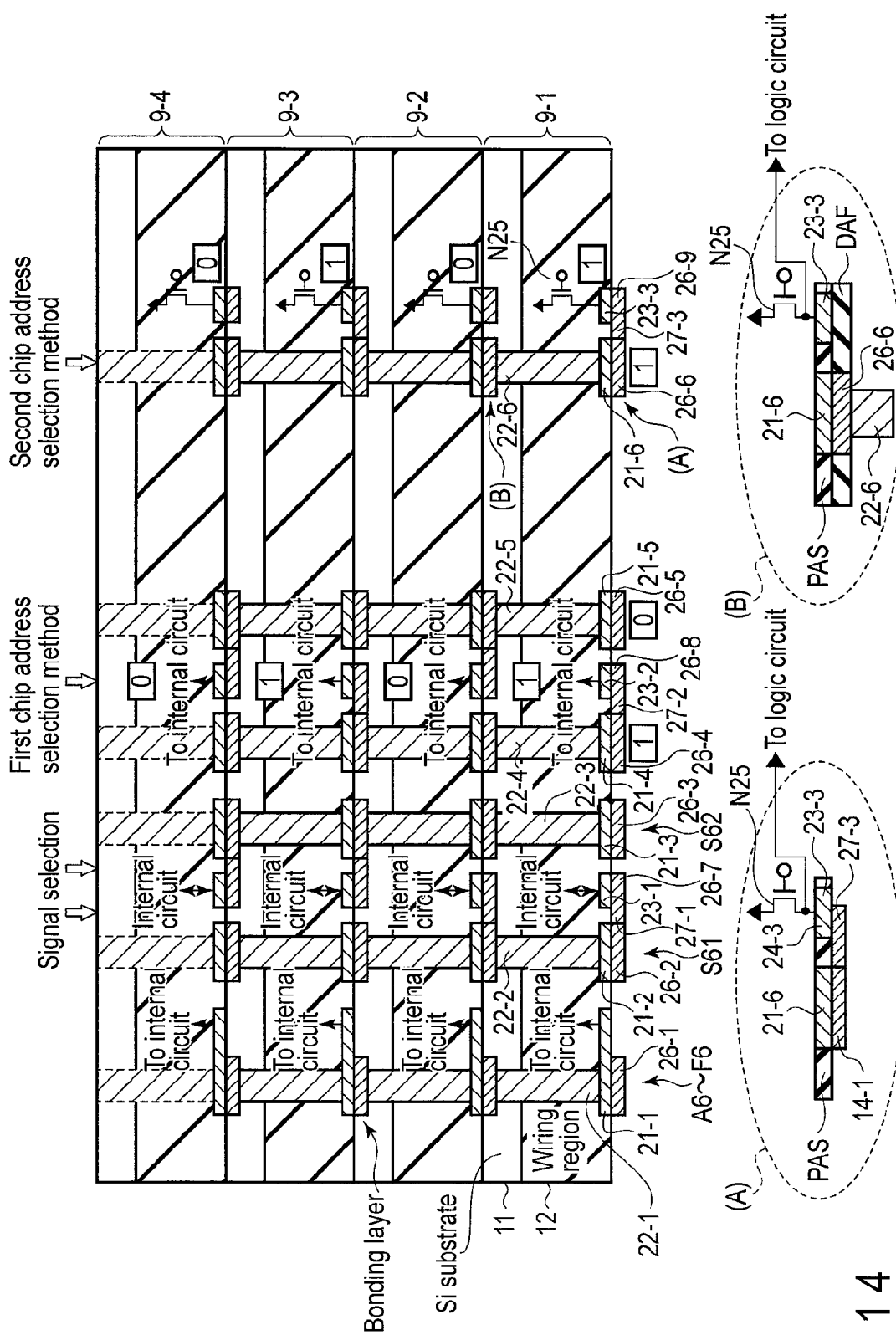
FIG. 14 is a cross-sectional view showing a first modification of the second embodiment.

FIG. 14 shows a first modification of the second embodiment. In case of changing selection of a chip address in FIG. 13, a mask pattern for forming the wiring layer is varied.

On the other hand, the modification depicted in FIG. 14 is an example where selection is changed by varying a bonding state of a bonding layer in the bonding layer that connects chips, and this modification is essentially the same as FIG. 13.

In this modification, wiring layers 23-1 to 23-3 are exposed on one surface of a chip 9-1. That is, the wiring layers 23-1 to 23-3 can be regarded as terminals.

That is, bumps 14-1 to 14-6 are provided on terminals 21-1 to 21-6 arranged in the respective chips 9-1 to 9-4.

In the chip 9-1, the terminals 21-2, 4, and 6 are connected to 23-2, 4, and 67 through connection layers 27-2, 4, and 6.

In other chips, as shown in the drawing, the connection layers are selectively connected through the connection layers.

According to the modification, a rewiring layer 27 connects the terminal 21 to the wiring layer 23. That is, a connecting relationship between connection layers to which signals S61 and S62 and an address signal are supplied and connection layers connected with internal layers is changed after manufacture of the chips. Therefore, like the second embodiment, a mask pattern of a wafer does not have to be changed, and hence a manufacturing cost can be reduced.

Additionally, the terminal 21 can be connected to the wiring layer 23 through the bump 14 in place of the rewiring layer 27. As a result, the rewiring layer does not have to be formed, and hence the cost can be further reduced.

(Second Modification)

Figure 15:
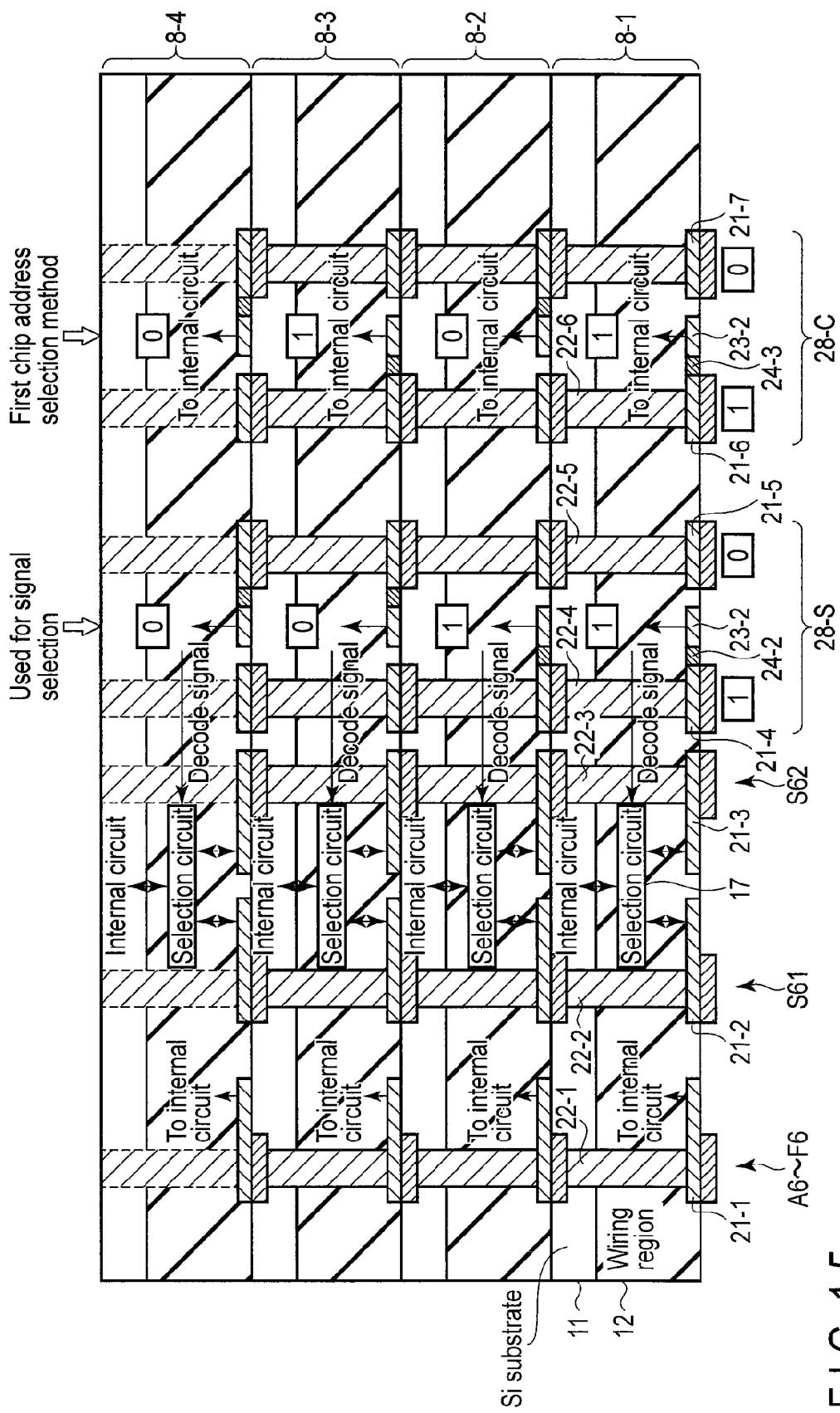
FIG. 15 is a cross-sectional view showing a second modification of the second embodiment.

FIG. 15 shows a second modification of the second embodiment. The second modification is obtained by applying the first chip address selection method to a logic circuit that generates a decode signal which controls a selection circuit.

In the second modification, in each of chips 8-1 to 8-4, a selection circuit 17 that selects signals S61 and S62 and an address selection unit 28-S that generates a control signal for the selection circuit 17 are provided. This address selection unit 28-S has the same configuration as that of the first chip address selection method, and it connects one of wiring layers 21-4 and 21-5 to a wiring layer 23-2 through a wiring layer 24-2. A position where the wiring layer 24-2 is formed is changed depending on a mask pattern.

The selection circuit 17 is controlled based on an output signal (the decode signal) from the address selection unit 28-S. Therefore, using the selection circuit 17 enables controlling input/output of the signals S61 and S62. Therefore, a logic circuit that generates the decode signal does not have to be provided, a circuit configuration can be simplified.

It is to be noted that FIG. 15 shows an address generation unit 28-C adopting the first chip address selection method. This address generation unit 28-C may have the same configuration as the first embodiment or a configuration based on the second chip address selection method.

(Third Modification)

FIG. 16 shows a third modification of the second embodiment.

The third modification has a first address selection unit 30 that generates a decode signal which controls a selection circuit and a second address selection unit 31 that selects a chip. Both the first and second address selection units 30 and 31 have a configuration based on the second chip address selection method.

The first address selection unit 30 decodes one address signal AD11. That is, in the first address selection unit 30, an NMOS N25-1 that is ON in an operative state of each of chips 11-1 to 11-4 and has a low drive capability is provided between a wiring layer 21-4 of each of the chips 11-1 to 11-4 and the ground.

Furthermore, in the second embodiment, the second chip address selection method selects an address signal by changing the mask pattern. On the other hand, in the third modification, an address signal is selected based on whether a TSV is connected to or disconnected from a terminal in accordance with presence or absence of a bump 14.

That is, a TSV 22-4 of the chip 11-1 is electrically connected to a wiring layer 21-4 of the chip 22-1 through a connection layer 27-4. On the other hand, an insulating film 32 is formed between the TSV 22-4 of the chip 11-1 and the wiring layer 21-4 of the chip 11-3. Moreover, the insulating film 32 may be part of an adhesive layer DAF with insulating properties that connects the chip 11-2 to the chip 11-3, or an air gap may be formed in place of the insulating film 32. Therefore, the TSV 22-4 of the chip 11-1 is not electrically connected to the wiring layer 21-4 of the chip 11-3.

Therefore, when an address signal AD11-1 supplied to the wiring layer 21-4 of the chip 11-1 is in a "1" level, "1" is output to a logic circuit from the wiring layer 21-4 of each of the chips 11-1 and 11-2 placed below each insulating film 32, and "0" is output to the logic circuit from the wiring layer 21-4 of each of the chips 11-3 and 11-4 placed above the insulating film 32. These signals output from the wiring layer 21-4 are supplied to the selection circuit 17 of a corresponding chip as a decode signal.

On the other hand, the second address selection unit 31 decodes two address signals AD11-2 and 11-3. That is, NMOS N25-2 and N25-3 are connected between wiring layers 21-5 and 21-6 of the chip 11-1 and the ground, respectively. These NMOS N25-2 and N25-3 are transistors which are ON in the operative state of each chip and have a low drive capability.

Additionally, an input end of an XOR circuit 16 is connected between the wiring layers 21-5 and 21-6. An output end of this XOR circuit 16 is connected to an internal circuit of the chip 11-1.

Further, the insulating film 32 is provided between a TSV 22-6 of the chip 11-1 and the wiring layer 21-6 of the chip 11-2, and the insulating film 32 is provided between a TSV 22-5 of the chip 11-3 and the wiring layer 21-5 of the chip 11-4. Therefore, when an address signal AD11-2 that is in the "1" level is supplied to the wiring layer 21-5 of the chip 11-1, the wiring layer 21-5 of each of the chips 11-1 to 11-3 is changed to "1" level, and the wiring layer 21-5 of the chip 11-4 is changed to the "0" level. Furthermore, when an address signal AD11-3 which is in the "1" level is supplied to the wiring layer 21-6 of the chip 11-1, the wiring layer 21-5 of the chip 11-2 is changed to the "1" level, and the wiring layer 21-5 of the each of the chips 11-2 to 11-4 is changed to the "0" level.

The XOR circuit 16 in each chip performs a logical operation of the levels of the wiring layers 21-5 to 21-6 and generates a decode signal which is used for selecting a chip. The decode signal output from the XOR circuit 16 is supplied to an internal circuit of the chip.

According to the third modification, a chip can be appropriately selected by using the second chip address selection method.

Additionally, since the connection layer between the TSV and the wiring layer can be used as the insulating film and an address can be changed, a cost can be reduced.

It is to be noted that, in FIG. 16, the TSV placed above the insulating film 32 is not electrically connected to the TSV placed below the insulating film 32. Therefore, as indicated by a dotted line, the TSV placed above the insulating film 32 can be omitted.

Further, one end of the TSV is not present in the middle of the chip but is formed through the chip. As a result, manufacture of the TSV can be simplified, and the semiconductor device can be rapidly manufactured.

Third Embodiment

Each of FIGS. 17A to 17D shows a semiconductor device according to a third embodiment. In the first and second embodiments, for example, when four chips are stacked, a decode signal "0" is output to two chips, "1" is output to two chips, and "1" or "0" cannot be output to one specific chip. On the other hand, the third embodiment provides a circuit which uses decode signals C12 (e.g., out11 to out81 in FIG. 12) and D12 (e.g., out12 to out82 in FIG. 12) generated by the decode circuit according to each of the first and second embodiments, and produces a logic state, which is different from those in the other chips, in an arbitrary chip.

It is to be noted that, as the decode signals C12 and C13, out13 to out83 and out14 to out84 in FIG. 12 may be used, or signals generated by using the first or second chip address selection method in the second embodiment may be used.

In FIGS. 17A to 17D, the same circuits are formed, but address signals A12 and B12 supplied form the outside of chips are different. For simplicity, an example of FIG. 17A will now be described.

To the stacked chips are input address signals A12 and B12 used for selecting arbitrary chips as well as the decode signals C12 and D12 generated in the first and second embodiments. The respective chips have the same circuit configuration, and each chip is constituted of an XOR circuit 16-4 which performs a logical operation with respect to the address signal A12 and the chip decode signal C12, an XOR circuit 16-5 which performs a logical operation with respect to the address signal B12 and the chip decode signal D12, and an NOR circuit 41 which performs a logical operation with respect to outputs from these circuits 16-4 and 16-5.

The address signals A12 and B12 supplied to the lowermost chip are supplied to the uppermost chip by using the TSVs of the respective chips. That is, the same address signals A12 and B12 are supplied to each chip.

Although the address signals A12 and B12 are supplied to all the chips, when the address signals A12 and B12 and the chip decode signals C12 and D12 are subjected to arithmetic operations in the XOR circuits 16-4 and 16-5 and the NOR circuit 41, an output signal from the NOR circuit 41 in an arbitrary chip can become "1".

In the example shown in FIG. 17A, the address signals A12 and B12 are "0" and "0", and "1" is output from the NOR circuit 41 in the uppermost one of the four stacked chips.

As shown in FIGS. 17A, 17B, 17C, and 17D, changing combinations of the address signals A12 and B12 with respect to the same chip decode signals C12 and D12 enables controlling the chip that outputs "1" from the NOR circuit 41.

According to the third embodiment, when the XOR circuits 16-4 and 16-5 and the NOR circuit 41 are provided in each chip, a logic state, which is different from those of the other chips, can be generated in an arbitrary chip by using the chip decode signals C12 and D12 and the address signals A12 and B12.

(First Modification)

Each of FIGS. 18A, 18B, 18C, and 18D shows a modification of the third embodiment where the NOR circuit 41 shown in each of the FIGS. 17A, 17B, 17C, and 17D is changed to an NAND circuit 42. This modification enables obtaining the same effect as that of the third embodiment.

(Second Modification)

Each of FIG. 19A to FIG. 19P shows a chip selection state when the number of chips to be stacked is further increased beyond the number of chips in each of FIGS. 17 and 18. FIG. 19 shows a case where chips can be selected even though, e.g., 16 chips are stacked.

A, B, C, and D on the left side of tables designate chip decode signals generated by the same technique as that for the chip decode signals shown in FIG. 17 or FIG. 18. For example, as A to D, out11 to out81, out12 to out82, out13 to out83, and out14 to out84 in FIG. 12 can be used, respectively. W, X, Y, and Z correspond to the address signals shown in FIG. 17 or FIG. 18. Although the two address signals A12 and B12 alone are disclosed in the example shown in each of FIG. 17 and FIG. 18, the number of inputs of the address signals can be increased by the same technique. In the second modification, since the number of chips to be stacked is increased, the address signals are expanded from two bits shown in each of FIG. 17 and FIG. 18 to four bits.

W is supplied to an XOR circuit together with A, X is supplied to the XOR circuit together with B, Y is supplied to the XOR circuit together with C, and Z is supplied to the XOR circuit together with D. Furthermore, output signals from the four XOR circuits are supplied to an NOR circuit or an NAND circuit, and output signals can be obtained from the NOR circuit or the NAND circuit. Each of FIG. 19A to FIG. 19P shows an arithmetic operation result obtained by the NOR circuit.

As described above, even if the number of chips to be stacked is changed, values of the address signals W, X, Y, and Z are changed by using the technique shown in each of FIG. 17 and FIG. 18, whereby chip to be selected can be changed.

For example, in FIG. 12, eight chips are stacked. Here, if one chip is added as a later-described redundant chip, nine chips are stacked. That is, the nine chips must be selected. In this case, a configuration that enables selecting eight chips is insufficient. Therefore, a selection technique that enables selecting more than eight chips even though eight chips are stacked is required. According to the second modification, even if eight chips are stacked, arranging one inverter circuit and three logic circuits in each chip enables selecting more than eight chips.

(Third Modification)

Each of FIGS. 20A to 20E shows a third modification of the third embodiment illustrating a chip kill address shift system using the chip decode depicted in FIG. 3 and the chip selection method depicted in each of FIGS. 19A to 19P. The chip kill means that, a stacked chip has, e.g., a defect, and the defective chip is disconnected from other chips. However, in this case, address signals must be supplied to chips placed above the defective chip. Therefore, a circuit that can pass address signals is provided in each chip.

FIGS. 20A to 20E have the same configuration, and hence the configuration will be described with reference to FIG. 20A. A configuration of each chip is basically the same as the configuration depicted in FIG. 3. A difference from FIG. 3 lies in a circuit that allows passage of the address signals. That is, in a chip 6-1, a transfer gate T71 is connected between an input end of an inverter circuit 15 and a terminal 13-10, and a transfer gate T72 is connected between an output end of the inverter circuit 15 and the terminal 13-10. One input end of an XOR circuit 16 is connected with the outer end of the inverter circuit 15, a transfer gate T73 is connected between the other input end of the same and a terminal 13-9, and a transfer gate T74 is connected between an output end of the XOR circuit 16 and the terminal 13-9.

A chip selection signal Kill 1 is a chip selection signal (an output signal from an NOR circuit) generated in, e.g., each of FIGS. 19A to 19P, and this signal and a signal inverted by an inverter circuit I62 enable complementary operations of the transfer gates T71 and T72 and also complementary operations of the transfer gates T73 and T74. When the chip selection signal Kill 1 is "0", the transfer gates T71 and T73 are turned off, and the transfer gates T72 and T74 are turned on. Therefore, the chip 6-1 depicted in FIG. 20A operates like FIG. 3.

On the other hand, when the chip selection signal Kill 1 is "1", the transfer gates T71 and T73 are turned on, and the transfer gates T72 and T74 are turned off. Therefore, a terminal 13-5 is connected to the terminal 13-10 through the transfer gate T71, and a terminal 13-4 is connected to the terminal 13-9 through the transfer gate T73. Therefore, address signals E14 and F14 supplied to the terminals 13-5 and 13-4 are transferred to the terminals 13-10 and 13-9 via the transfer gates T71 and T73 and further transferred to a chip 6-2 via a TSV.

In each of FIGS. 20A to 20E, address signals E14 and F14 supplied to the terminals 13-5 and 13-4 are the same as the address signals AD61 and AD62 which are used for generating the chip decode signals depicted in FIG. 3. Each of FIGS. 20A to 20E shows address assignment of each chip when the address signals E14 and F14 are "0" and "0" and a chip selection signal (an output signal from the NOR circuit) generated in each of FIGS. 19A and 19P is "1".

According to the third modification, the transfer gates T71 to T74 that control transfer of the address signals E14 and F14 are provided in each chip, and these transfer gates T71 to T74 are controlled by a chip selection signal Kill n (n=1 to 5). Therefore, for example, when a specific chip is defective and does not normally operates and this chip is deactivated and eliminated from operations of the stacked chips, the address signals can be transferred to the chips above the excluded chip.

Here, when all the chips normally operate, it is preferable to set the chip selection signal Kill n to "1" in the uppermost chip in a stacking direction. Since the signals are more rapidly transferred to the lower chips in the stacking direction, high-speed operations are enabled.

(Fourth Modification)

Figure 21:
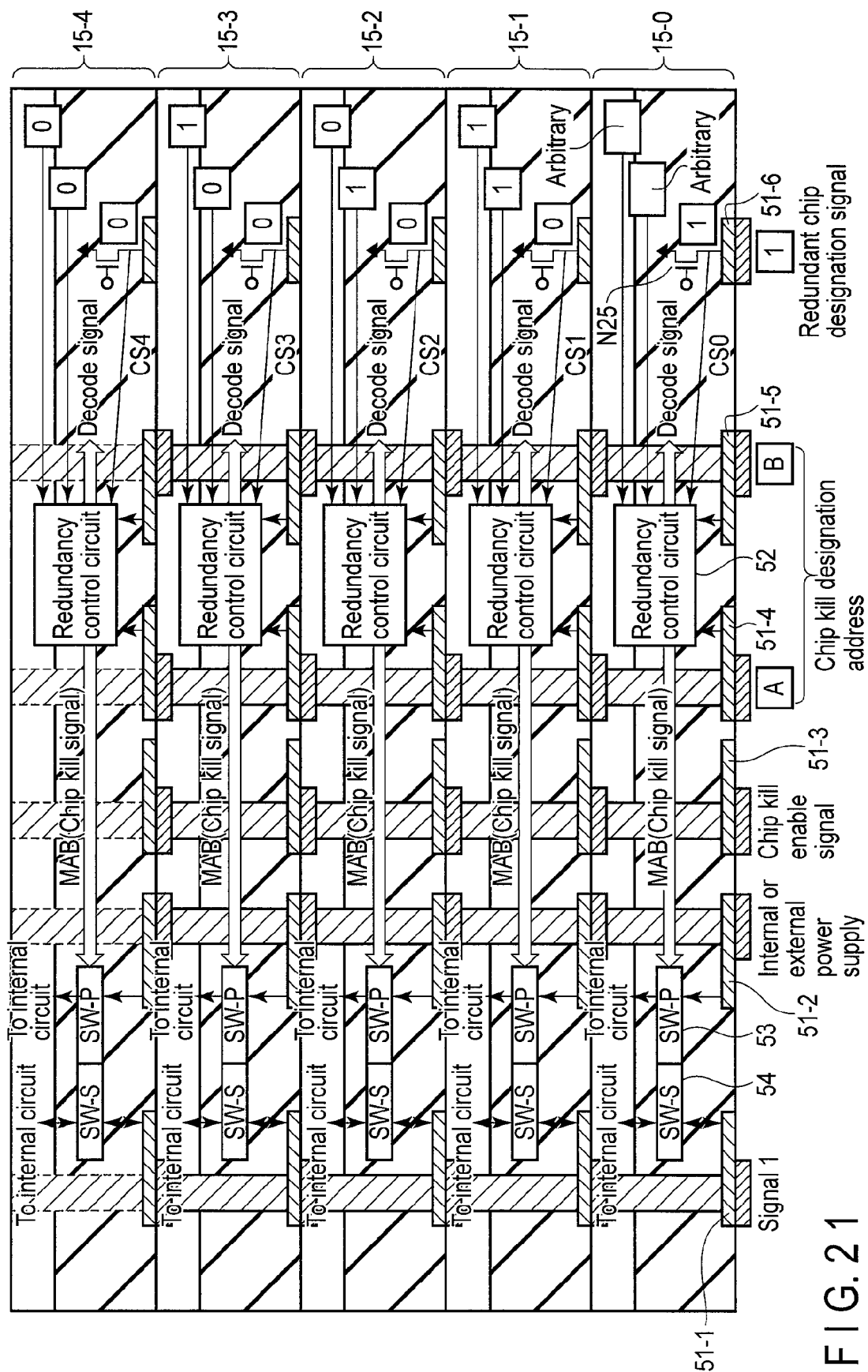
FIG. 21 is a cross-sectional showing a fourth modification of the third embodiment.

FIG. 21 shows a fourth modification of the third embodiment which is an example of generating a chip selection signal by a technique different from that in FIG. 20.

FIG. 21 is characterized in that chip kill designation address signals (chip selection signals) A and B that are used for selecting a chip to be excluded are provided and a signal for switching activation or deactivation of the chip is directly supplied to a chip 15-0 which is the closest to an external terminal in stacked chips 15-0 to 15-4.

Moreover, when a redundant chip designation signal is "1", this chip functions as a redundant chip. In case of FIG. 21, a terminal 51-6 of the chip 15-0 alone is set to a "1" level by the redundant chip designation signal supplied from the outside (a controller or an IF chip). Therefore, the chip 15-0 functions as a redundant chip.

Here, a chip kill enable signal is a signal that is used for validating or invalidating input of the chip kill designation address signal. For example, when the chip kill enable signal is "1", input of the chip kill designation address signal is valid. When the chip kill enable signal is "0", input of the chip kill designation address signal is invalid.

Each chip has a redundancy control circuit 52. As will be described later, this redundancy control circuit 52 includes a comparison circuit which compares a chip address (a combination of numerical figures "0" and "1" written on the right-hand side of each chip) generated by the method disclosed in each of the first and second embodiments with each of the chip kill designation address signals A and B and outputs a chip kill signal MAB when these signals coincide with each other, and a decode circuit which fetches the chip kill designation address signals A and B based on a redundant chip designation signal and determines the chip kill designation address signals A and B as chip decode addresses.

The chip kill signal MAB generated by the redundancy control circuit 52 controls a switch (SW-P) 53 and a switch (SW-S) 54. The switch 53 is a switch that controls power supply to an internal circuit from a terminal 51-2, and the switch 54 is a switch that controls input/output of signals between the internal circuit and a terminal 51-1. These switches 53 and 54 are turned off by the chip kill signal MAB, enables electrically disconnecting a corresponding chip from an external power supply and signals, and also enables replacement with a redundant chip.

For example, when the redundant chip designation signal supplied to a chip 15-0 is "0", the chip 15-0 is deactivated and electrically disconnected from the external power supply and signals. That is, chips 15-1 to 15-5 each having the terminal 51-6 that is not connected to an external terminal are automatically activated.

On the other hand, as shown in FIG. 21, when the redundant chip designation signal supplied from the outside (a controller or an IF chip) to the chip 15-0 is "1", the chip 15-0 is activated as a redundant chip, fetches the chip kill designation address signals A and B, and determines the chip kill designation address signals A and B as chip decode addresses. It is to be noted that whether each chip is normal or abnormal is determined in a test process, and information indicating that the chip is abnormal is recorded in an ROM fuse or the like when the chip is abnormal. The controller or the IF chip determines whether the chip is normal or abnormal based on the information in the ROM fuse. Here, when the chip is abnormal, the controller or the IF chip supplies the redundant chip designation signal "1" to the corresponding chip.

Although FIG. 20 does not show such a circuit, which electrically disconnects a chip from the external power supply and signals, as depicted in FIG. 21, providing a circuit, which deactivates a chip, in a chip to which "1" is assigned like FIG. 21 enables performing redundancy switching of chips like FIG. 21.

(Fifth Modification)

Figure 22:
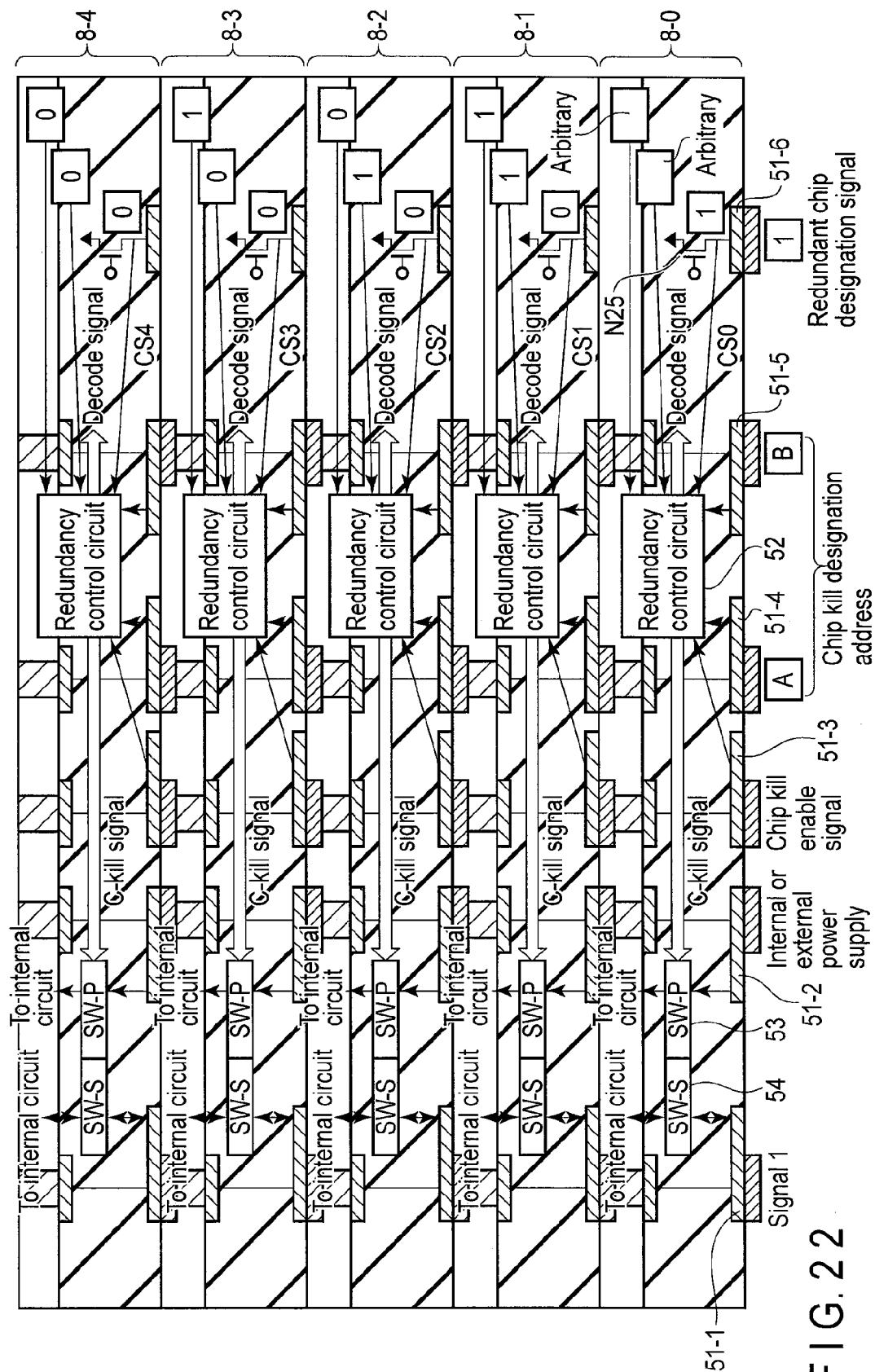
FIG. 22 is a cross-sectional view showing a fifth modification of the third embodiment.

FIG. 22 shows a fifth modification of the third embodiment that is obtained by applying the first embodiment to the fourth modification. That is, this drawing shows an example that a TSV is formed in a semiconductor substrate 11 alone and connection to an upper chip is achieved by wiring lines in a chip. According to this configuration, the same effect as that of the fourth modification shown in FIG. 21 can be obtained.

Example of Redundancy Control Circuit

FIG. 23 shows an example of the redundancy control circuit 52 shown in each of FIG. 21 and FIG. 22.

As described above, the redundancy control circuit 52 includes a comparison circuit 52-1 and a decode circuit 52-2. The comparison circuit 52-1 compares chip addresses A and b with chip kill designation address signals A and B, and it outputs a chip kill signal MAB if these addresses coincide with each other. Here, a signal VP is a signal that is used for supplying internal power to each chip, and a signal S1 is a common signal such as write enable WE.

The chip kill signal MAB is supplied to a logic circuit 55-1 that constitutes an external signal switching circuit 55 together with a redundant chip designation signal and a chip kill enable signal. The logic circuit 55-1 supplies the chip kill signal MAB to a switch (SW-P) 53 and a switch (SW-S) 54 based on the redundant chip designation signal and the chip kill enable signal. That is, the logic circuit 55-1 supplies the chip kill signal MAB to the switch (SW-P) 53 and the switch (SW-S) 54 when the chip kill enable signal is "1" and the redundant chip designation signal is "0", and it does not supply the chip kill signal MAB to the switch (SW-P) 53 and the switch (SW-S) 54 when the chip kill enable signal is "1" and the redundant chip designation signal is "1".

Therefore, as shown in FIG. 21, when the redundant chip designation signal of the chip 15-0 is "1", in the chip 15-0, the chip kill signal MAB is not supplied to the switch (SW-P) 53 and the switch (SW-S) 54, the switch (SW-P) 53 and the switch (SW-S) 54 are maintained in the ON state, and the chip 15-0 is activated and functions as a redundant chip.

Additionally, for example, like a chip 15-1, the switch (SW-P) 53 and the switch (SW-S) 54 of a chip, whose redundant chip designation signal is "0", are turned off by the chip kill signal MAB, and the chip 15-1 is deactivated.

Further, when the chip kill enable signal is "1", the chip kill signal MAB is masked.

The decode circuit 52-2 fetches the chip kill designation address signals A and B based on the redundant chip designation signal and outputs the chip kill designation address signals A and B as chip decode addresses. That is, the decode circuit 52-2 has transfer gates T81, T82, T83, and T84 to which the chip addresses A and B are supplied.

Like the chips 15-1 to 15-4, when the redundant chip designation signal is "0", the transfer gates T81 and T83 are turned on, the chip address A is output as a decode signal AD_A, and the chip address B is output as a decode signal AD_B of the chip. This decode signal AD_B is output through the transfer gate T85 which is ON. This transfer gate T85 is controlled by the chip kill signal MAB like the switch (SW-P) 53 and the switch (SW-S) 54. That is, when the chip kill signal MAB output from the logic circuit 55-1 is "0", the transfer gate T85 is turned on. When the chip kill signal MAB is "1", the transfer gate T85 is turned off.

Further, when the redundant chip designation signal is "1", the transfer gates T82 and T84 are turned on, the chip kill designation address signal A is output as the decode signal AD_A, and the chip kill designation address signal B is output as the decode signal AD_B of the chip through the transfer gate T85.

It is to be noted that, in FIG. 23, the decode signal AD_A is a signal which is used for fetching signals C1 and C2, which are not shown in FIG. 21 and FIG. 22 and are supplied from the outside or an IF chip, into a chip. Each of the signals C1 and C2 is supplied into a chip as an internal signal C_int by a switch SW-C controlled by the decode signal AD_A and an inverted signal AD_A.

Figure 24:
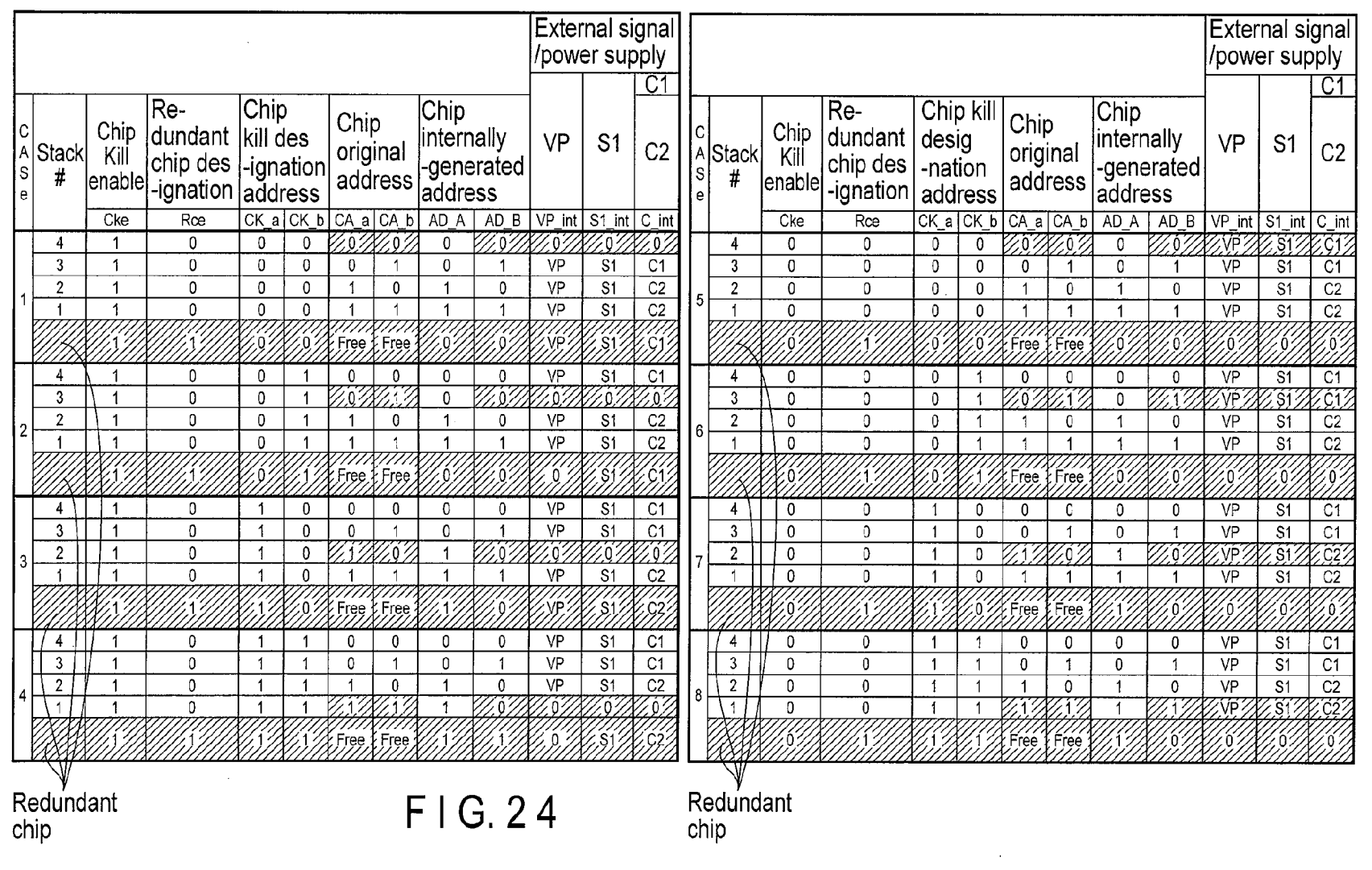

FIG. 24 is a view showing a specific operation in FIG. 23. A left view in FIG. 24 shows a case where the chip kill enable signal is validated, and a right view in FIG. 24 shows a case where the chip kill enable signal is invalidated. For example, in a situation where all chips other than a redundant chip are normal, the chip enable signal is invalidated in case of failure analysis or the like.

In the left view of FIG. 24, in Case 1, a chip of Stack #4 is an abnormal chip. In this case, internal power is not supplied to the chip of Stack #4, and an address generated in the chip is substituted by a redundant chip.

In Case 2, a chip of Stack #3 is an abnormal chip. In this case, the internal power is not supplied to the chip of Stack #3, and an address generated in the chip is substituted by the redundant chip.

In Case 3, a chip of Stack #2 is an abnormal chip. In this case, the internal power is not supplied to the chip of Stack #2, and an address generated in the chip is substituted by the redundant chip.

In Case 1, a chip of Stack #1 is an abnormal chip. In this case, the internal power is not supplied to the chip of Stack #1, and an address generated in the chip is substituted by the redundant chip.

In the right view of FIG. 24, the internal power is not supplied to the redundant chip, and an address generated in the chip is not changed.

Fourth Embodiment

Figure 25:
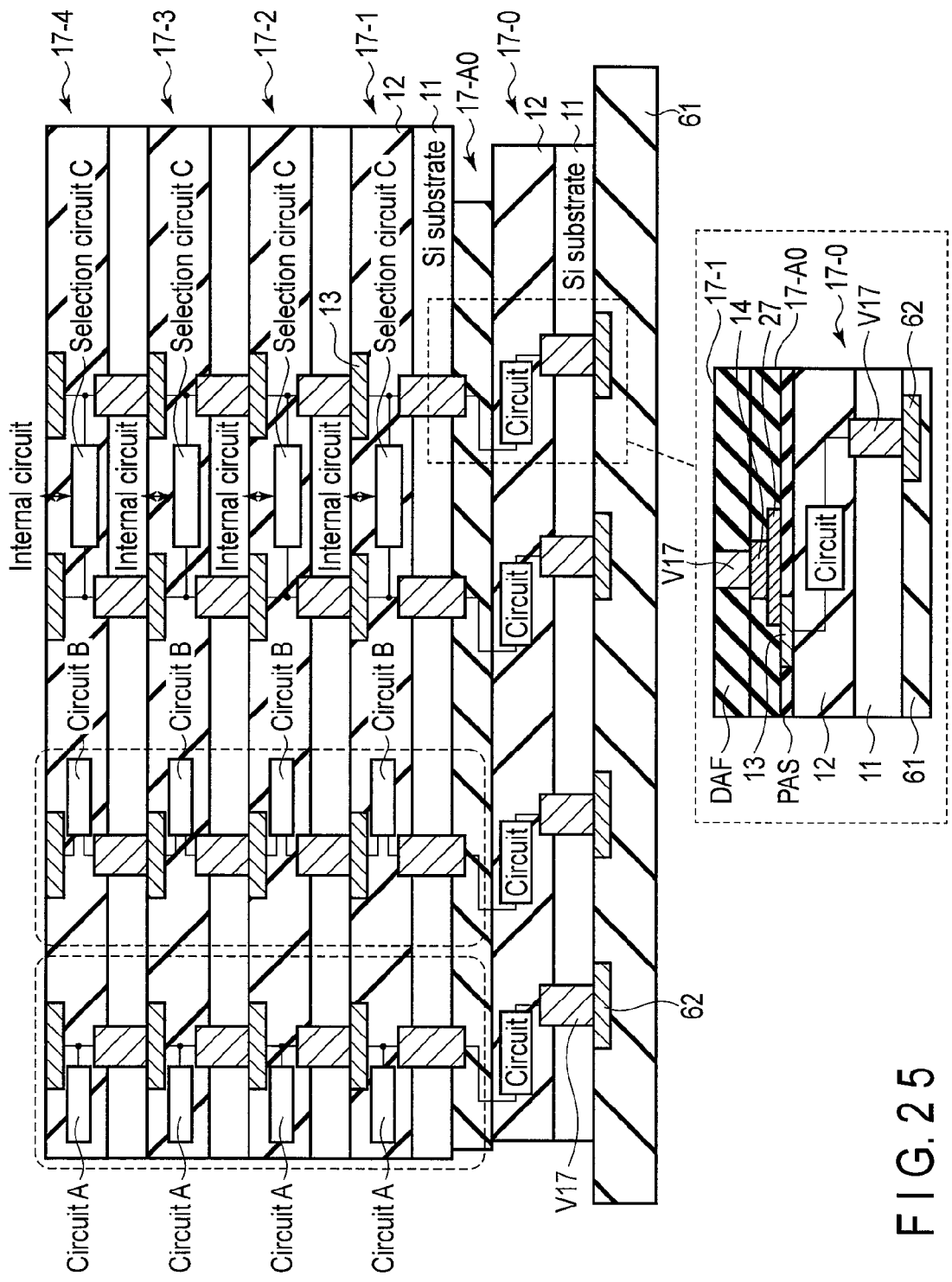
FIG. 25 is a cross-sectional view showing a fourth embodiment.

FIG. 25 shows a fourth embodiment having a configuration where stacked chips explained in the first to third embodiments is arranged on a package substrate. In FIG. 25, an example where TSVs are formed in each semiconductor substrate 11 alone like the first embodiment will be explained.

A rewiring layer 17-A0 is arranged below four stacked chips 17-1 to 17-4. TSVs of 17-1 to 17-4 stacked on the lowermost chip 17-0 are electrically connected. It is to be noted that the rewiring layer 17-A0 is formed of pattern wiring lines 27, and each of the TSVs of 17-1 to 17-4 is connected to one pattern wiring line 27 of the rewiring layer 17-A0.

The rewiring layer 17-A0 has the pattern wiring lines 27 (e.g., formed by rewiring). The pattern wiring lines 27 enables the TSVs V17-1 to V17-4 of the chips 17-1 to 17-4 to be connected to respective terminals 13 of a chip 17-0 (hereinafter referred to as an IF chip). The pattern wiring lines 27 are electrically connected to the terminals 13 and bumps 14 of the IF chip 17-0, respectively. Here, a position of each terminal 13 in an insulating film PAS and a position of each bump 14 in a stacking direction deviate from each other. Further, each bump 14 is electrically connected to the TSV V17-1 of the chip 17-1. That is, this rewiring layer 17-A0 has a function that enables achieving connection between the TSVs and the wiring layer even if positions of the TSVs of the chip 17-1 and a position of the wiring layer of the IF chip 17-0 in the stacking direction deviate from each other.

The lowermost IF chip 17-0 is connected to terminals 62 of a package substrate 61 through the TSVs V17. The IF chip 17-0 inputs or outputs signals with respect to the outside of the package and calculates input values or directly transmits the values to the stacked chips 17-1 to 17-4. Furthermore, it also has a function of receiving signals output from the chips 17-1 to 17-4. The chip decode signal and the chip selection signal are transmitted to the stacked chips 17-1 to 17-4 through the IF chip 17-0.

In FIG. 25, in a state where the IF chip 17-0 has the semiconductor substrate 11 arranged on the lower side and a wiring region 12 arranged on the upper side, the TSVs V17 are connected to terminals 62 of the package substrate 61.

However, in a state where the semiconductor substrate 11 of the IF chip 17-0 is arranged on the lower side and the wiring region 12 of the same is arranged on the upper side, the IF chip 17-0 can be connected to the package substrate 61. It is to be noted that circuits A and B are arbitrary circuits and they are, e.g., peripheral circuits.

According to the fourth embodiment, the rewiring layer 17-A0 is arranged between the chips 17-1 to 17-4 and the IF chip 17-0. Therefore, for example, even if positions of the TSVs of the chips 17-1 to 17-4 are different from a position of the wiring layer of the IF chip 17-0, these members can be connected to each other.
(First Modification)

Further, like a first modification shown in FIG. 26, in a state where all chips 17-1 to 17-4 have semiconductor substrates 11 arranged on the upper side and wiring regions 12 arranged on the lower side, the chips can be connected to an IF chip 17-0 through a rewiring layer 17-A0.

It is to be noted that the chip 17-1 may also have an interface function of this interface chip 17-0. In this case, the IF chip 17-0 can be eliminated.
(Second Modification)

Figure 27:
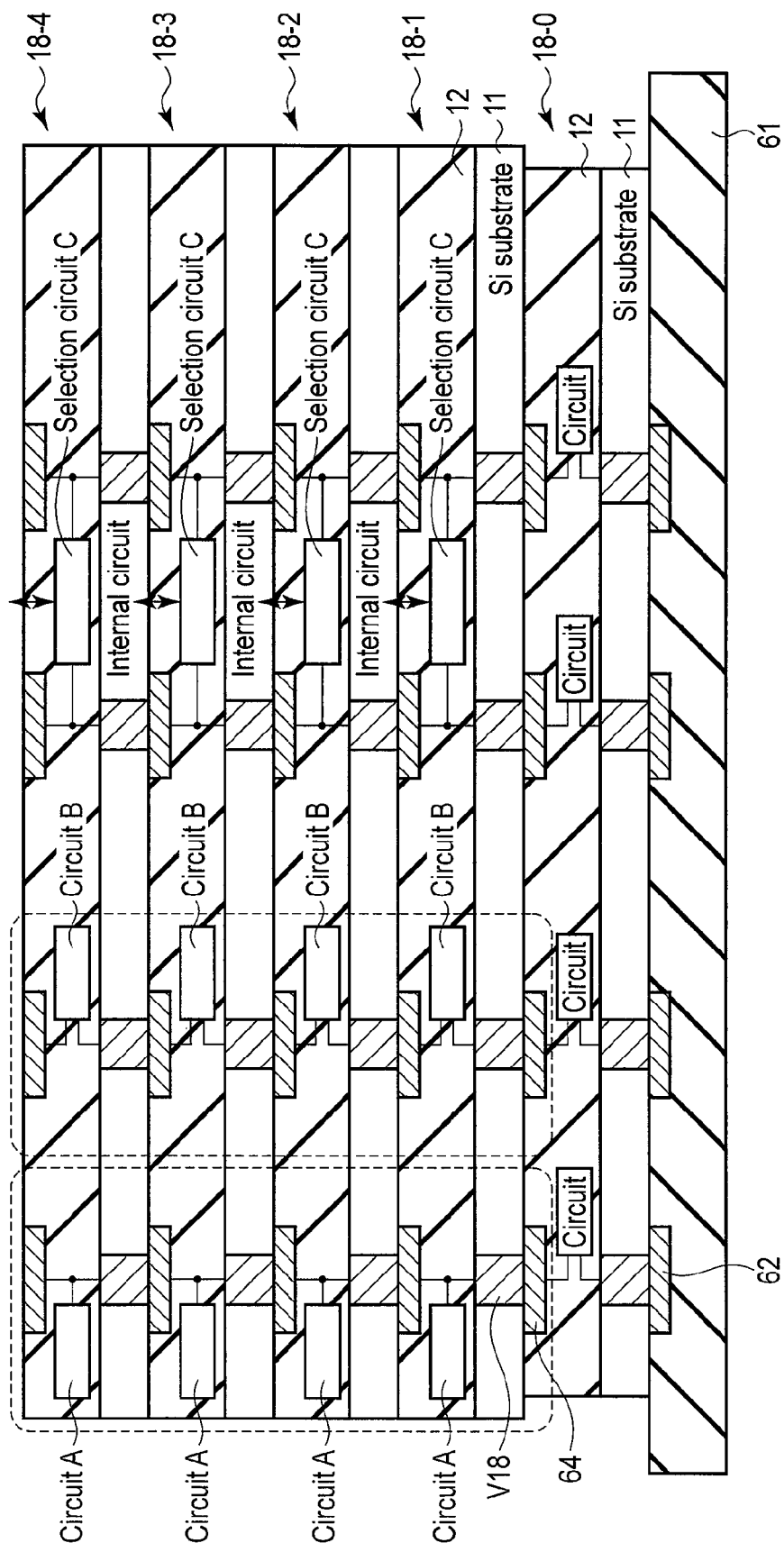
FIG. 27 is cross-sectional view showing a second modification of the fourth embodiment.

FIG. 27 shows a second modification, and directions of chips and connection between the stacked chips are the same as those shown in FIG. 25. However, a rewiring layer is not present between the lowermost IF chip 18-0 and a chip 18-1 stacked thereon, and each TSV V18 of the chip 18-1 is connected to a wiring layer 64 of the IF chip 18-0.

In FIG. 27, although a semiconductor substrate 11 of the IF chip 18-0 is provided on a package substrate 61 side, a direction of the IF chip 18-0 can be reversed so that a wiring region 12 can be provided on the package substrate 61 side.

According to a second modification, since a position of each TSV V18 of the chip 18-1 coincides with a position of a terminal 64 of the IF chip 18-0, the rewiring layer can be eliminated. Therefore, a chip assembling configuration can be minimized.
(Third Modification)

Figure 28:
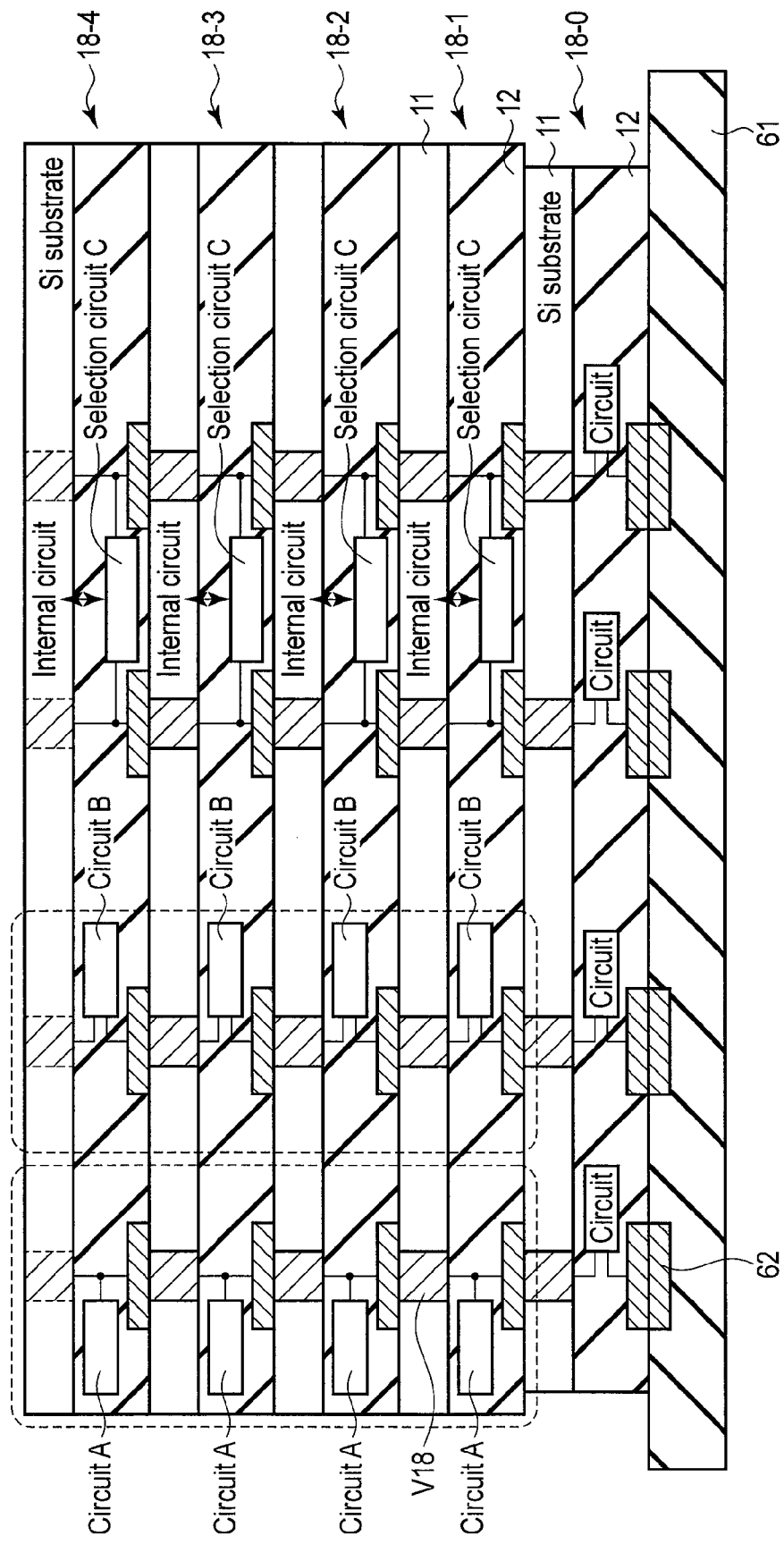
FIG. 28 is a cross-sectional view showing a third modification of the fourth embodiment.

Furthermore, as shown in FIG. 28, semiconductor substrates of stacked chips 18-1 to 18-4 can be arranged to face the opposite side (the upper side) of a package.

It is to be noted that a chip 18-1 may have an interface function of an IF chip 18-0. In this case, the IF chip 18-0 can be eliminated.
(Fourth Modification)

FIG. 29 shows a fourth modification which is an example obtained by further modifying FIG. 28. FIG. 28 shows the case where the IF chip 18-0 is arranged besides the stacked chips 18-1 to 18-4.

On the other hand, FIG. 29 shows a case where two chips, i.e., a chip 18-0A and a chip 18-0B are arranged besides stacked chips 18-1 to 18-4. These chips 18-0A and 18-0B are formed of dedicated chip. For example, one chip is formed of an IF chip, and the other is formed of a power supply chip including a pump circuit or the like. Since a manufacturing process of the chip including the pump circuit is different from that of the IF chip, using a chip different from the IF chip enables applying appropriate manufacturing processes meeting circuit operations to both chips. Therefore, performance of each chip can be improved.

It is to be noted that FIG. 29 illustrates the case where the two chips 18-0A and 18-0B are arranged, and the number of chips can be increased or decreased as required.

Moreover, although FIG. 29 shows an example where an output signal from the chip 18-0B is transmitted to a subsequent chip through a circuit C provided in each of the stacked chips 18-1 to 18-4, the output signal from the chip 18-0B can be used in all the chips in common. It is to be noted that the circuit C is an arbitrary circuit, and it is, e.g., a peripheral circuit.

Additionally, such a rewiring layer 17-A0 as shown in FIG. 25 can be provided between the chip 18-1 and the chips 18-0A and 18-0B.
(Fifth Modification)

Figure 30:
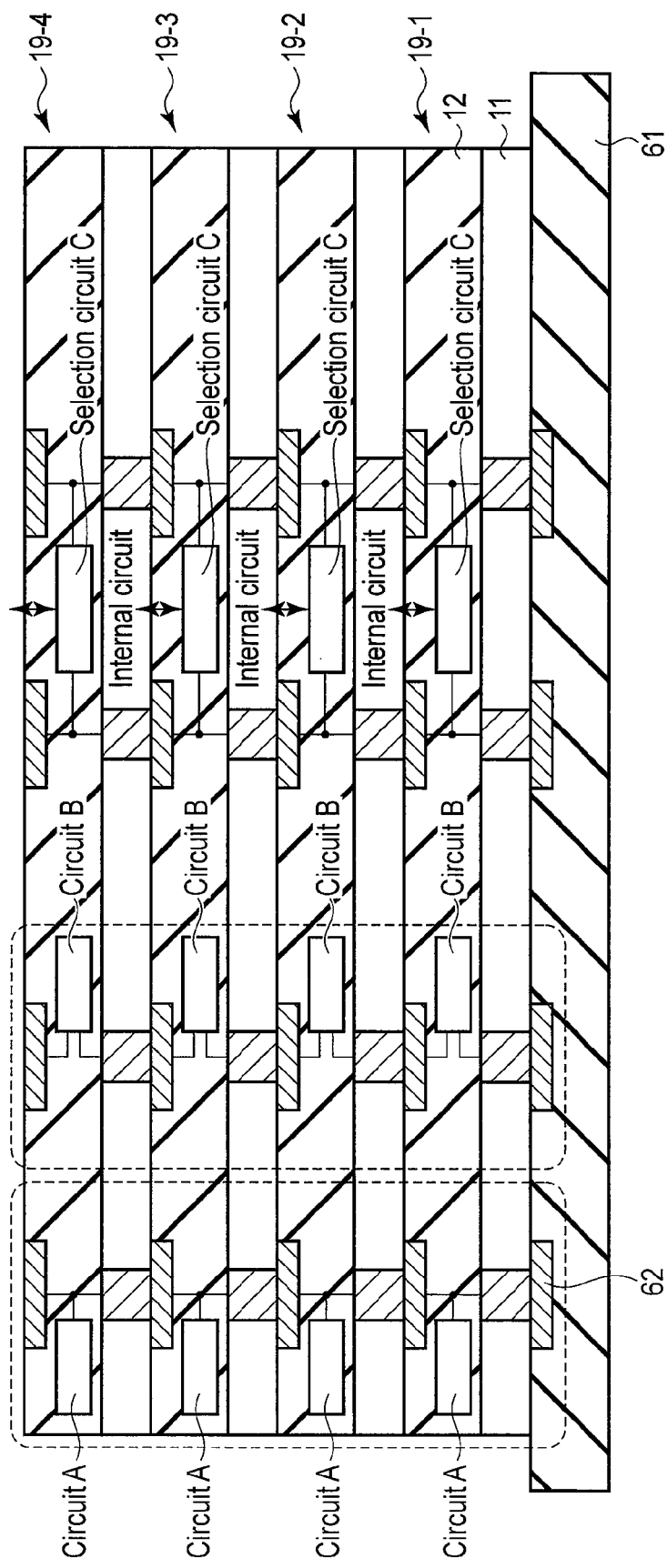
FIG. 30 is a cross-sectional view showing a fifth modification of the fourth embodiment.

FIG. 30 shows a fifth modification which is an example where stacked chips alone are used and an IF chip is not used.

That is, for example, a chip 19-1 in the stacked chips has an interface function, the IF chip can be omitted, and the chip 19-1 can be directly arranged on a package substrate 61. Therefore, a chip assembling configuration can be further miniaturized.
(Sixth Modification)

Figure 31:
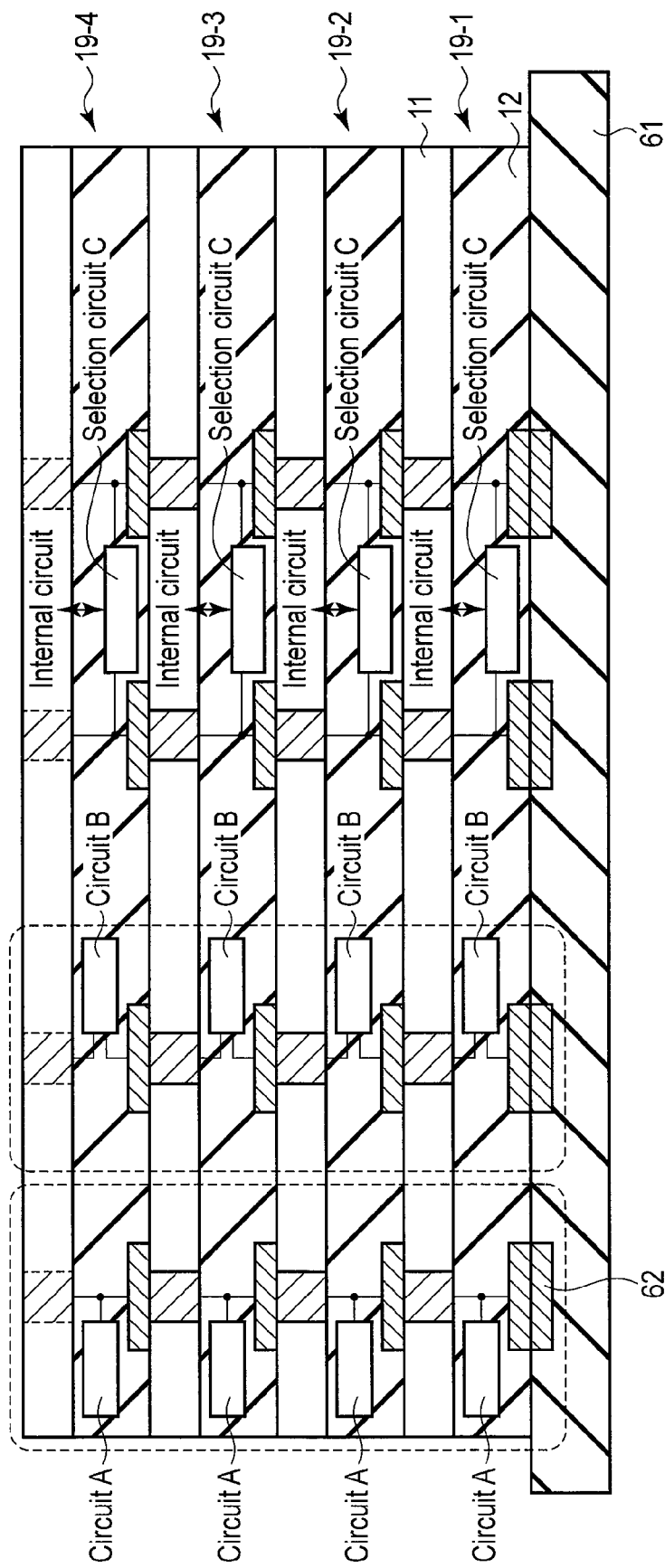
FIG. 31 is a cross-sectional view showing a sixth modification of the fourth embodiment.

FIG. 31 shows a sixth modification. FIG. 30 shows an example where a semiconductor substrate 11 and terminals of each chip are placed on the package substrate 61 side, whereas FIG. 31 shows an example where a wiring region 12 of each chip is arranged on a package substrate 61 side.
(Seventh Modification)

FIG. 32 shows a seventh modification. In a semiconductor device shown in FIG. 32, chips 20-4, 20-3, 20-2, and 20-1 stacked on a package substrate 61 are arranged, a rewiring layer 20-A0 is arranged on the chip 20-1, and an IF chip 20-0 is arranged on this rewiring layer 20-A0. This IF chip 20-0 is connected to the rewiring layer 20-A0 on a wiring region and also connected to the stacked chips 20-1 to 20-4 through this rewiring layer 20-A0. Further, bonding pads P1 provided in the rewiring layer 20-A0 are connected to bonding pads P2 provided in the package substrate 61 through bonding wires W1.

In case of a configuration depicted in FIG. 25, the TSVs V17 are provided in the stacked chips 17-1 to 17-4 as well as the IF chip 17-0, and the TSVs V17 of the chip 17-0 are connected to the terminals 62 of the package substrate 61. However, in the configuration shown in FIG. 32, TSVs do not have to be provided in the IF chip 20-0.

In the rewiring layer 20-A0, it is also possible to form wiring lines that connect the IF chip 20-0 to the stacked chips 20-1 to 20-4, the terminals P1 that connect the IF chip 20-0 or the stacked chips 20-1 to 20-4 to the package substrate 61, or wiring lines that connect the IF chip 20-0 or internal signals of the stacked chips 20-1 to 20-4.

It is to be noted that, although the example where the lowermost chip 20-4 is connected to the terminals 62 of the package substrate 61 by using the TSVs has been shown, the TSVs of the chip 20-4 can be omitted as required.
(Eighth Modification)

Figure 33:
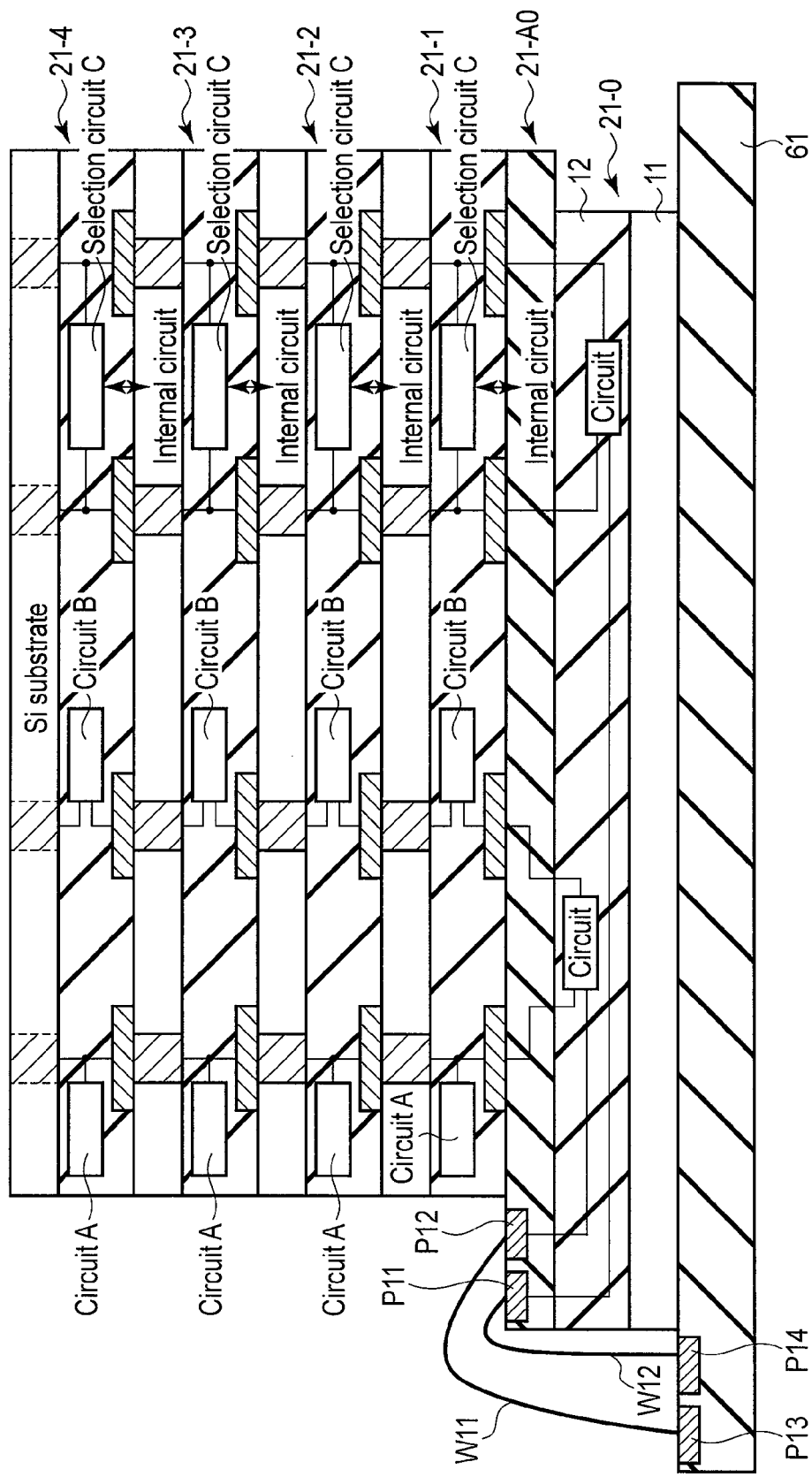
FIG. 33 is a cross-sectional view showing an eighth modification of the fourth embodiment.

FIG. 33 shows an eighth modification. A semiconductor device shown in FIG. 33 corresponds to an example where connection of stacked chips 21-1 to 21-4 established by TSVs is combined with connection achieved by a rewiring layer 21-A0, an IF chip 21-0, and wire bonding. It is to be noted that each selection circuit C is, e.g., a selection circuit in the first or second embodiment.

The connection of the stacked chips 21-1 to 21-4 is the same as that in FIG. 32. However, the rewiring layer 20-A0 and the IF chip 20-0 are arranged on the stacked chips in FIG. 32, whereas an IF chip 21-0 and a rewiring layer 21-A0 are arranged between a package substrate 61 and stacked chips in FIG. 33.

That is, the IF chip 21-0 is arranged on the package substrate 61, the rewiring layer 21-A0 is arranged on the IF chip 21-0, and the lowermost chip 21-1 in the stacked chips is arranged on the rewiring layer 21-A0. Bonding pads P11 and P12 are provided on an upper surface of the rewiring layer 21-A0, and bonding pads P13 and P14 are provided on an upper surface of the package substrate 61. The bonding pads P12 and P13 are connected to each other through a bonding wire W11, and the bonding pads P11 and P14 are connected to each other through a bonding wire W12.
(Ninth Modification)

FIG. 34 shows a ninth modification. In the configuration shown in FIG. 33, the bonding pads P11 and P12 are formed in the wiring layer. On the other hand, in FIG. 34, bonding pads P11 and P12 are formed in an IF chip 22-0. Other structures are equal to those in FIG. 33.

(10th Modification)

FIG. 35 shows a 10th modification. FIG. 35 shows a modification of FIG. 32 which is a configuration obtained by eliminating the rewiring layer 20-A0 from the configuration in FIG. 32.

Stacked chips 23-1 to 23-4 are connected to each other via TSVs V23 provided in an IF chip 23-0. The IF chip 23-0 is connected to a package substrate 61 through bonding wires. That is, bonding pads P21, P22, P23, and P24 are provided on an upper surface of the IF chip 23-0, bonding pads P25, P26, P27, and P28 are provided in the package substrate 61, and the bonding pads P25, P26, P27, and P28 are connected to the bonding pads P22, P21, P23, and P24 through bonding wires W21, W22, W23, and W24.

(11th Modification)

FIG. 36 shows an 11th modification. FIG. 36 shows a modification of FIG. 34 which is a configuration where stacked chips 24-1 to 24-4 are connected to an IF chip 24-0 without interposing a wiring layer therebetween. The IF chip 24-0 is connected to a package substrate 61 through bonding wires. That is, bonding pads P31, P32, P33, and P34 are provided on an upper surface of the IF chip 24-0, bonding pads P35, P36, P37, and P38 are provided on the package substrate 61, and the bonding pads P35, P36, P37, and P38 are connected to bonding pads P34, P33, P32, and P31 through bonding wires W31, W32, W33, and W34.

(12th Modification)

Figure 37:
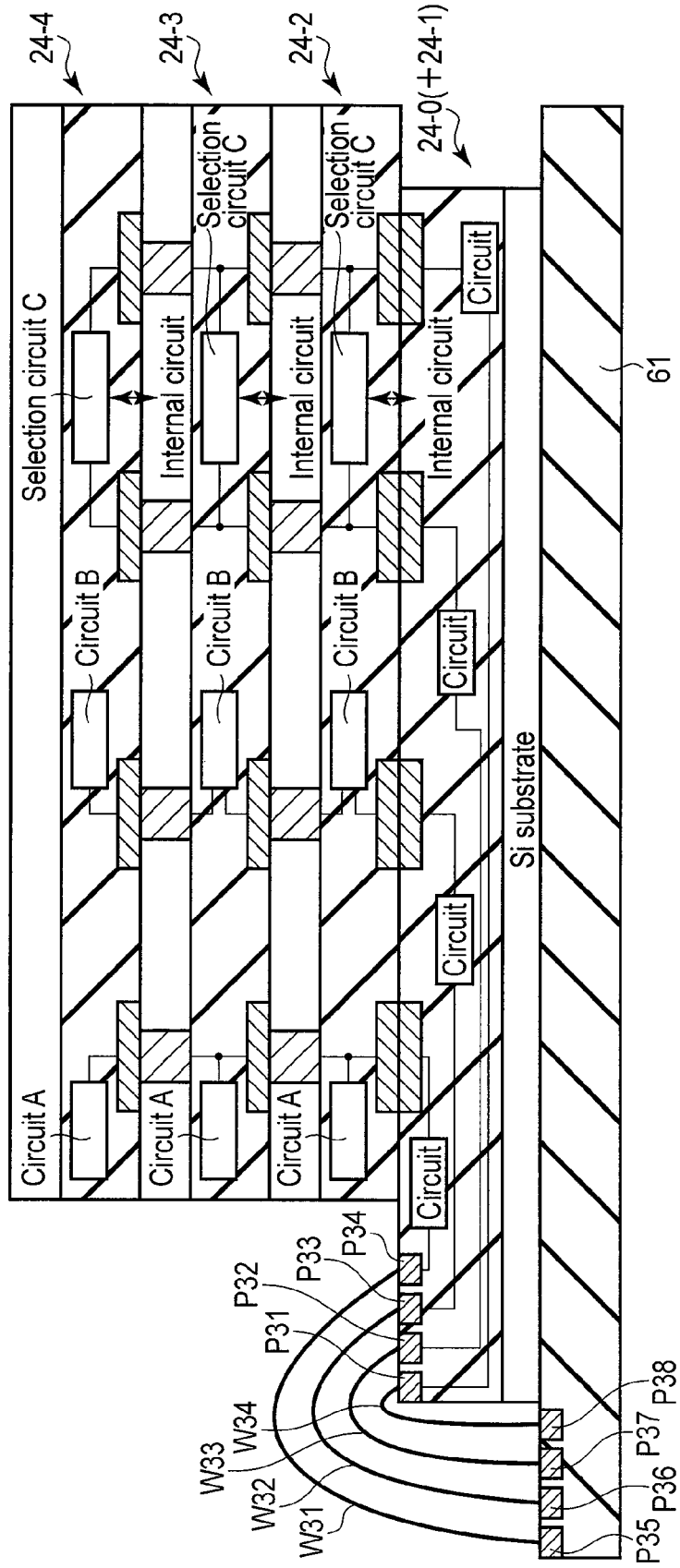
FIG. 37 is a cross-sectional view showing a 12th modification of the fourth embodiment.

FIG. 37 shows a 12th modification. In FIG. 37, the IF chip 24-0 and the chip 24-1 in FIG. 36 are combined and formed into the same chip, whereby the chip 24-1 is omitted. According to this configuration, a chip assembling configuration in FIG. 36 can be further miniaturized.

According to the 12th modification, since the number of chips to which TSVs are applied can be reduced, a manufacturing cost can be reduced. In this case, since surfaces of a chip 24-2 and the chip 24-0 serve as joint surfaces, wiring layers of the chip 24-2 and the chip 24-0 are provided at substantially mirrored positions. Therefore, to facilitate connection of the chips, as the chip 24-0, it is preferable to use as a base a mirror chip obtained by reversing arrangement of terminals of a wafer of each of the chips 24-2 to 24-4. Further, when a mask pattern of the chip 24-0 at a portion corresponding to each of the chips 24-2 to 24-4 is mirrored, design efficiency can be improved.

(13th Modification)

FIG. 38 shows a 13th modification. In FIG. 38, positions of the semiconductor substrate 11 and the wiring region 12 are counterchanged. Other structures are equal to those in FIG. 37.

Fifth Embodiment

Each of FIGS. 39A and 39B, FIG. 40, and FIG. 41 shows an example for remedying defective chips when the chips are stacked by using TSVs and they have defects.

When the chips are stacked by using the TSVs, then the chips are tested, and defective chips are detected, each defective chip can be substituted by a redundant chip by using a chip kill designation address signal as described in the third to fifth modifications of the third embodiment. As methods for substituting the defective chip by the redundant chip, there are a first remedial method shown in FIG. 39A and FIG. 40 and a second remedial method shown in FIG. 39B and FIG. 41.

In case of the first remedial method, as shown in FIG. 39A and FIG. 40, for example, a defective chip 5A is replaced with a redundant chip 5B, and eight non-defective chips are manufactured. In this example, a redundant chip 71-RD is mounted in addition to the regular eight chips. The redundant chip 71-RD may be a perfect good product as indicated by Case 1. Further, as indicated by Case 2, for example, when a plane 2 as a section that constitutes a memory cell array cannot be remedied and a plane 1 alone is a partially-good product that can be used for remedy, a cell array plane 1 in the defective chip 5A may be replaced with a cell array plane 1 in the redundant chip 71-RD. An address of each chip is determined based on the circuit or the layout described in each of the first and second embodiments, and different operations can be performed by using the address. Although FIG. 40 shows an example where two planes are included in one chip, the embodiment is not restricted thereto, and it may be configured to include, e.g., four planes.

In Case 1, the plane 2 alone is defective in the defective chip 5A. Therefore, for example, the plane 2 of the defective chip 5A is replaced with, e.g., the plane 2 of the redundant chip 71-RD. Alternatively, the entire defective chip 5A can be replaced with the redundant chip 71-RD.

In Case 2, the plane 1 is defective in the defective chip 5A. Therefore, for example, the plane 1 of the defective chip 5A is replaced with, e.g., the plane 1 of the redundant chip 71-RD. As a result, the remedy efficiency can be improved.

It is to be noted that a use status of the redundant chips 71-RD is stored in, e.g., the redundant chip 71-RD or a Read Only Memory (ROM) of an IF chip 71-0.

The replacement is effective for not only a product shipping test but also remedy when a chip is defective in an actually used state. According to this replacement, a defective chip or a memory cell region can be replaced with a redundant chip or a non-defective region of the redundant chip by an operation from the outside of a package without removing the package.

For example, when a controller or the IF chip accesses a chip, a defect status is received from this chip (S1). Then, the controller or the IF chip stores an address of the defective chip in itself (S2-1). In this case, when both the controller and the IF chip are present, the controller may transmit a command for storing the defective chip to the IF chip (S2-2). Then, the controller or the IF chip supplies a chip kill designation address, which is required for replacing the defective chip with a redundant chip, to a semiconductor device (S3). As a result, an internal voltage is not supplied to the defective chip, and an address of the redundant chip is substituted for an address of the defective chip.

Furthermore, the defective address to be replaced or whether all chips are to be replaced can be designated by preparing several bits of code addresses according to a replacement method in each chip in advance. For example, 0001 is determined as replacement of the plane 1 in a chip or 0010 is determined as replacement of the plane 2 in advance, and a chip address as a replacement target can be additionally designated by using the chip kill designation address signal.

According to such a configuration, an address of a plane to be replaced can be designated from the outside of a chip, a chip detected as a defective chip can be designated, and an enable signal indicating whether replacement is to be performed is activated, remedy using a redundant chip can be carried out.

(Modification)

According to the second remedial method shown in each of FIG. 39B and FIG. 41, one non-defective chip is provided by combining two chips 1A and 1B each of which cannot be solely a perfect good product. Since one good product is provided by combining two chips, a configuration obtained by essentially stacking eight chips is changed to a configuration where nine chips are stacked. According to the first remedial method, a defective region is remedied by one redundant chip. However, according to the second remedial method, the two chips are used to remedy defects of two chips, and these chips function as one chip.

To designate a defective region, a code for designating a plane is determined in advance, a code of a defective plane is previously written in an ROM in each chip. The code stored in this ROM is read out to the outside after assembling the chips, and a chip to be accessed and its plane are stored and controlled in, e.g., an IF chip 71-0. Alternatively, when the defective plane is accessed based on the code of this plane whose chip itself is stored, this access is stopped, access of any other chip is waited, or a signal for accessing is controlled to be output to any other chip, whereby the defective plane can be prevented from being accessed.

In Case 1 in FIG. 41, in chips each having two planes, when a remedy target chip 1A has a defect in the plane 2 on the right side and the plane 1 on the left side of a redundant chip 1B has a defect, the right plane 2 of the remedy target chip is remedied by using the right plane 2 of the redundant chip 1B.

Furthermore, like Case 2 in FIG. 41, in chips each having two planes, when a remedy target chip 1A has a defect in a plane 1 on the left side and a plane 1 on the left side in a redundant chip 1B has a defect, the left plane 1 of the remedy target chip is remedied by using the right plane 2 of the redundant chip 1B. When such a function is provided, a degree of freedom in remedy can be increased.

In this manner, when the redundant chip 1B has a function of controlling a replacement target region to be changed in accordance with a situation, replacement efficiency can be improved.

(Plane Selection Circuit)

FIG. 42 shows an example of a switching circuit PSW that switches, e.g., two planes in each of a chip and a redundant chip. This switching circuit PSW uses, e.g., 2-bit remedy codes and selects one of two planes 1 and 2. A relationship of the codes and the planes 1 and 2 to be selected is as follows:
    "00": the plane 1 alone is activated as the plane 1;
    "01": the plane 1 alone is activated as the plane 2;
    "10": the plane 2 alone is activated as the plane 1; and
    "11": the plane 2 alone is activated as the plane 2.

The switching circuit PSW is constituted of transfer gates T27A-1, T27A-2, T27B-1, and T27B-2. These transfer gates T27A-1, T27A-2, T27B-1, and T27B-2 select a signal group of the plane 1 and a signal group of the plane 2, which are supplied to stacked chips in common, in accordance with the above-described codes and supplies the plane 1 or the plane 2.

That is, the transfer gates T27A-1 and T27A-2 are connected between a wiring group PL1 that enables transmission of the signal group of the plane 1 and a wiring group PL2 that enables transmission of the signal group of the plane 2. The wiring groups PL1 and PL2 correspond to wiring lines connected through the TSVs described in each of the first to fifth embodiments. A connection node of the transfer gates T27A-1 and T27A-2 is connected to the plane 1. FIG. 42 shows one pair of transfer gates T27A-1 and T27A-2 connected to one pair of wiring lines PL1 and PL2 alone as a representative example. Signals S27A-1 and S27A-2 are supplied to gates of NMOS constituting the transfer gates T27A-1 and T27A-2, respectively, and signals S27A-1 and S27A-2 inverted by an inverter circuit are supplied to gates of MOS, respectively.

Additionally, the transfer gates T27B-1 and T27B-2 are connected between the wiring group PL1 that enables transmission of the signal group of the plane 1 and the wiring group PL2 that enables transmission of the signal group of the plane 2. A connection node of these transfer gates T27B-1 and T27B-2 is connected to the plane 2. FIG. 42 shows the pair of transfer gates T27B-1 and T27B-2 connected to the pair of wiring lines PL1 and PL2 as a representative example. Signals S27B-1 and S27B-2 are supplied to gates of NMOS constituting these transfer gates T2713-1 and T27B-2, and signals S27B-1 and S27B-2 inverted by an inverter circuit are supplied to gates of PMOS constituting the same, respectively.

The signals S27A-1, S27A-2, S27B-1, and S27B-2 are signals generated based on the codes. A relationship between the codes and the signals S27A-1, S27A-2, S27B-1, and S27B-2 is as follows.
    "00": S27A-1="1", S27A-2="0", S27B-1="0", and S27B-2="0"
    Therefore, the transfer gate T27A-1 alone is turned on, and the plane 1 alone is activated as the plane 1.
    "01": S27A-1="0", S27A-2="1", S27B-1="0", and S27B-2="0"
    Therefore, the transfer gate T27A-2 alone is turned on, and the plane 1 alone is activated as the plane 2.
    "10": S27A-1="0", S27A-2="0", S27B-1="1", and S27B-2="0"
    Therefore, the transfer gate T27B-1 alone is turned on, and the plane 2 alone is activated as the plane 1.
    "11": S27A-1="0", S27A-2="0", S27B-1="0", and S27B-2="1"
    Therefore, the transfer gate T27B-2 alone is turned on, and the plane 2 alone is activated as the plane 2.

When the switching circuit PSW is used, the planes 1 and 2 can be selectively switched. Therefore, when the switching circuit PSW is used, the planes 1 and 2 of the redundant chip and planes 1 and 2 of the remedy target chip can be selectively switched, and a defective plane of the remedy target chip can be remedied by using a plane of the redundant chip.

(Remedy of Stacked Chips)

FIG. 43 shows operations for selecting the planes 1 and 2 of the chips placed on the lower side in the nine stacked chips shown in each of FIG. 39B and FIG. 41.

Of chip addresses CA0c to CA3c, the chip address CA0c is not used, but the chip addresses CA1c to CA3c are used to designate each remedy target chip. That is, as remedial information supplied from the outside of the chips, like the chip kill designation address signal, "1" is set with respect to the remedy chips 1 and 2. Further, when the chip address CA0c of each remedy chip from the outside is "0", chip addresses CA0int, CA1int, CA2int, and CA3int in the chip are all set to "0". When the chip address CA0c of each of the remedy chips 1 and 2 from the outside is "0" or "1", the remedy plane is changed.

In case of the chip 1 having the chip address CA0c "0", the remedy plane 2 uses the same bit as the remedy plane 1. That is, in case of "00" or "01", "00" is used. In case of "10" or "11", "11" is used.

Furthermore, in case of the chip 2 having the chip address CA0c "1", the remedy plane 1 or 2 is changed in accordance with external information. That is, when the external information is "00", internal information is set to "11". When the external information is "01", the internal information is set to "01". Moreover, when the external information is "11", the internal information is set to "00". When the external information is "10", the internal information is "10".

In the example shown in FIG. 43, the remedial information of the chip 2 has the plane 1 set to "0" and the plane 2 set to "1". Therefore, the plane 1 is activated as the plane 2. Additionally, the remedial information of the chip 1 has both the plane 1 and the plane 2 set to "0". Therefore, the plane 1 is activated as the plane 1.

FIG. 44 shows a variation for remedying the planes 1 and 2 of the chips 1 and 2. Case 3 shown in FIG. 44 represents the same contents as remedy conditions depicted in FIG. 43.

Sixth Embodiment

FIG. 45 is a view showing a case where eight chips are decoded by conventional wire bonding.

Eight stacked chips are selected by four chip enable signals CE3A to CE3D and three chip addresses AD3A to AD3C. For example, three types of decode 1CE, 2CE, and 4CE can be carried out with respect to these eight hips. That is, 1CE represents a situation where only a terminal that transmits the chip enable signal CE3A is to be bonded, 2CE represents a situation where only a terminal that transmits the chip enable signals CE3A and CE3B is to be bonded, and 4CE represents a situation where only a terminal that transmits the chip enable signals CE3A, CE3B, CE3C, and CE3D is to be bonded.

In case of 1CE representing that only a terminal that transmits the chip enable signal CE3A is to be bonded, the three chip addresses AD3A to AD3C are used, and one chip is selected.

In case of 2CE representing that only a terminal that transmits the chip enable signals CE3A and CE3B is to be bonded, the two chip addresses AD3A and AD3B are used, and one chip is selected.

In case of 4CE representing that only a terminal that transmits the chip enable signals CE3A, CE3B, CE3C, and CE3D is to be bonded, the chip address AD3A alone is used, and one chip is selected.

However, as described above, in case of using TSVs and stacking the chips, the chips cannot be decoded by the wire bonding.

Thus, in the sixth embodiment, a circuit that realizes the chip selection shown in FIG. 45 without using the wire bonding will now be described.

(Chip Selection Circuit)

FIG. 46 shows an example of a chip selection circuit that concerns the sixth embodiment and is configured to perform chip decode in a case where eight chips are stacked like FIG. 45. This chip selection circuit is constituted of a chip decode circuit CDC, an address switching circuit ASW, a chip enable decode circuit CEDC, and a chip address generation CAG.

The chip decode circuit CDC has the same configuration as the decode circuit shown in FIG. 12, and it selects chips based on chip address signals CA0, CA1, CA1h, and CA2 supplied from the outside of the chips through non-illustrated TSVs and wiring layers.

That is, the chip decode circuit CDC is constituted of an inverter circuit I and three XOR circuits 16-1, 16-2, and 16-3. The chip address signal CA0 is supplied to an input end of an inverter circuit 15, and the chip address signal CA1 is supplied to the XOR circuit 16-1 together with an output signal from the inverter circuit. The chip address signal CA1h is supplied to the XOR circuit 16-2 together with an output signal from the XOR circuit 16-1. The chip address signal CA2 is supplied to the XOR circuit 16-3 together with an output signal from the XOR circuit 16-2. The output signal CA0c from the inverter circuit 15 and the output signals CA1c, CA1hc, and CA2c from the XOR circuits 16-1, 16-2, and 16-3 are supplied to the address switching circuit ASW and also output to the outside of the chips through, e.g., TSVs and wiring layers (terminals).

The address switching circuit ASW changes high orders and low orders of the supplied address signals CA0c, CA1c, CA1hc, and CA2c based on a later-described swap signal Aswap and supplies them to the inside of each chip.

That is, the address switching circuit ASW is constituted of transfer gates T46-1, T46-2, T46-3, and T46-4 connected between an output end of the inverter circuit 15 and an output end of the XOR circuit 16-3. A swap signal Aswap inverted by an inverter circuit I46 is supplied to gate electrodes of NMOS constituting the transfer gates T46-1 and T46-4 and gate electrodes of PMOS constituting the transfer gates T46-2 and 46-3. Further, the swap signal Aswap is supplied to gate electrodes of PMOS constituting the transfer gates T46-1 and T46-4 and gate electrodes of NMOS constituting the transfer gates T46-2 and T46-3.

For example, if the swap signal Aswap is "0", the transfer gates T46-1 and T46-4 are turned on, and the transfer gates T46-2 and T46-3 are turned off. Therefore, the output signal CA0c of the inverter circuit I15 is output from a connection node between the transfer gates T46-1 and T46-2, and the output signal CA2c of the XOR circuit 16-3 is output from a connection node between the transfer gates T46-3 and T46-4.

Furthermore, if the swap signal Aswap is "1", the transfer gates T46-2 and T46-3 are turned on, and the transfer gates T46-1 and T46-4 are turned off. Therefore, the output signal CA2c of the XOR circuit is output from the connection node between the transfer gates T46-1 and T46-2, and the output signal CA0c of the inverter circuit I15 is output from the connection node between the transfer gates T46-3 and T46-4.

In this manner, the high orders and the low orders of the address signals are changed and output based on logic levels of the swap signal Aswap. Therefore, as will be described later, assignment of the chip enable signals CE3A and CE3C can be changed.

The output signal CA2c or Ca0c from the connection node between the transfer gates T46-1 and T46-2 and the output signal CA1c from the XOR circuit 16-1 are supplied to the chip enable decode circuit CEDC together with external signals CEab and CEac that are used for changing configurations of the chip enable signals.

This chip enable decode circuit CEDC selects a chip enable signal CE3Ai, CE3Bi, CE3Ci, or CE3Di based on the external signal CEab or CEac and the swap signal Aswap, and outputs the selected signal as an internal chip enable signal CE_int.

That is, the chip enable decode circuit CEDC is constituted of four transfer gates T46-5, T46-6, T46-7, and T46-8 which have input ends to which the chip enable signals CE3Ai, CE3Bi, CE3Ci, and CE3Di are supplied, respectively and output ends connected in common and a logic circuit LGC1 that controls these transfer gates T46-5 to T46-8.

It is to be noted that the external signals CEab and CEac and the chip enable signals CE3Ai, CE3Bi, CE3Ci, and CE3Di are supplied to the outside of chips through, e.g., TSVs and wiring layers (terminals).

On the other hand, the chip address generation circuit CAG is constituted of transfer gates T46-9 to T46-14 and a logic circuit LGC2 that controls these transfer gates T46-9 to T46-14.

An inverted output signal CA0c or CA2c from the connection node between the transfer gates T46-1 and T46-2 and an inverted output signal CA1c from the XOR circuit 16-1 are supplied to input ends of the transfer gates T46-9 and T46-10, and an inverted output signal CA0c or CA2c from the connection node between the transfer gates T46-3 and T46-4 is supplied to an input end of the transfer gate T46-11. Output ends of these transfer gates T46-9, T46-10, and T46-11 are connected in common, and an internal address signal AD0_int is output from the output ends connected in common.

An inverted output signal CA1c from the XOR circuit 16-1 is supplied to an input end of the transfer gate 46-12, and an inverted output signal CA0c or CA2c from the connection node between the transfer gates T46-3 and T46-4 is supplied to an input end of the transfer gate 46-13. Output ends of these transfer gates T46-12 and T46-13 are connected in common, and an internal address signal AD1_int is output from the output ends connected in common.

An inverted output signal CA0c or CA2c from the connection node between the transfer gates T46-3 and T46-4 is supplied to an input end of the transfer gate T46-14. An internal address signal AD2_int is output from an output end of the transfer gate T46-14.

Gate electrodes of PMOS and NMOS constituting the transfer gates T46-9 to T46-14 are controlled by a signal generated by the logic circuit LG2 based on the external signal CEab or the external signals CEab and CEac.

Each of FIG. 47, FIG. 48, and FIG. 46 shows operations of the chip selection circuit depicted in FIG. 46, and each circuit constituting the chip selection circuit operates in accordance with FIG. 47, FIG. 48, or FIG. 49.

FIG. 47 illustrates the respective types of decode 1CE, 2DE, and 4CE when the Aswap signal is "0". 1CE is set by setting both the external signals CEab and CEac to "0", 2CE is set by setting the external signal CEab to "1" and setting CEac to "0", and 4CE is set by setting both the external signals CEab and CEac to "1".

(Operation of 1CE)

For example, in case of selecting a chip 7 of 1CE shown in FIG. 47, both the external signals CEab and CEac are "0". Therefore, according to a logic of the logic circuit LGC1 in the chip enable decode circuit CEDC, the transfer gate T46-8 alone is turned on irrespective of an output signal from the address switching circuit ASW. Therefore, the chip enable signal CE3Ai is output as the internal chip enable signal CE_int is output through the transfer gate T46-8.

Moreover, if the chip addresses CA0, CA1, CA1h, and CA2 supplied from the outside are all "0", the output signals CA0c, CA1c, CA1hc, and CA2c from the chip decode circuit CDC are "1", "0", "0", and "0".

If the swap signal Aswap is "0", in the address switching circuit ASW, since the transfer gates T46-1 and T46-4 are ON, the output signals CA0c, CA1c, CA2c ("1", "0", and "0") of the chip decode circuit CDC are supplied from the address switching circuit ASW to the chip address generation circuit CAG.

If both the external signals CEab and CEac are "0", in the chip address generation circuit CAG, the transfer gates T46-9, T46-12, and T46-14 are turned on. Therefore, CA0c, CA1c, and CA2c ("0", "1", and "1") inverted by the inverter circuits I46-2, I46-3, and I46-4 are output as the internal address signals AD0_int, AD1_int, and AD2_int through the transfer gates T46-9, T46-12, and T46-14.

(Operation of 2CE)

In case of 2CE, the external signals CEab and CEac are "1" and "0". Therefore, according to a logic of the logic circuit LGC1 in the chip enable decode circuit CEDC, one of the transfer gates T46-7 and T46-8 is turned on by using an output signal from the address switching circuit ASW. Thus, one of the chip enable signals CE3Ai and CE3Bi is output as the internal chip enable signal CE_int through one of the transfer gates T46-7 and 46-8.

Moreover, in the chip address generation circuit CAG, the transfer gates T46-10 and T46-13 alone are turned on. Therefore, the address signals CA1c and CA2c inverted by the inverter circuits I46-3 and I46-4 are output as the internal address signals AD0_int and AD1_int, and the internal address signal AD2_int is fixed to "0" by the NMOSN 46-1 which is in the ON state.

(Operation of 3CE)

In case of 3CE, the external signals CEab and CEac become "1" and "1". Therefore, according to a logic of the logic circuit LGC1 in the chip enable decode circuit CEDC, one of the transfer gates T46-5 to T46-8 is turned on by using an output signal from the address switching circuit ASW. Therefore, one of the chip enable signals CE3Ai to CE3Di is output as the internal chip enable signal CE_int through one of the transfer gates T46-5 to T46-8.

Additionally, in the chip address generation circuit CAG, the transfer gate T46-11 alone is turned on. Therefore, the address signal CA2c inverted by the inverter circuit I46-4 is output as the internal address signal AD0_int, and the internal address signals AD0_int and AD2_int are fixed to "0" by the NMOSN46-2 and N46-1 which are in the ON state.

FIG. 48 shows an operation when the swap signal Aswap is "1". In this case, like FIG. 47, 1CE, 2CE, and 4CE are changed over. Further, an operation of the address switching circuit ASW based on the swap signal Aswap enables counterchanging the highest order CA2c and the lowest order CA0c of the output signals from the chip decode circuit. Therefore, in FIG. 48, values of the internal address signals AD0_int and AD2_int substitute for those in FIG. 47.

FIG. 49 shows an operation when the swap signal Aswap is "1" like FIG. 48. In this case, like FIG. 48, 1CE, 2CE, and 4CE are changed over. Furthermore, an operation of the address switching circuit ASW based on the swap signal Aswap enables counterchanging the highest order CA2c and the lowest order CA0c of the output signals from the chip decode circuit.

In case of FIG. 49, a logic of the output signal CA2c is inverted from that shown in FIG. 48, and values of the internal address signals AD0_int and AD2_int substitute for those shown in FIG. 48 in accordance with this inversion.

According to the sixth embodiment, when the chip selection circuit is provided, the chip decode like conventional examples can be carried out. Moreover, according to the sixth embodiment, after assembling the chips, the chip decode can be changed by using signals from the outside of the chips. Therefore, a variation of the chip decode according to a user's specification can be achieved.

The chip decode or the chip kill selection address described above can be applied from the outside of the package, or the address can be fixed at the time of packaging.

Usually, it is often the case that one package has one or two channels of pins, but combining with each of the foregoing embodiments where the chips are stacked by using the TSVs enables providing channels or data lines, which are beyond the two channels in number, in one package.

The IF chip has input/output circuits associated with its channels, signals can be allocated to the stacked chips by using the chip decode circuit, an arbitrary number of channels which is one or more can be set in the same package or a combination of an arbitrary chip enable signal and a chip address can be set by controlling the decode address from the outside of the package, and a degree of freedom in application to a system can be expanded.

Furthermore, in a test process, characteristics of each product can be examined, a chip kill designation address signal or a decode address can be changed over based on a result of the examination, the chip kill enables excluding a defective chip, and remedying the excluded chip by using a redundant chip can dramatically increase a yield rate of the product.

In case of changing over the chip kill designation address or the code address later, e.g., after a test, as described above, when a chip kill designation address or a decode address is written into a memory element such as an ROM or a fuse provided in the IF chip, flexible production can be performed.

Additionally, these pieces of information can be stored by providing a memory region used for assuredly accessing each stacked chip in advance. In case of storing a circuit set value in the IF chip, the circuit set value may be stored in the ROM or the fuse in the IF chip or written in the stacked chips.

Further, when a power supply circuit or a reference potential generation circuit for stacked chips is provided in the IF chip and electric power is supplied to each stacked chip through the TSV, the number of the power supply circuits or the reference potential generation circuits used in one package can be reduced to be comparable with several chips or one chip in the stacked chips. Therefore, a manufacturing cost of the chips can be decreased, and a consumption current in a standby mode can be also reduced.

FIG. 50 shows a system to which each of the first to sixth embodiments is applied, and it shows, e.g., a case where each of the first to sixth embodiments is applied to an application system 90 of a digital camera or the like.

In FIG. 50, a semiconductor device 91 is connected to a controller 92 that controls the semiconductor device 91. The controller 92 is connected to a host controller 93 through, e.g., an interface of a double data rate (DDR).

In the semiconductor device 91, chips to which each of the first to sixth embodiments is applied are stacked by the intermediary of TSVs, and an NAND flash memory or the like is included in each chip. The semiconductor device 91 is connected to the controller 92 by using the TSVs. When the semiconductor device 91 is connected tot the controller 92 by using the TSVs, each operation signal of the semiconductor device 91 can be transferred with a large bus width to the controller 92 at a low rate by the shortest distance. Therefore, since interface circuits can be omitted from the NAND flash memory and the controller 92, a manufacturing cost can be reduced, and a consumption current can be decreased.

Furthermore, since the interface circuits are required in the NAND flash memory and the controller in conventional examples, when chips are stacked, a capacity of each interface circuit increases, and a high-speed operation is difficult. However, when each of the first to sixth embodiments is applied, since the interface circuits can be omitted from the NAND flash memory and the controller 92, a capacity can be reduced, and a high-speed operation can be carried out.

FIG. 51 shows a case where each of the first to sixth embodiments is applied to a solid-state drive (SSD). A semiconductor device 91 is connected to an IO chip 94 dedicated to an interface. This IO chip 94 is connected to an SSD controller 95 through, e.g., a DDR interface that can perform at a high speed.

The IO chip 94 can be manufactured by a dedicated process that is not restricted to an NAND flash memory. Therefore, the IO chip 94 that can perform a high-speed operation can be formed. Therefore, high-speed signal processing can be effected between the semiconductor device 91 and an SSD controller 95.

FIG. 52 shows a plan view of a chip applied to each of the first and sixth embodiments. At a central portion of a chip 96, TSVs 97 are formed, and TSVs 98 and 99 are formed at both end portions of the chip 96. For example, two memory cell arrays 100 are arranged between the TSVs 97 and the TSVs 98 and between the TSVs 97 and the TSVs 99, respectively.

For example, a peripheral circuit 101 is formed between the memory cell arrays 100 and the TSVs 97.

When the TSVs are used, the TSVs 97 can be arranged at the central portion of the chip 96. Therefore, it is possible to shorten a distance between the TSVs 97 and the peripheral circuit 101 or the memory cell arrays 100. That is, in conventional examples, the peripheral circuit and bonding pads are arranged at one end of the chip, and wiring lines from the memory cell arrays are connected to the bonding pads through the peripheral circuit. Therefore, a wiring distance is long, and high-speed signal transmission is difficult. However, when the TSVs 97 are arranged at the central portion of the chip 96, the wiring distance from the memory cell arrays can be shortened. Therefore, the high-speed signal transmission is possible.

Additionally, electric power or a ground potential can be supplied by using the TSVs 98 and 99 formed at the both end portions of the chip 96, and an optimum circuit configuration can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   chips each of which has at least first and second vias through each chip from a front surface of the chip to a back surface of the chip, the vias enabling transmission of at least first and second address signals, and the chips being electrically connected to each other through the first and second vias; and
   a first selection circuit which is provided in each chip, includes a logic circuit that selects a chip based on at least the first and second address signals, and supplies a result of performing an arithmetic operation of the first and second address signals to a subsequent chip;
   wherein the first selection circuit comprises:
   an inversion circuit that is provided in each chip, inverts the first address signal, and supplies the inverted first address signal to a subsequent chip through the first via; and
   a first logical operation circuit which is provided in each chip, performs a logical operation of the second address signal and the inverted first address signal, and supplies an arithmetic operation output signal to a subsequent chip through the second via provided in each chip.

2. The device according to claim 1, wherein the first selection circuit further comprises:
   a third via that allows transmission of a third address signal;
   a fourth via that allows transmission of a fourth address signal;
   a second logical operation circuit which performs a logical operation of the arithmetic operation output signal from the first logical operation circuit and the third address, and supplies an arithmetic operation output signal to a subsequent chip through the third via provided in each chip; and
   a third logical operation circuit which performs a logical operation of the arithmetic operation output signal from the second logical operation circuit and the fourth address, and supplies an arithmetic operation output signal to a subsequent chip through the fourth via provided in each chip.

3. A solid-state drive (SSD) controller having a semiconductor device arranged thereon, the SSD controller being connected to the semiconductor device through an interface chip arranged between the SSD controller and the semiconductor device, and the semiconductor device comprising:

chips each of which has at least first and second vias through each chip from a front surface of the chip to a back surface of the chip, the vias enabling transmission of at least first and second address signals, and the chips being electrically connected to each other through the first and second vias; and a first selection circuit which is provided in each chip, includes a logic circuit that selects a chip based on at least the first and second address signals, and supplies a result of performing an arithmetic operation of the first and second address signals to a subsequent chip.

4. A semiconductor device comprising:

chips each of which has at least first and second vias through each chip from a front surface of the chip to a back surface of the chip, the vias enabling transmission of at least first and second address signals, and the chips being electrically connected to each other through the first and second vias; and a first selection circuit which is provided in each chip, includes a logic circuit that selects a chip based on at least the first and second address signals, and supplies a result of performing an arithmetic operation of the first and second address signals to a subsequent chip;

wherein each chip comprises:

memory cell arrays; and peripheral circuits which are provided between the memory cell arrays; and wherein the vias are arranged between the peripheral circuits.

* * * * *